US008694720B2

(12) United States Patent
Lee et al.

(10) Patent No.: US 8,694,720 B2
(45) Date of Patent: Apr. 8, 2014

(54) NONVOLATILE MEMORY DEVICES WITH PAGE FLAGS, METHODS OF OPERATION AND MEMORY SYSTEMS INCLUDING SAME

(75) Inventors: Ji-Sang Lee, Jeollabuk-do (KR); Joonsuc Jang, Hwaseong-si (KR); Sang-Hyun Joo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 196 days.

(21) Appl. No.: 13/337,695

(22) Filed: Dec. 27, 2011

(65) Prior Publication Data

US 2012/0239861 A1 Sep. 20, 2012

(30) Foreign Application Priority Data

Mar. 16, 2011 (KR) .................. 10-2011-0023539

(51) Int. Cl.
*G06F 12/00* (2006.01)
(52) U.S. Cl.
USPC ............ 711/103; 711/114; 711/156; 711/173
(58) Field of Classification Search
None
See application file for complete search history.

(56) References Cited

U.S. PATENT DOCUMENTS

| 7,984,232 | B2 | 7/2011 | Kimura | |
|---|---|---|---|---|
| 2009/0077306 | A1* | 3/2009 | Arcedera et al. | 711/103 |
| 2009/0323942 | A1 | 12/2009 | Sharon et al. | |
| 2010/0039860 | A1 | 2/2010 | Ruby et al. | |
| 2010/0217921 | A1* | 8/2010 | Mun | 711/103 |
| 2010/0229001 | A1* | 9/2010 | Park et al. | 713/190 |

FOREIGN PATENT DOCUMENTS

KR 1020100099960 9/2010

* cited by examiner

*Primary Examiner* — Shawn X Gu
(74) *Attorney, Agent, or Firm* — Volentine & Whitt, PLLC

(57) ABSTRACT

A method programming multi-bit data to multi-level nonvolatile memory cells (MLC) includes; programming a first page of data to the MLC, programming a first page flag to an initial first flag state in response in the programming of the first page, programming a second page of data to the MLC, in response to programming the second page, determining whether the first page has been programmed and if the first page has been programmed, programming the first page flag to a final first flag state different from the initial first flag state in response to programming of the second page, and if the first page has not been programmed, inhibiting programming of the first page flag during programming of the second page.

47 Claims, 36 Drawing Sheets

Fig. 23A

| E | P | P2 or P3 | LSB Read RSEL | MSB Read RSEL |
|---|---|---|---|---|
| (LF) (MF) | | | Off | Off |
| (MF) | (LF) | | On | Off |
| (LF) | | (MF) | Off | On |
| | (LF) | (MF) | On | On |

Fig. 23B

| E | P | P2 or P3 | LSB Read RSEL | MSB Read RSEL |
|---|---|---|---|---|
| (LF) (MF) | | | Off | Off |
| (MF) | (LF) | | On | Off |
| (LF) | | (MF) | Off | On |
| | | (LF) (MF) | On | On |

Fig. 27A

| E | P(1st) | P2(2nd) | Q6(3rd) | 1st Page Read, RSEL | 2nd Page Read, RSEL | 3rd Page Read, RSEL |
|---|---|---|---|---|---|---|
| (1F)(2F)(3F) | | | | Off | Off | Off |
| (2F)(3F) | (1F) | | | On | Off | Off |
| (3F) | (1F) | (2F) | | On | On | Off |
| (1F)(3F) | | (2F) | | Off | On | Off |
| (1F) | | (2F) | (3F) | Off | On | On |
| (1F)(2F) | | | (3F) | Off | Off | On |
| (2F) | (1F) | | (3F) | On | Off | On |
| | (1F) | (2F) | (3F) | On | On | On |

Fig. 27B

| E | P(1st) | P2(2nd) | Q6(3rd) | 1st Page Read, RSEL | 2nd Page Read, RSEL | 3rd Page Read, RSEL |
|---|---|---|---|---|---|---|
| 1F 2F 3F | | | | Off | Off | Off |
| 2F 3F | 1F | | | On | Off | Off |
| 3F | | 1F 2F | | On | On | Off |
| 3F | | 2F | | Off | On | Off |
| 1F | | | 2F 3F | Off | On | On |
| 1F 2F | | | 3F | Off | Off | On |
| 2F | | | 1F 3F | On | Off | On |
| | | | 1F 2F 3F | On | On | On |

NONVOLATILE MEMORY DEVICES WITH PAGE FLAGS, METHODS OF OPERATION AND MEMORY SYSTEMS INCLUDING SAME

CROSS-REFERENCE TO RELATED APPLICATIONS

This application claims the benefits, under 35 U.S.C §119, of Korean Patent Application No. 10-2011-0023539 filed Mar. 16, 2011, the subject matter of which is hereby incorporated by reference.

BACKGROUND OF THE INVENTION

The inventive concept is related to nonvolatile memory devices, memory systems including nonvolatile memory devices and methods of operating same.

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices generally include volatile memory devices and nonvolatile memory devices. Nonvolatile memory is capable of retaining stored data in the absence of applied power. Within the broad class of nonvolatile memory, data storage modes include permanent and reprogrammable modes. Nonvolatile memory is commonly used within a variety of host devices to store program and microcode, as well as a user defined data.

So-called flash memory is one type of nonvolatile memory, and has become a staple system component within many different host devices and stand-alone data storage devices. Flash memory increasing incorporates multi-bit flash memory cells capable of storing multi-data in a single memory cell. Multi-bit flash memory cells dramatically increase the data storage density of constituent memory devices and systems.

SUMMARY OF THE INVENTION

One aspect of embodiments of the inventive concept is directed to a method programming multi-bit data to multi-level non-volatile memory cells (MLC) in a memory cell array, the method comprising; programming a first page of data to the MLC, programming a first page flag to an initial first flag state in response in the programming of the first page, programming a second page of data to the MLC, in response to programming the second page, determining whether the first page has been programmed; and if the first page has been programmed, programming the first page flag to a final first flag state different from the initial first flag state in response to programming of the second page, and if the first page has not been programmed, inhibiting programming of the first page flag during programming of the second page.

Another embodiment of the inventive concept is directed to a method programming multi-bit data to multi-level non-volatile memory cells (MLC) in a memory cell array, the method comprising; performing a first programming of a first logical page (FLP), programming a first page flag to a first flag state in response to the first programming, and thereafter, performing a second programming of a second logical page (SLP) of page, and inhibiting programming of the first page flag during the second programming.

Another embodiment of the inventive concept is directed to a method reading multi-level data from a memory cell array of multi-level non-volatile memory cells (MLC), the method comprising; determining a first page flag associated with a first page of data stored in the MLC, if the first page flag is set, reading first read data from the MLC, de-randomizing the first read data to generate de-randomized first read data, and providing the de-randomized first read data as output data, and if the first page flag is not set, reading the first read data from the MLC and providing the first read data as output data.

Another embodiment of the inventive concept is directed to a method of operating a memory system comprising a non-volatile memory device and a controller, wherein the non-volatile memory device comprises; a memory cell array including multi-level memory cells (MLC) arranged of a main area, and a first page flag and a second page flag disposed in a spare area, a page buffer that stores read data retrieved from the memory cell array, an input/output (I/O) circuit that provides output data from the non-volatile memory device to the controller, and a de-randomizer that receives read data from the page buffer and either passes the read data to the I/O circuit without de-randomization, or generates de-randomized read data from the read data and then passes the de-randomized read data to the I/O circuit. The method comprises; upon receiving a first read command, loading a first page of read data from the memory cell array to the page buffer and determining the first page flag, if the first page flag is not set, passing the first page to the I/O circuit as first output data without de-randomizing, and if the first page flag is set, generating de-randomized first read data and passing the de-randomized first read data to the I/O circuit as the first output data.

Another embodiment of the inventive concept is directed to a nonvolatile memory device comprising; a memory cell array including multi-level memory cells (MLC) disposed in a main area, and a first page flag and a second page flag disposed in a spare area, a page buffer that stores read data retrieved from the memory cell array, a de-randomizer that receives the read data from the page buffer, an input/output (I/O) circuit that provides output data from the non-volatile memory device; and control logic that in response to a first read command, loads a first page of data from the memory cell array to the page buffer and determines the first page flag, wherein if the first page flag is not set, the control logic causes the first page to pass to the I/O circuit without de-randomizing and causes the I/O circuit to provide the first page as the output data, and if the first page flag is set, the control logic causes the de-randomizer to generate a de-randomized first page by de-randomizing the first page and causes the I/O circuit to provide the de-randomized first page as the output data.

Another embodiment of the inventive concept is directed to a nonvolatile memory device comprising; a memory cell array having a vertical structure comprising a stacked plurality of memory blocks accessed via an arrangement of word lines and bits lines, and including multi-level memory cells (MLC) disposed in a main area, and a first page flag and a second page flag disposed in a spare area, a page buffer that stores read data retrieved from the vertical memory cell array, a de-randomizer that receives the read data from the page buffer, an input/output (I/O) circuit that provides output data from the non-volatile memory device, and control logic that in response to a read command, loads a first page of data from the vertical memory cell array to the page buffer and determines the first page flag, wherein if the first page flag is not set, the control logic causes the first page to pass to the I/O circuit without de-randomizing and causes the I/O circuit to provide the first page as the output data, and if the first page flag is set, the control logic causes the de-randomizer to generate a de-randomized first page by de-randomizing the first page and causes the I/O circuit to provide the de-randomized first page as the output data.

Another embodiment of the inventive concept is directed to a nonvolatile memory device comprising; a memory cell array of multi-level memory cells (MLC) arranged in a main area, and a first page flag and a second page flag disposed in a spare area, a page buffer that temporarily stores multi-level data to be programmed to the memory cell array, an input/output (I/O) circuit that receives externally provided write data, a randomizer configured to receive the write data from the I/O circuit, and control logic that in response to a first program command, causes the randomizer to generate a randomized first page of data from at least a portion of the write data, causes the page buffer to program the randomized first page to the MLC, and then sets the first page flag, and in response to a second program command causes the randomizer to generate a randomized second page of data from at least a portion of the write data, causes the page buffer to program the randomized second page to the MLC, and then sets the second page flag.

Another embodiment of the inventive concept is directed to a nonvolatile memory device comprising; a memory cell array having a vertical structure comprising a stacked plurality of memory blocks accessed via an arrangement of word lines and bits lines, and including multi-level memory cells (MLC) disposed in a main area, and a first page flag and a second page flag disposed in a spare area, a page buffer that temporarily stores multi-level data to be programmed to the vertical memory cell array, an input/output (I/O) circuit that receives externally provided write data, a randomizer configured to receive the write data from the I/O circuit, and control logic that in response to a first program command causes the randomizer to generate a randomized first page of data from at least a portion of the write data, causes the page buffer to program the randomized first page to the MLC, and then sets the first page flag, and in response to a second program command causes the randomizer to generate a randomized second page of data from at least a portion of the write data, causes the page buffer to program the randomized second page to the MLC, and then sets the second page flag.

Another embodiment of the inventive concept is directed to a memory card, comprising; a memory controller and at least one nonvolatile memory device mechanically mounted on a board. The least one nonvolatile memory device comprises; a memory cell array of multi-level memory cells (MLC) arranged in a main area, and a first page flag and a second page flag disposed in a spare area, a page buffer that temporarily stores multi-level data to be programmed to the memory cell array, an input/output (I/O) circuit that receives externally provided write data, a randomizer configured to receive the write data from the I/O circuit, and control logic that in response to a first program command, causes the randomizer to generate a randomized first page of data from at least a portion of the write data, causes the page buffer to program the randomized first page to the MLC, and then sets the first page flag, and in response to a second program command causes the randomizer to generate a randomized second page of data from at least a portion of the write data, causes the page buffer to program the randomized second page to the MLC, and then sets the second page flag.

Another embodiment of the inventive concept is directed to a Solid-State Drive (SSD), comprising; a memory controller and a plurality of flash memory devices respectively controlled by the memory controller via a selected one of a plurality of channels. Each one of the plurality of flash memory devices comprises; a memory cell array of multi-level memory cells (MLC) arranged in a main area, and a first page flag and a second page flag disposed in a spare area, a page buffer that temporarily stores multi-level data to be programmed to the memory cell array, an input/output (I/O) circuit that receives externally provided write data, a randomizer configured to receive the write data from the I/O circuit, and control logic that in response to a first program command, causes the randomizer to generate a randomized first page of data from at least a portion of the write data, causes the page buffer to program the randomized first page to the MLC, and then sets the first page flag, and in response to a second program command causes the randomizer to generate a randomized second page of data from at least a portion of the write data, causes the page buffer to program the randomized second page to the MLC, and then sets the second page flag.

Another embodiment of the inventive concept is directed to a system, comprising; a processor connected to a Solid-State Drive (SSD) via a bus, the SSD comprising a memory controller and a plurality of flash memory devices respectively controlled by the memory controller via a selected one of a plurality of channels. Each one of the plurality of flash memory devices comprises; a memory cell array of multi-level memory cells (MLC) arranged in a main area, and a first page flag and a second page flag disposed in a spare area, a page buffer that temporarily stores multi-level data to be programmed to the memory cell array, an input/output (I/O) circuit that receives externally provided write data, a randomizer configured to receive the write data from the I/O circuit, and control logic that in response to a first program command, causes the randomizer to generate a randomized first page of data from at least a portion of the write data, causes the page buffer to program the randomized first page to the MLC, and then sets the first page flag, and in response to a second program command causes the randomizer to generate a randomized second page of data from at least a portion of the write data, causes the page buffer to program the randomized second page to the MLC, and then sets the second page flag.

BRIEF DESCRIPTION OF THE FIGURES

The above and other objects and features of the inventive concept will be apparent upon consideration of the following description with reference to the accompanying drawings.

FIGS. 23A and 23B are tables illustrating possible page flag states for the nonvolatile memory device of FIG. 1 and the effect of the page flag states upon the activation (ON)/deactivation (OFF) of a randomization selection signal.

FIGS. 27A and 27B are tables illustrating possible page flag states for the nonvolatile memory device of FIG. 25 and the effect of the page flag states upon the activation (ON)/deactivation (OFF) of a randomization selection signal.

DETAILED DESCRIPTION

Figure 1:
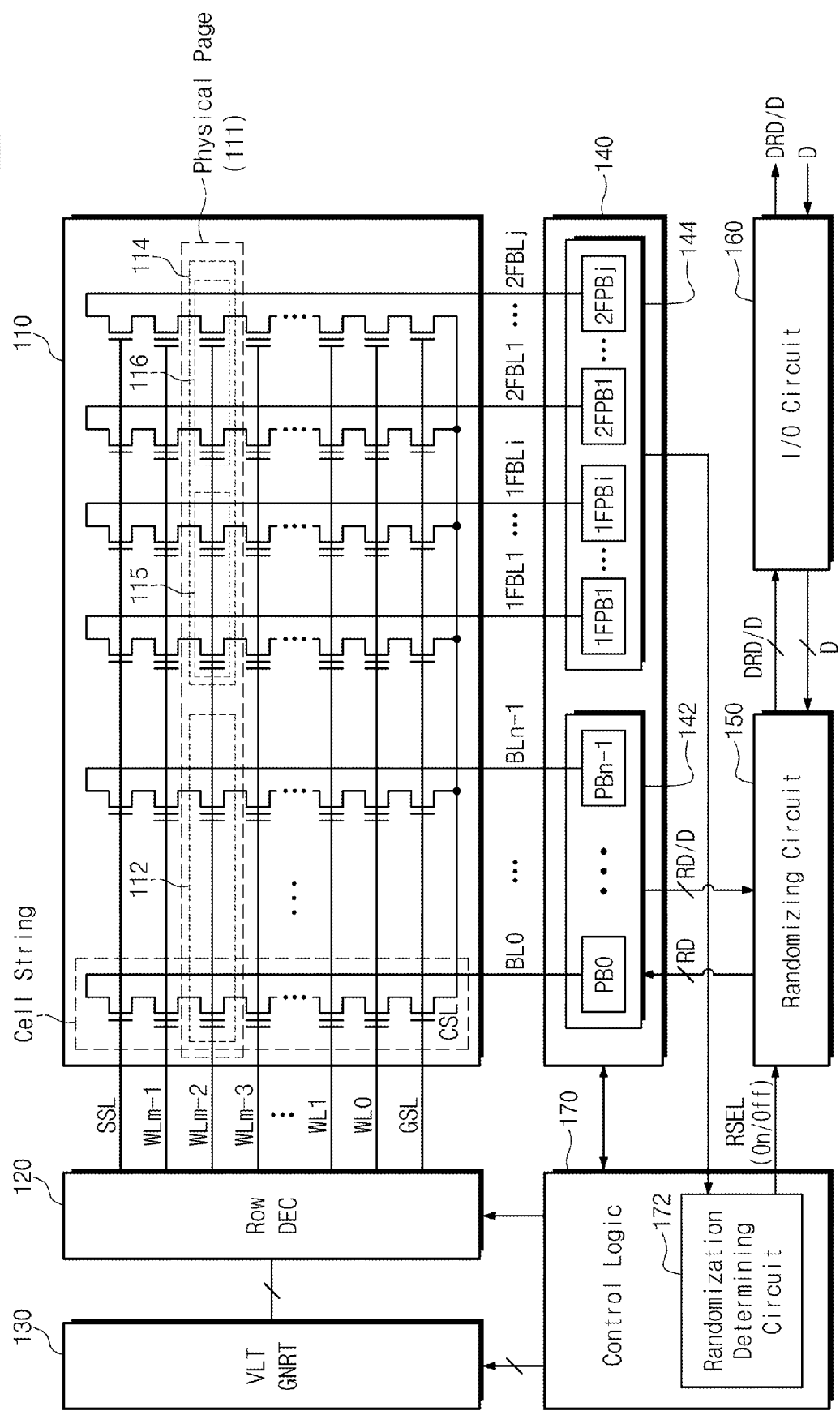
FIG. 1 is a block diagram illustrating, in relevant part, a nonvolatile memory device according to an embodiment of the inventive concept.

The inventive concept will now be described in some additional detail with reference to the accompanying drawings in which embodiments of the inventive concept are shown. The inventive concept may, however, be embodied in many different forms and should not be construed as being limited to only the illustrated embodiments. Rather, the embodiments are provided so that this disclosure will be thorough and complete, and will fully convey the scope of the inventive concept to those skilled in the art. Throughout the drawings and written description like reference numbers and label denote like or similar elements and components.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on,"

"directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Certain nonvolatile memory devices according to embodiments of the inventive concept will include NAND flash memory, vertical NAND flash memory, NOR flash memory, resistive random access memory (RRAM), phase-change RAM (PRAM), magneto-resistive RAM (MRAM), ferroelectric RAM (FRAM), spin transfer torque RAM (STT-RAM), etc. Nonvolatile memory devices according to embodiments of the inventive concept may include two-dimensional (2D) or horizontal memory cell arrays and three dimensional (3D) or vertical memory cell arrays. Embodiments of the inventive concept include flash memory in which a charge storage layer is formed of a conductive floating gate, and a charge trap flash (CTF) memory in which a charge storage layer is formed of an insulation film.

Hereafter, certain NAND flash memory devices will be described in some additional detail as examples of other types of nonvolatile memory that fall within the scope of the inventive concept. Those skilled in the art will recognize that the novel and non-obvious features described herein in the context of NAND flash memory examples may be understood, extrapolated and/or incorporated within other types of nonvolatile memory.

FIG. 1 is a block diagram illustrating in relevant part a nonvolatile memory device according to an embodiment of the inventive concept. Referring to FIG. 1, a nonvolatile memory device 100 comprises; a memory cell array 110, a row decoder 120, a voltage generator circuit 130, a page buffer circuit 140, a randomizing circuit 150, an input/output (I/O) circuit 160, and control logic 170.

Those skilled in the art will recognize that the memory cell array 110 may include a plurality of memory blocks, whereas only a single memory block is illustrated in FIG. 1 for clarity. Each one of the plurality of memory blocks is assumed to include a plurality of pages. Pages within a memory block may be variously defined. However, consistent with contemporary definitions a "physical page" will be defined in the illustrated embodiments as a collection of non-volatile memory cells connected to a word line. As is also consistent with contemporary understandings, a physical page of non-volatile memory may include a plurality of "logical pages". Whereas a physical page is usually defined according to a physical implementation of memory cells (and the data programmed thereto or read there form), a logical page is usually defined according to a set of addresses. Thus, in a non-volatile memory device including an array of multi-level memory cells (MLC), a physical page may be defined as a collection of MLC connected to a common word line. Multiple logical pages may be stored in a single physical page. For example, assuming the use of 2-bit MLC in a memory cell array, a physical page may be used to store a first or Least Significant Bit (LSB) page of data and a second or Most Significant Bit (MSB) page of data.

One physical page 111 is specifically illustrated in FIG. 1 as being connected to a word line WLm−2.

The memory cell array 110, and therefore the physical page 111 traversing the memory cell array 110, comprises a main area 112, identified for the storage of payload data, such as user-defined data, and a spare area 114, separately identified for the storage of memory management information. Memory management information may be variously defined within a memory system, and may be variously arranged with the spare area. Memory management information may include, for example, memory cell wear information, error correction information, bad memory cell and replacement memory cell information, etc. Memory management information may be stored in a physical page by physical page basis using the spare area of the respective physical pages.

Within certain embodiments of the inventive concept, the memory management information may also include information indicating whether or not a particular logical page associated with the physical page has been programmed. For example, continuing forward with the assumption that the physical page 111 of FIG. 1 comprises an arrangement of 2-bit MLC, the memory management information stored in a spare area 114 may include information indicating whether or not the LSB page and the MSB have been respectively programmed.

Such page programming indications may be given using many different data definitions (e.g., number and position of relevant bits of memory management information). However, for the sake of simplicity, it will be assumed hereafter that single bit "page flags" are used within the memory management information stored in the spare area to indicate respective page programming condition. Those skilled in the art will recognize that the term "flag" in this context is much broader than the illustrated example of FIG. 1. Multi-bit flags may be used, various page flags may be stored on a basis other than a physical page by physical page basis, and page flags may be stored in a designated register or memory not associated with a physical page of data.

However, returning to FIG. 1, the spare area 114 includes a first flag cell area 115 and a second flag cell area 116. The first flag cell area 115 includes memory cells (hereinafter, referred to as first flag cells) that store information indicating the programmed state of the LSB page of the physical page 111. The second flag cell area 116 includes memory cells (hereinafter, referred to as second flag cells) that store information indicating the programmed state of the MSB page of the physical page 111. In one example, a detailed description of a spare area of a memory cell array is provided by published U.S. Patent Application No. 2009/0180323, the subject matter of which is hereby incorporated by reference.

Thus, in the illustrated embodiment of FIG. 1, the first flag cells store data indicating an LSB program operation directed to the physical page 111. For example, in response to the LSB program operation, the first flag cells may be used to store a data value of '0'. In other words, during the LSB program operation a '0' may be programmed to the first flag cells. Thereafter, a data value of '0' stored in the first flag cells (as may be read during a read operation, for example) indicates that a LSB program operation has been executed in relation to the physical page 111.

In a similar vein, the second flag cells may be used to indicate that a MSB program operation has been performed in relation to the physical page 111. For example, in response to the MSB program operation, the second flag cells may be used to store a data value of '1'. In other words, during the MSB program operation a '1' may be programmed to the second flag cells. Thereafter, a data value of '1' stored in the second flag cells (as may be read during a read operation, for example) indicates that a MSB program operation has been executed in relation to the physical page 111.

Within the memory cell array 110 of FIG. 1, physical pages associated with word lines WL0 to WLm−3 and WLm−1 may be arranged in a substantially similar manner to physical page 111.

In the illustrated embodiment of FIG. 1, the memory cell array 110 is assumed to be a NAND flash memory cell array. As such, each of the memory blocks forming the memory cell array includes a plurality of NAND flash memory cell strings. Each cell string includes a string selection transistor connected with a string selection line SSL, a plurality of memory cells respectively connected with one of the plurality of word lines WL0 to WLm−1, where "m" is an integer greater than or equal to, and a ground selection transistor connected with a ground selection line GSL. Respective string selection transistors are connected with a plurality of bit lines BL0 to BLn−1, 1FBL1 to 1FBLi, and 2FBL1 to 2FBLj, where "n" is an integer greater than or equal to 2, and "i" and "j" are each a positive integer. Respective ground selection transistors are connected with a common source line CSL. In certain embodiments, the common source line CSL may be supplied with a ground voltage or a CSL voltage (e.g., a power supply voltage VDD) from a CSL driver (not shown).

The row decoder 120 is connected with the memory cell array 110 via the selection lines SSL and GSL and the plurality of word lines WL0 to WLm−1. The row decoder 120 may be configured to select one of the plurality of memory blocks in response to an input address ADDR, and apply control voltages (e.g., defined bias voltages) to word lines WL0 to WLm−1 of the selected memory block. Such control voltages may include, but are not limited to, program voltages, pass voltages, verification voltages, read voltages, read pass voltages, and erase voltages.

The voltage generator circuit 130 is configured to generate the bias voltages needed to perform the operations of the nonvolatile memory device 100. The bias voltages generated by the voltage generator circuit 130 may be applied to the memory cell array 110 through the row decoder 120, or associated circuitry. Although not shown in FIG. 1, the voltage generator circuit 130 may include a high voltage generator, a low voltage generator, and a negative voltage generator.

The page buffer circuit 140 is connected with the memory cell array 110 through the plurality of bit lines BL0 to BLn−1, 1FBL1 to 1FBLi, and 2FBL1 to 2FBLj. The page buffer circuit 140 may be selectively configured to temporarily store either "write data" to be programmed to a selected logical page during a program operation, or "read data" retrieved from a selected logical page during a read operation.

In the particular embodiment illustrated in FIG. 1, the page buffer circuit 140 includes a main page buffer 142 and a spare page buffer 144. The main page buffer 142 includes page buffers PB0 to PBn−1 respectively connected with bit lines BL0 to BLn−1. The spare page buffer 144 includes page buffers 1FPB1 to 1FPBi (hereinafter, referred to as first page flag buffers) respectively connected with first page flag bit lines 1FBL1 to 1FBLi, and page buffers 2FPB1 to 2FPBi (hereinafter, referred to as second page flag buffers) respectively connected with second page flag bit lines 2FBL1 to 2FBLi. Each of the page buffers PB0 to PBn−1, FPB1 to 1FPBj, and 2FPB1 to 2FPBj may be connected with one bit line or with two or more bit lines. As is conventionally understood, the former connection approach is an all bit line architecture, and the latter approach is a shield bit line architecture.

The randomizing circuit 150 includes circuitry capable of randomizing incoming write data (D) to generate randomized write data (RD) during a program operation, and selectively de-randomizing outgoing read data, or not, during a read operation. Thus, the randomizing circuit may include separate randomizing circuitry and de-randomizing circuitry, or circuitry configured to selectively perform either the randomizing/de-randomizing functions. The operation by operation functionality of the randomizing circuit 150 may be controlled by a randomization selection signal RSEL provided by control logic 170.

Thus, the randomizing circuit 150 may be turned ON (or activated) and turned OFF (or inactivated) in response to the randomization selection signal RSEL. As will be described in some addition detail hereafter, the activation/inactivation of the randomization selection signal RSEL during a read operation may be controlled, at least in part, by certain determinations regarding whether one or more page programming operations (e.g., a LSB programming or a MSB programming operation) has been performed in relation to identified read data. Other embodiments of the inventive concept may activate/inactivate the operation of the randomizing circuit 150 during a program operation, but for simplicity of explanation that follows it will be assumed that incoming write data is always randomized before being stored to the memory cell array 110 via the main page buffer 142 of the page buffer circuit 140.

However, during a read operation, either one of two types of read data may be retrieved from the memory cell array 110; non-randomized read data (D) and randomized read data (RD). Hence, the randomizing circuit 150 must either de-randomize the randomized read data to generate de-randomized read data (DRD) before it is provided to the I/O circuit 160 or not de-randomize (normal) read data (D) as it is provided to the I/O circuit 160. In other terms the read data (D) essentially bypasses the randomizing circuit 150. The randomizing circuit 150 may be variously implemented according to the nature and intended use of the constituent non-volatile memory device. However, one example of a competent randomizing circuit is disclosed in published U.S. Patent Application Nos. 2010/0229001 and US 2010/0229007, the collective subject matter of which is hereby incorporated by references.

The I/O circuit 160 may be selectively configured to provide incoming write data (D), as received from an external device (e.g., a host or memory controller), to the randomizing circuit 150 during a program operation, or provide read data (DRD or D) from the randomizing circuit 150 to an external device during a read operation. It should be noted that the term "read operation" as used herein denotes any output operation intended to provided read data from the non-volatile memory device to an external circuit, the term "program operation" denotes any input operation intended to store externally provided write data in the non-volatile memory device.

The control logic 170 controls the overall operation of the nonvolatile memory device 100. The control logic 170 analyzes received control signals and/or commands (not shown) as provide by an external device. In response to these control signals and commands, the control logic 170 inter-operatively controls the row decoder 120, voltage generator circuit 130, page buffer circuit 140, randomizing circuit 150, and (I/O) circuit 160.

In the embodiment illustrated in FIG. 1, the control logic 170 includes a randomization determining circuit 172. During read and program operations, the randomization determining circuit 172 may be configured to interrogate (or determine) the data values stored in the first and second page flag cell areas 115 and 116. The activation/inactivation of the randomizing circuit 150 may then be controlled in relation to this determination. As described above, the first flag cell area 115 stores information indicating whether LSB programming of a physical page has been performed, and the second flag cell area 116 stores information indicating whether MSB programming for the physical page has been performed.

During a program operation and a read operation, the randomization determining circuit 172 may receive data from the first page flag buffers 1FB1 to 1FBi that store data read from the first page flag cell area 115 and determine whether the LSB programming of the physical page has been performed, according to a majority decision. During a program operation or a read operation, the randomization determining circuit 172 may receive data from the second page flag buffers 2FB1 to 2FBi that store data read from the second flag cell area 116 and determine whether the MSB programming of the physical page has been performed, according to a majority decision. Then, the randomization determining circuit 172 may generate an appropriate randomization selection signal RSEL (active or inactive) based on whether the LSB programming and/or MSB programming of the physical page has been performed.

As will be readily appreciated by those skilled in the art, the state (active/inactive) of the randomization selection signal RSEL (or any other control signal) may be indicated by assigning a corresponding logic level. In turn, logic levels may be assigned a given voltage level (e.g., ground or some power supply voltage level). The assignment (or definition) of these logic levels (and corresponding voltages) is a matter of design choice. Thus, in the description that follows, the active/inactive states of control signals, like the randomization selection signal RSEL, may be arbitrarily defined to be logically "low" or "high" with an understanding that the opposite logical level might alternately be used.

In the embodiment being described with reference to FIG. 1, it is assumed that when a high randomization selection signal RSEL is generated by operation of the randomization determining circuit 172, the randomizing circuit 150 will operate to randomize incoming write data, or de-randomize outgoing read data. When a low randomization selection signal RSEL is generated by operation of the randomization determining circuit 172, the randomizing circuit 150 operates in a bypass mode to not de-randomized read data.

The desirability of storing randomized write data within the memory cell array 110 will be appreciated by those skilled in the art. Hence, nonvolatile memory devices according to embodiments of the inventive concept benefit from the programming of substantially randomized write data across the matrix of non-volatile memory cells forming the memory cell array 110. Thus, randomized write data is stored on a physical page basis such that the respective threshold voltages for memory cells in a string or column direction, as well as a word line or row direction are distributed uniformly. Such uniform distribution of memory cell threshold voltages across the entire memory cell array tends to reduce inter-memory cell interference and improve read margins.

Despite the desirability of maintaining a substantially uniform distribution of "randomized data" across a memory cell array, it is impractical for new (i.e., never before programmed) non-volatile memory devices to be shipped with rationally (known or resolvable) randomized, stored data states. Such a circumstance would presuppose a common randomization/de-randomization scheme known and used by every customer, among other constraints resulting in the noted impracticability. As a result, new non-volatile memory cell arrays are customarily shipped with all memory cells being placed in a (default) erased state. Thereafter, until being first programmed by the user, the non-volatile memory cells remain in the erased state.

Certain nonvolatile memory devices including MLC according to embodiments of the inventive concept store multi-level write data on a logical page by logical page basis using corresponding page programming operations (e.g., LSB programming and MSB programming for a 2-bit MLC). One or more of the logical pages may have been previously programmed, or not. Thus, during subsequent read operations, the non-volatile memory device must be capable of determining when to de-randomize read data that has previously been programmed and is therefore randomized, and when not to de-randomize read data that has never been previously programmed and is therefore not randomized. Accordingly, a selective activation/inactivation by logic circuit of a randomizing circuit may be made in accordance with a determination as to whether a particular logical data page has previously been programmed. In this manner, it is possible to prevent errant operation of the randomizing circuit in relation to different types of read data (D verses RD) retrieved from a memory cell array during a read operation.

Figure 2:
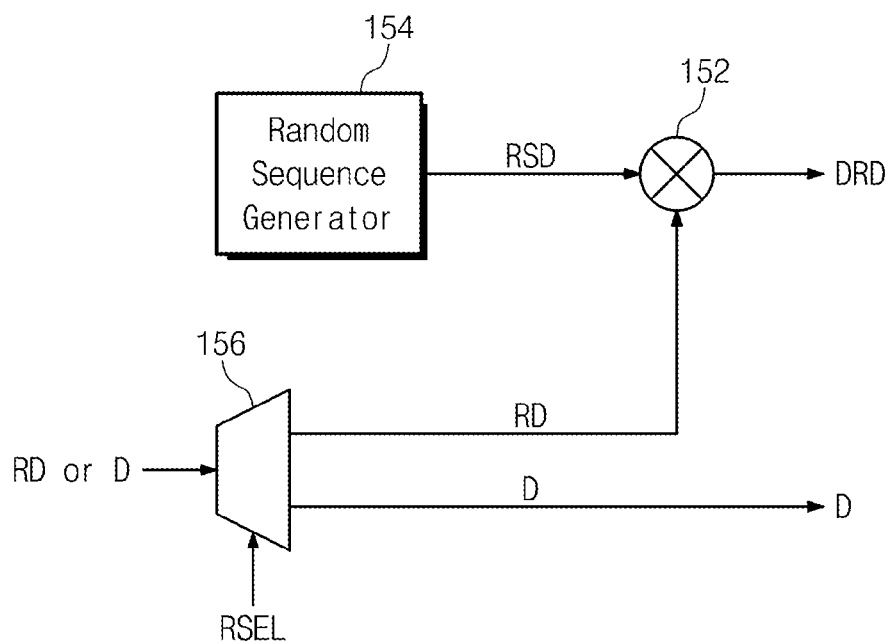
FIG. 2 is a logic diagram further illustrating a data output operation performed by the randomizing circuit of FIG. 1.

As noted above, those skilled in the art will also recognize that data randomization and de-randomization may be accomplished using a variety of techniques and corresponding circuits and/or software. FIG. 2 is a block diagram further illustrating one possible mode of operation for the randomizing circuit 150 of FIG. 1 during a read operation. Referring to FIG. 2, the randomizing circuit 150 comprises a logical operator 152, a random sequence generator 154, and a selector 156.

The logical operator 152 de-randomizes randomized data (RD) by XORing the randomized data (RD) and random sequence data (RSD). The block size of the randomized data (RD) may be the same as the random sequence data (RSD), or different according to the de-randomizing scheme being used. If the randomized data RD has an XOR value of data (D) and the random sequence data (RSD), the de-randomized data (DRD) is source data (D) being not randomized. This may be expressed as the following equation, where the symbol ⊗ indicates the XOR operation.

$$RD = D \otimes RSD$$

$$DRD = RD \otimes RSD$$
$$= (D \otimes RSD) \otimes RSD$$
$$= D \otimes (RSD \otimes RSD)$$
$$= D$$

The random sequence generator 154 generates the random sequence data RSD during the read operation based on at least one seed value. In the illustrated embodiment of FIG. 2, the at least one seed value may be formed from a constant value, or an address associated with the read data, where the address may indicate a logical page and/or a physical page. Where a constant value is used by the random sequence generator 154, it may be stored in a register or memory within the nonvolatile memory device 100. The random sequence generator 154 may be variously implemented. However, one possible implementation example is set forth in published U.S. Patent Application No. 2010/0259983, the subject matter of which is hereby incorporated.

The logical operator 152 illustrated in FIG. 2 can be disposed within a page buffer circuit 140 of FIG. 1.

The selector 156 determines whether randomized data (RD) or not-randomized data (D) provided from the main page buffer 142 of the page buffer circuit 140 should be provided to the logical operator 152 or bypassed directly to the I/O circuit 160 in response to the randomization selection signal RSEL.

With the configuration illustrated in FIG. 2, the randomizing circuit 150 responds to the randomization selection signal RSEL to either de-randomize randomized data (RD) or bypass not randomized data. Accordingly, it is possible to prevent abnormal operation of the randomizing circuit 160 during a read operation.

Figure 3:
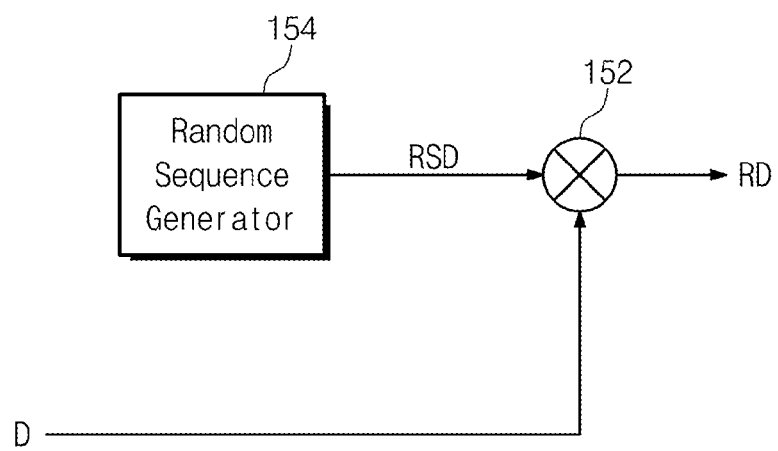
FIG. 3 is a logic diagram further illustrating a data input operation performed by the randomizing circuit of FIG. 1.

FIG. 3 is a block diagram further illustrating one possible mode of operation for the randomizing circuit 150 of FIG. 1 during a program operation. Referring to FIG. 3, the randomizing circuit 150 operates to randomize incoming write data (D) by XORing the write data during the program operation with random sequence data (RSD) provided by the random sequence generator 154. The write data (D) may be directly received form the (I/O) circuit 160. Alternatively, the write data (D) may be provided through the selector 156 of FIG. 2 which operates in response to the randomization selection signal RSEL during the program operation. In other words, the selector 156 may be used during both read and program operations. The randomized data (RD) provide by the logical operator 152 of FIG. 3 may be provided to the main page buffer 142 of the page buffer circuit 140.

As shown in relation to the embodiments illustrated in FIGS. 2 and 3, a randomizing circuit performing both randomizing and de-randomizing functions may be efficiently implemented using a single logical operator 152 and a single random sequence generator 154. However, those skilled in the art will recognize that many different circuits may be used provide the randomizing and/or de-randomizing functions.

As previously noted, nonvolatile memory devices according to embodiments of the inventive concept may be used to program MLC according to multiple (2 or more) logical pages associated with a physical page. Hereafter, for ease of description, it is assumed that two (2) logical pages are associated with 2-bit MLC connected to a word line in a physical page arrangement. The two logical pages include a first or LSB page storing LSB data, and a second or MSB page storing MSB data.

In this context, those skilled in the art will further recognize that the programming of MLC connected to one word line may disturb the programmed state of MLC connected to an adjacent word line and thereby reduce read margins. To reduce such disturbances certain nonvolatile memory devices according to embodiments of the inventive concept may be programmed according to an order of logical pages and/or physical pages that avoids (or minimizes) sequential page programming. Many different page programming "orders" may be defined in this regard.

Figure 4:
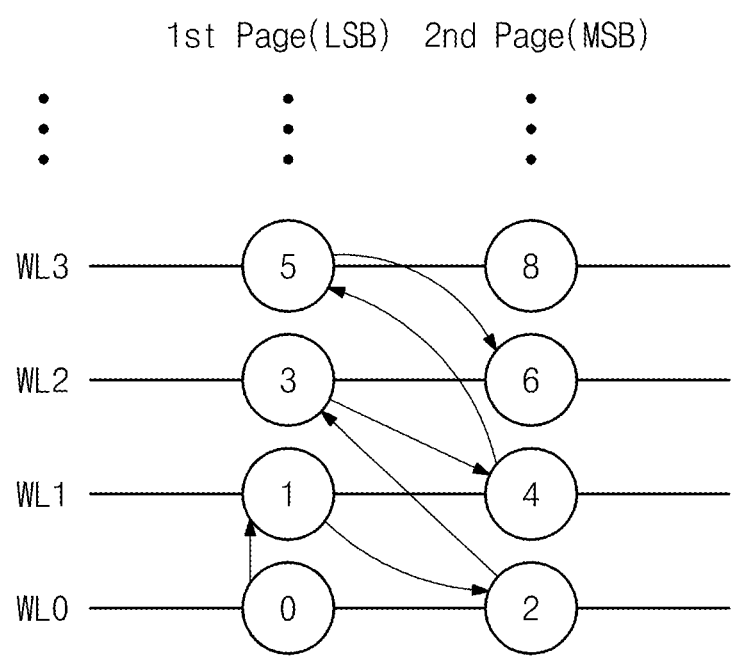
FIG. 4 is a conceptual diagram illustrating, in relevant part, a page program sequence for the nonvolatile memory device of FIG. 1.

FIG. 4 is a conceptual diagram illustrating one exemplary page programming order that may be used within certain embodiments of the inventive concept. As shown in FIG. 4, a first logical page (FLP) "0" associated with a first word line WL0 is programmed, then a FLP "1" associated with a second word line WL1 is programmed. Then, a second logical page (SLP) "2" associated with the first word line WL0 is programmed, and a FLP "3" associated with a third word line WL2 is programmed. FLPs and SLPs may be programmed in this staggered order (SLP following a FLP) to avoid or minimize adjacent MLC disturbances. The ordered arrangement of FLP and SLP may be assigned using values derived from corresponding logical addresses and may be determined according to the page program sequence.

The page programming order (or page programming sequence) illustrated in FIG. 4 is just one example. Embodiments of the inventive concept may use many different page programming orders.

Figure 5A:
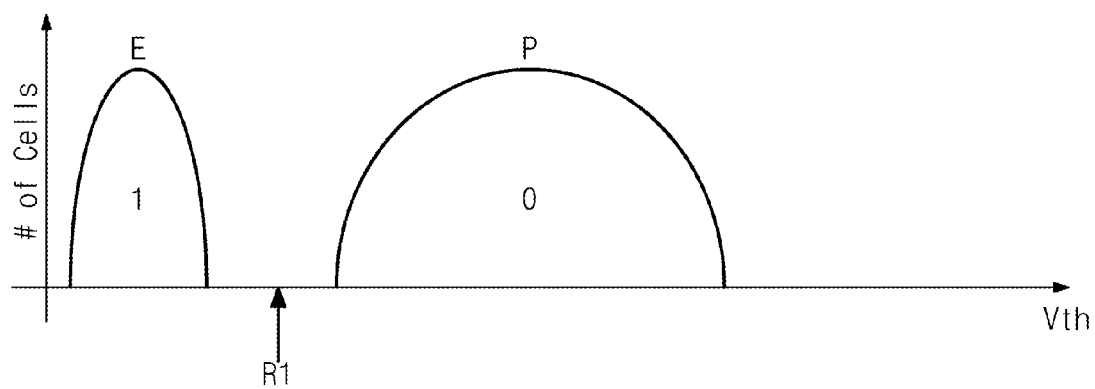
FIG. 5A is a conceptual diagram illustrating threshold voltage distributions obtained by a first page (or LSB) program operation.
Figure 5B:
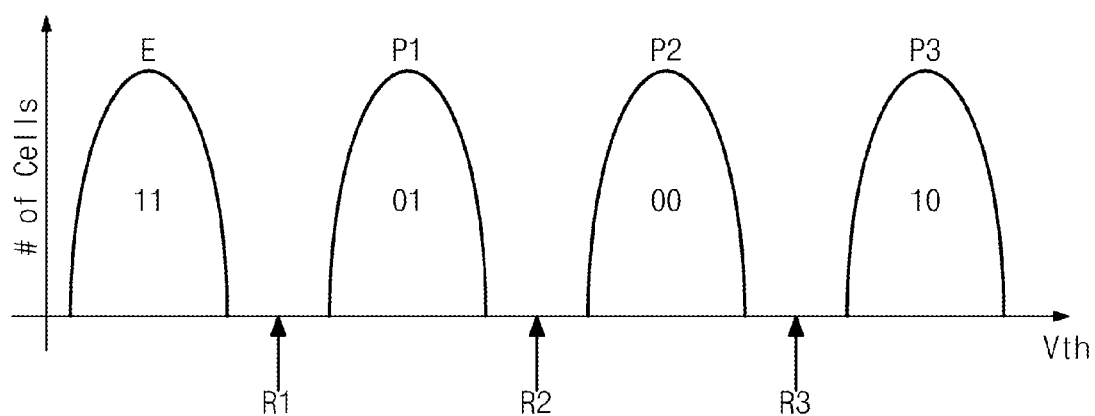
FIG. 5B is a conceptual diagram illustrating threshold voltage distributions obtained by a second page (or MSB) program operation.

FIG. 5A is a conceptual diagram illustrating threshold voltage distributions obtained by a first page (or LSB) program operation, and FIG. 5B is a conceptual diagram illustrating threshold voltage distributions obtained by a second page (or MSB) program operation according to certain embodiments of the inventive concept.

Referring to FIG. 5A, threshold voltage distributions according to the first page programming include an erase state E and a "provisional" program state P. In certain embodiment, the erase state E may correspond to a data value of '1', and the provisional program state P may correspond to a data value of '0', but this might be otherwise. A first read voltage R1 may be used to discriminate between the erase state E and the provisional program state P.

Referring to FIG. 5B, threshold voltage distributions according to the second page programming includes an erase state E, a first program state P1, a second program state P2, and a third program state P3. In this embodiment, the erase state E may correspond to a data value of '11', the first program state P1 to a data value of '01', the second program state P2 to a data value of '00', and the third program state P3 to a data value of '10', but this might be otherwise. A first read voltage R1 may be used to discriminate the erase state E from the first program state P1, a second read voltage R2 may be used to discriminate between the first and second program states P1 and P2, and a third read voltage R3 may be used to discriminate between the second and third program states P2 and P3.

Referring to FIG. 1, the nonvolatile memory device 100 according to an embodiment of the inventive concept programs a first page (or LSB) flag in response to the first page program operation, and a second page (or MSB) flag in response to a second page program operation. A "set" LSB flag in the first flag cell area 115 indicates that LSB programming is has been performed, and a set MSB flag in the second flag cell area 116 indicates that MSB programming has been performed.

Figure 6A:
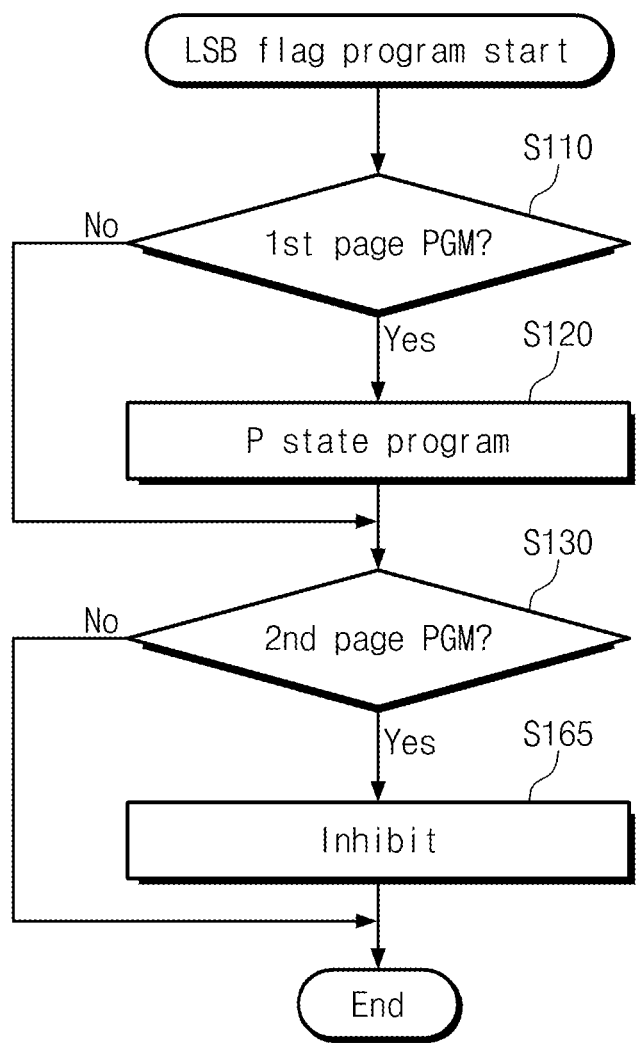
FIG. 6A is a flowchart summarizing a LSB flag program method for the nonvolatile memory device of FIG. 1 according to an embodiment of the inventive concept.

FIG. 6A is a flowchart summarizing one possible LSB flag program method for the nonvolatile memory device of FIG. 1 according to an embodiment of the inventive concept. Referring collectively to FIGS. 1, 5A, and 6A, control logic 170 first determines whether a requested operation accessing the memory cell array 110 is a first page program operation (S110). Whether the requested operation is a first page program operation may be determined according to a write address associated with the program operation. For example, as illustrated in FIG. 4, an odd-numbered address may be used to indicate that a requested program operation is a first page program operation.

If the requested operation is determined to be a first page program operation (S110=YES), an LSB flag in the first flag area 115 is programmed to the provisional program state P (S120). However, if the requested operation is not a first page program operation (S110=NO), the method skips the programming of the LSB flag.

Next, the control logic 170 determines whether the requested operation is a second page program operation (S130). Here again, whether the requested operation is the second page program operation may be determined in relation to a corresponding address. For example, as illustrated in FIG. 4, an even-numbered address may be used to indicate that the requested operation is a second page program operation. If the requested operation is determined to be the second page program operation (S130=YES), the LSB flag is program-inhibited (S165). However, if the requested operation is determined to not be the second page program operation, the method terminates.

Using the LSB flag program method of 6A, the LSB flag may be programmed to the provisional state P in response to the first page program operation, while the LSB flag is program inhibited in response to the second page program operation. However, other methods may be used to appropriately set/reset the LSB flag in response to a first (or LSB) programming.

Figure 6B:
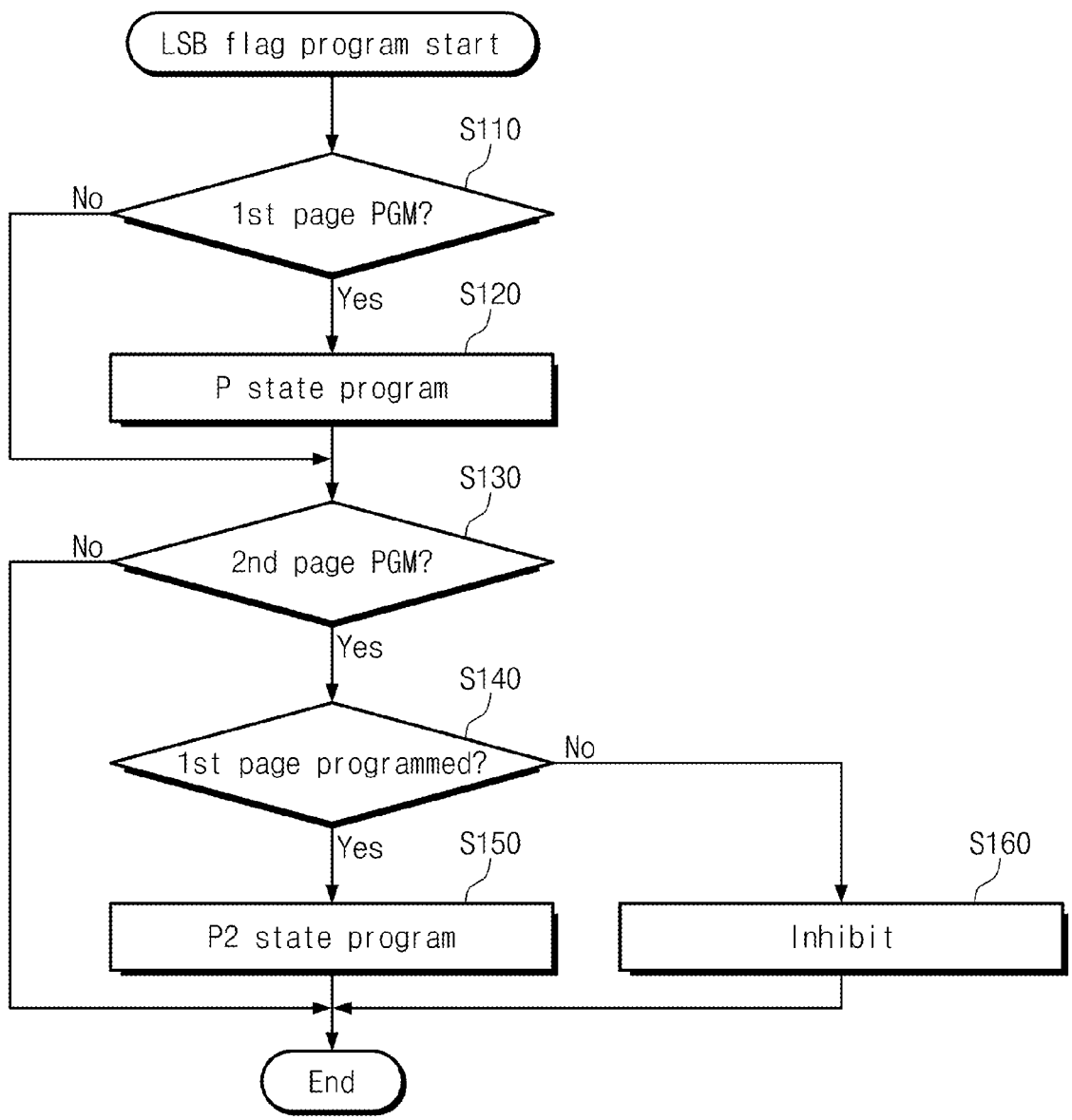
FIG. 6B is a flowchart summarizing a LSB flag program method for the nonvolatile memory device of FIG. 1 according to another embodiment of the inventive concept.

FIG. 6B is a flowchart summarizing one possible MSB flag program method for the nonvolatile memory device of FIG. 1 according to an embodiment of the inventive concept. Referring collectively to FIGS. 1, 5A, 5B, and 6B, control logic 170 first determines whether a requested operation accessing the memory cell array is a first page program operation (S110). Whether a requested operation is a first page program operation may be determined according to a corresponding address. For example, as illustrated in FIG. 4, an odd-numbered address may be used to indicate that a requested operation is a first page program operation.

If the requested operation is determined to be a first page program operation (S110=YES), an LSB flag in the first flag area 115 is programmed to the provisional program state P (S120). However, if the requested operation is not a first page program operation, the programming of the LSB flag is skipped.

Next, the control logic 170 determines whether the requested operation is a second page program operation (S130). Here again, whether the requested operation is a second page program operation may be determined according to a corresponding address. For example, as illustrated in FIG. 4, an even-numbered address may be used to indicate that the requested operation is a second page program operation.

If the requested operation is determined to be a second page program operation (S130=YES), the control logic 170 then determines whether a first page of data associated with the second page od data identified by the second page program operation has previously been programmed (S140). Whether the first page has been programmed may be determined by reading the value of one or more first page flags in the first flag cell area. If the requested operation is not a second page program operation, the method terminates.

Now, if it is determined that the first page has been programmed (S140=YES), the LSB flag is programmed (or reprogrammed from the provisional program state P) to one of the plurality of programmed states (P1, P2 or P3) (e.g., the second program state P2 in the example of FIG. 6B) (S150). However, if the first page is determined not to be programmed (i.e., the LSB flag has an erased state) (S140=NO), the LSB flag is program inhibited (S160).

As described above, according to the LSB flag program method, the LSB flag is programmed to have the provisional program state P in response to the first page program operation, and the LSB flag is programmed to have one of the plurality of program states (e.g., P2 or P3) in response to the second page program operation.

Figure 7:
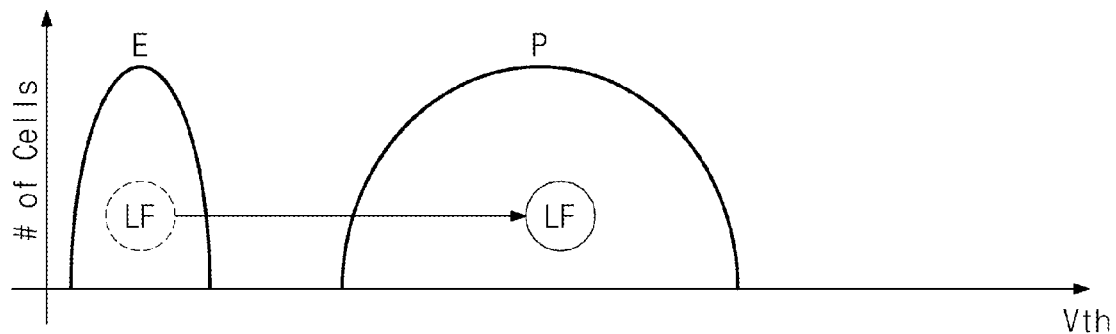
FIG. 7 is a conceptual diagram illustrating threshold voltage distributions obtained by a first page (or LSB) program operation.

FIG. 7 is a conceptual diagram illustrating threshold voltage distributions and page flag states that are obtained in response to a first (or LSB) flag program method. Referring to FIG. 7, the LSB flag (LF) is programmed to the provisional program state P in response to the first page program operation.

Figure 8:
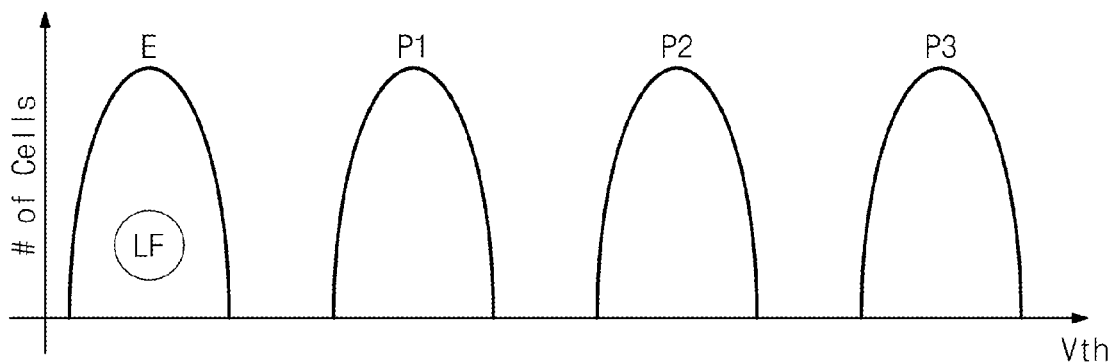
FIG. 8 is a conceptual diagram illustrating threshold voltage distributions obtained by a second page (or MSB) program operation under condition that first page programming has not been performed.

FIG. 8 is a conceptual diagram illustrating threshold voltage distributions and page flag states that are obtained in response to a second page program operation under the condition that a first page program operation is not performed. Referring to FIG. 8, an LSB flag LF is program inhibited in response to the second page program operation under the condition that a first page program operation has not been performed. This means that the LSB flag LF has an erase state E.

Figure 9A:
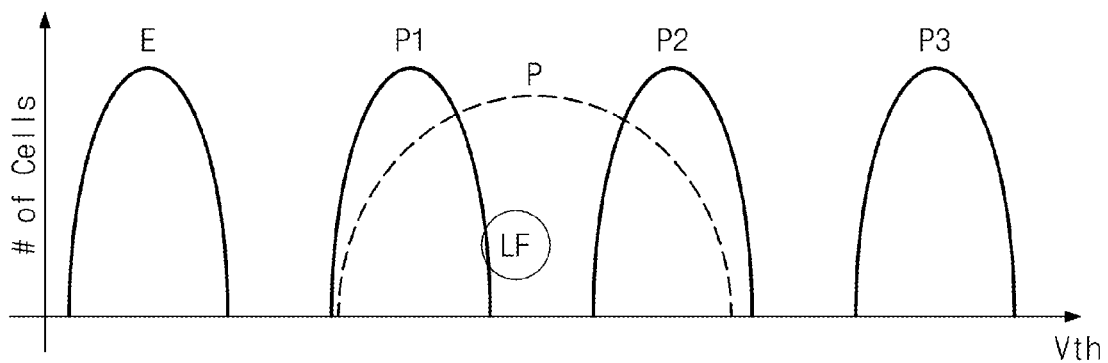
FIG. 9A is a conceptual diagram illustrating threshold voltage distributions and page flag states obtained by a programming method under condition that first page programming has been performed.

FIG. 9A is a conceptual diagram illustrating threshold voltage distributions and page flag states that are obtained in response to a second page program operation after a first page program operation is performed. Referring to FIG. 9A, an LSB flag LF is program inhibited in response to a second page program operation under the condition that a first page program operation has been performed.

Figure 9B:
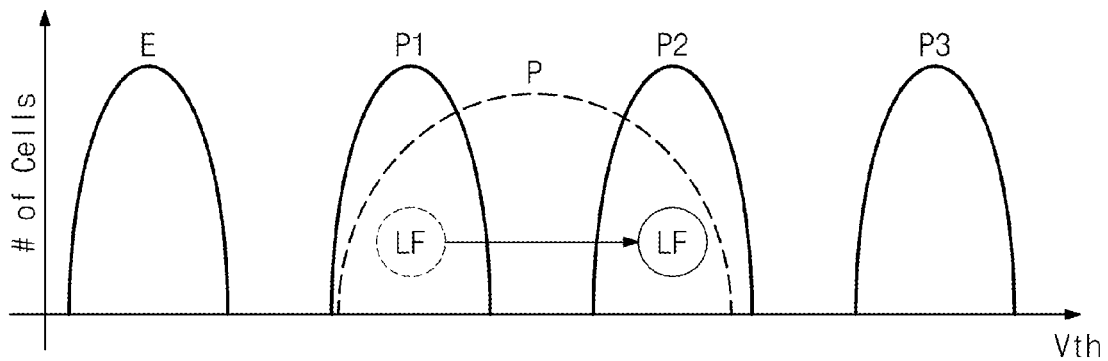
FIG. 9B is a conceptual diagram illustrating threshold voltage distributions and page flag states obtained by a programming method under condition that first page programming has been performed.

FIG. 9B is a conceptual diagram illustrating threshold voltage distributions and page flag states that are obtained in response to a second page program operation performed after a first page program operation has been performed. Referring to FIG. 9B, an LSB flag LF is (re)programmed to the second program state P2 from the provisional program state P under the condition that a first page program operation has been performed.

Figure 10:
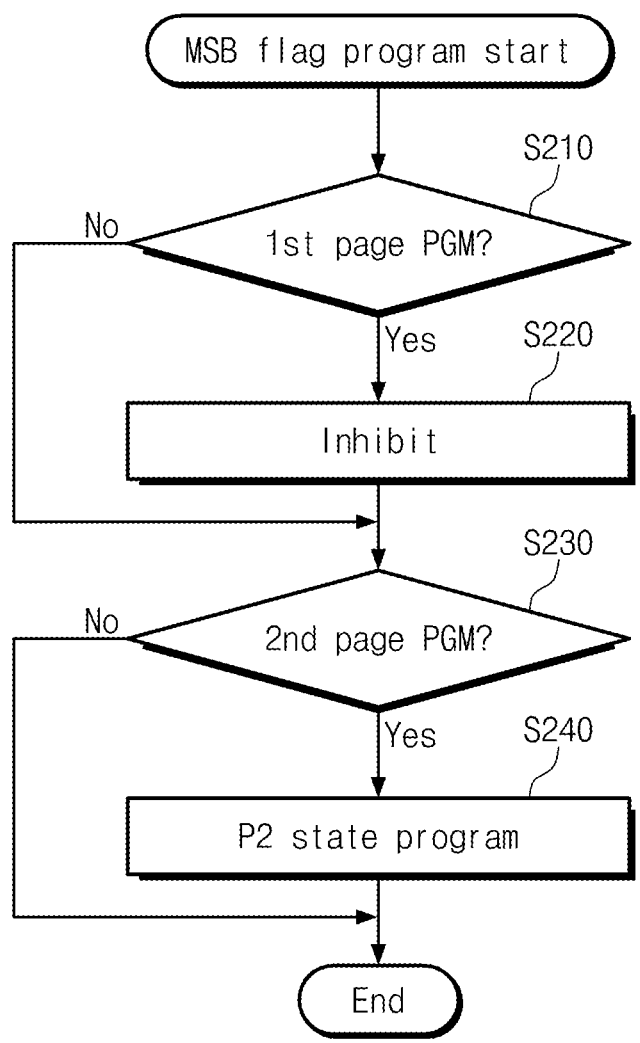
FIG. 10 is a flowchart summarizing a MSB flag program method for the nonvolatile memory device of FIG. 1.

FIG. 10 is a flowchart summarizing an MSB flag program method for the nonvolatile memory device of FIG. 1. The MSB flag program method will be described with collective reference to FIGS. 1, 5A, 5B, and 10.

First, the control logic 170 determines whether a requested operation is a first page program operation (S210). If the requested operation is a first page program operation (S110=YES), a MSB flag is program inhibited (S220). However, if the requested operation is not a first page program operation, the program inhibiting of the MSB flag is skipped.

Then, the control logic 170 determines whether the requested operation is a second page program operation (S230). If the requested access is the second page program operation (S230=YES), the MSB flag is programmed to one of the plurality of programmed states (e.g., the second program state P2 or the third program state P3) (S240). However, if the requested operation is not a second page program operation, the method terminates.

As described above, the MSB flag program method includes program inhibiting the MSB flag in response to a first page program operation and programming the MSB flag in response to a second program state P2 in response to the second page program operation.

Figure 11:
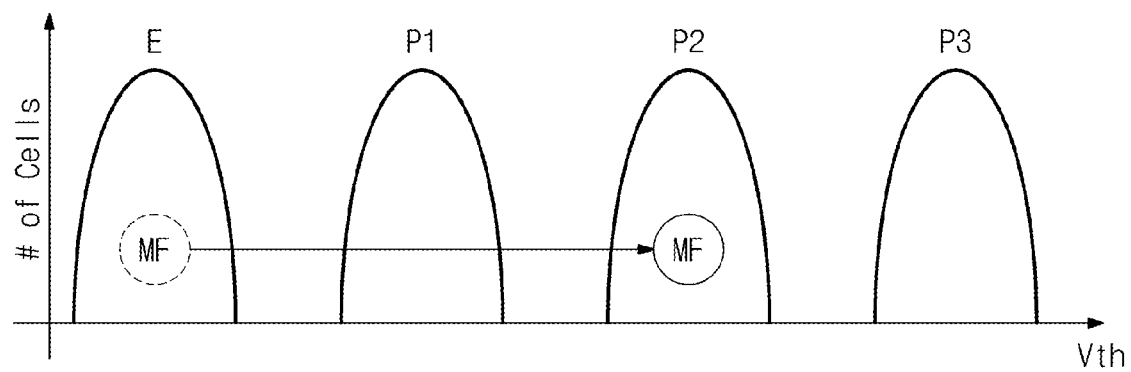
FIG. 11 is a conceptual diagram illustrating threshold voltage distributions and page flag states obtained by a programming method under the condition that a first page programming has not been performed.

FIG. 11 is a conceptual diagram illustrating threshold voltage distributions and page flag states that are obtained in response an MSB flag program method and a second page program operation under the condition that a first page program operation has not been performed. Referring to FIG. 11, in response to a second page program operation, an MSB flag is programmed to one of the plurality of programmed states (e.g., the second program state P2) from an erase state E.

Figure 12A:
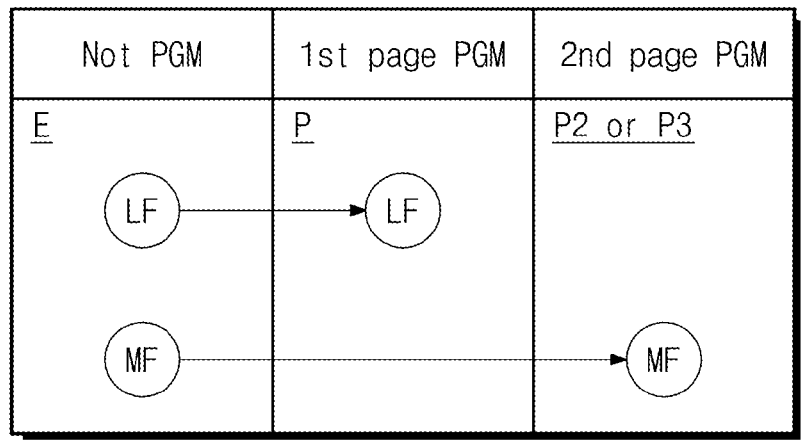
FIG. 12A is a state diagram illustrating possible page flag states for the nonvolatile memory device of FIG. 1.

FIG. 12A is a conceptual diagram illustrating flag states obtained by a page program operation of the nonvolatile memory device of in FIG. 1. Referring to FIG. 12A, LSB and MSB flags (LF and MF) have an erase state E under the condition that first and second pages are not programmed. In the event that the first page is programmed, the LSB flag (LF) has the provisional program state P, and the MSB flag has an erase state E. In the event that the second page is programmed, the LSB flag (LF) is program inhibited, and the MSB flag has a second or third program state P2 or P3, wherein the level of the threshold voltage of the second or third program state P2 or P3 is greater than the provisional program state P.

Figure 12B:
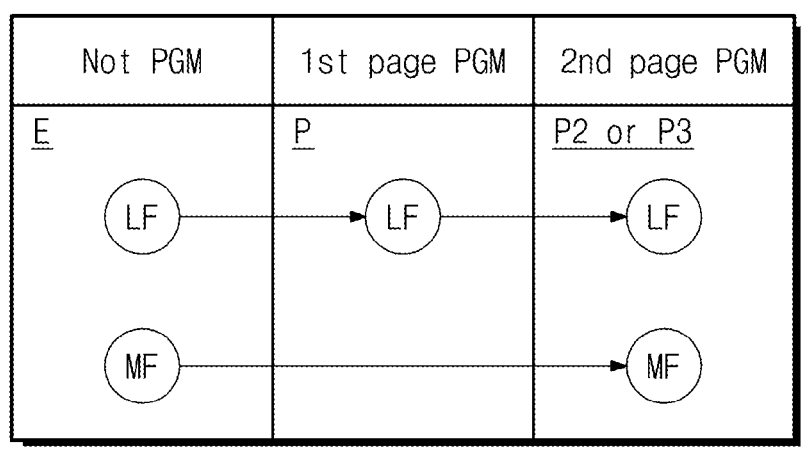
FIG. 12B is a state diagram illustrating possible page flag states for the nonvolatile memory device of FIG. 1.

FIG. 12B is a conceptual diagram illustrating flag states obtained by page program operation of the nonvolatile memory device of FIG. 1. Referring to FIG. 12B, LSB and MSB flags (LF and MF) have an erase state E under the condition that first and second pages are not programmed. In the event that the first page is programmed, the LSB flag (LF) has the provisional program state P, and the MSB flag has an erase state E. If the second page is programmed, the LSB flag (LF) has the second or third program state P2 or P3, and the MSB flag has the second or third program state P2 or P3, wherein the level of the threshold voltage of the second or third program state P2 or P3 is greater than level than the provisional program state P.

As described in FIG. 12B, the LSB flag LF is programmed to have a state having a threshold distribution greater than the threshold voltage for the provisional program state. Thus, the programmed threshold voltage for the non-volatile memory cells storing the page flag will increase from an initial state.

Figure 13:
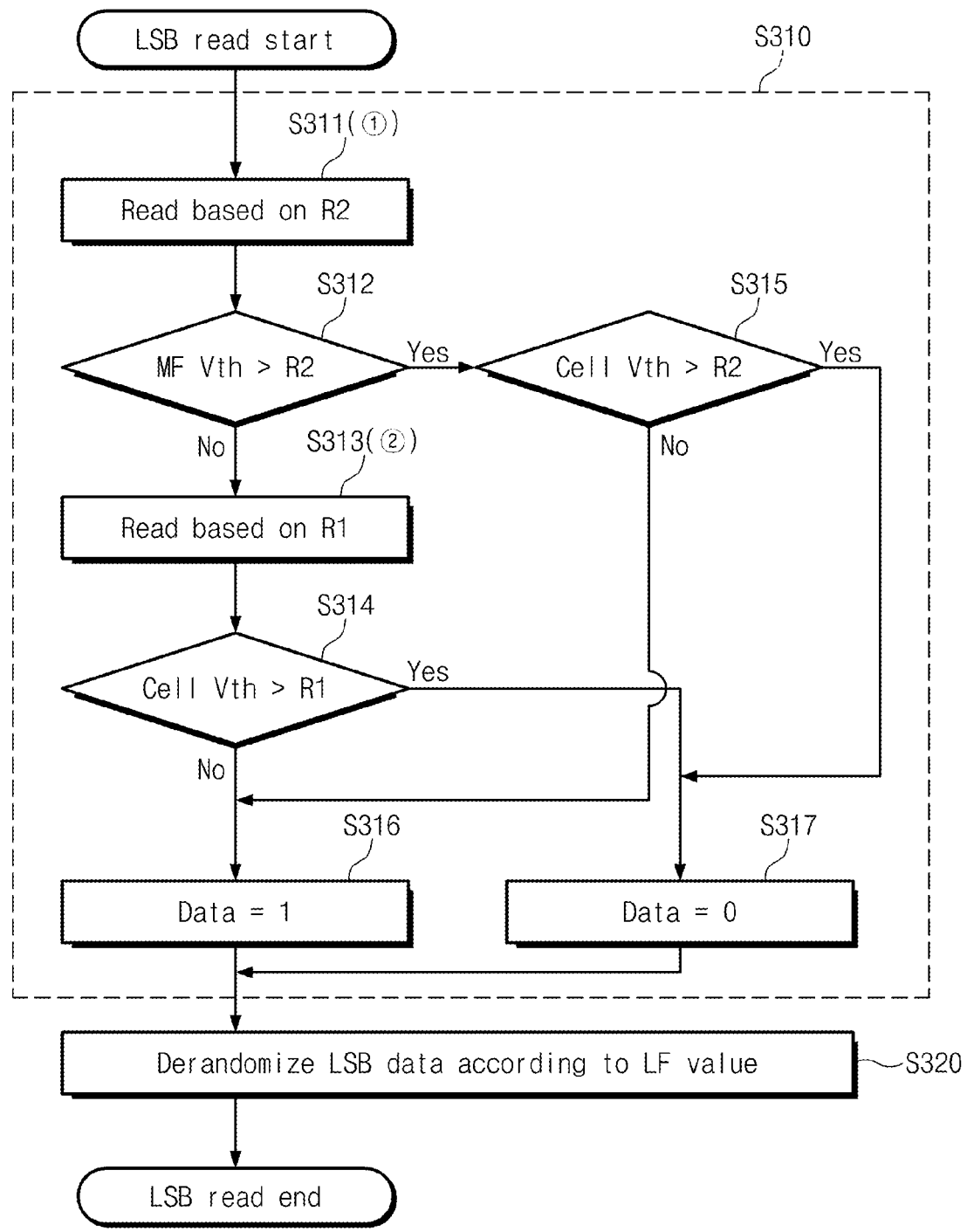
FIG. 13 is a flowchart summarizing a first (or LSB) read operation according to an embodiment of the inventive concept.

FIG. 13 is a flowchart summarizing an LSB read operation according to anther embodiment of the inventive concept. The LSB read operation generally comprises determining the value of LSB data (S310) and then de-randomizing the LSB data in relation to the stored value of a LSB flag (S320).

Determining the value of the LSB data (S310) begins by discriminating the LSB data using a second read voltage R2 (S311) in a first read stage (①) using the control logic 170. The first read stage may include determining whether a requested operation is a LSB read operation based on a corresponding read command and address, and then reading a data page identified by the address using the second read voltage R2. The read page may include first and second flag cells 115 and 116 indicating whether the LSB page and/or the MSB page has been programmed.

That is, a determination is made as to whether a threshold voltage Vth of an MSB flag is greater than the level of the second read voltage R2 (S312). In the event that the read page has not been MSB programmed, the threshold voltage Vth of the MSB flag will be less than the level of the second read voltage R2. In the event that the read page has been MSB programmed, the threshold voltage Vth of the MSB flag will be greater than the level of the second read voltage R2.

If the threshold voltage Vth of the MSB flag is less than the second read voltage R2 (S312=NO), the LSB page identified by the read address is read during a second read stage (②) based on a first read voltage R1 under the control of the control logic 170 (S313).

That is, a determination is made as to whether the threshold voltage of a memory cell in the LSB page is greater than the first read voltage R1 (S314). If the threshold voltage of the memory cell is less than the first read voltage R1 (S314=NO), then a data value of '1' is determined (S316). However, if the threshold voltage of the memory cell is greater than the first read voltage R1 (S314=YES), then a data value of '0' is determined (S317).

If the threshold voltage of the MSB flag MF is greater than the second read voltage R2 (S312=YES), a determination as to whether each of threshold voltages of read memory cells is greater than the second read voltage R2 (S315). If a threshold voltage of a memory cell is less than the second read voltage R2 (S315=NO), a data value of '1' is determined (S316). However, if a threshold voltage of a memory cell is greater than the second read voltage R2 (S315=NO), a data value of '0' is determined (S317). This concludes the LSB data determination step (S310).

As described above, according to the LSB data determination operation in the illustrated embodiment of the inventive concept, LSB data stored in a memory cell is determined by performing a first read stage (①) using a second read voltage R2 and the second read stage (②) using a first read voltage R1. This type of LSB data determination operation may be variously performed, but one possible approach is disclosed in U.S. Pat. No. 7,672,162, the subject matter of which is hereby incorporated by reference.

After the LSB data determination operation (S310) is complete, the LSB data is de-randomized, or not, in accordance with the stored value of the LSB flag (LF) (S320). This may be variously accomplished. One approach to of determining the de-randomization or not during an LSB read operation will be described with reference to FIGS. 14 to 17. As illustrated in FIG. 1, activation/inactivation of a randomization function may be determined according to an applied randomization selection signal RSEL. That is, the randomizing circuit 150 of FIG. 1 may be turned ON or turned OFF in response to the randomization selection signal RSEL.

Figure 14:
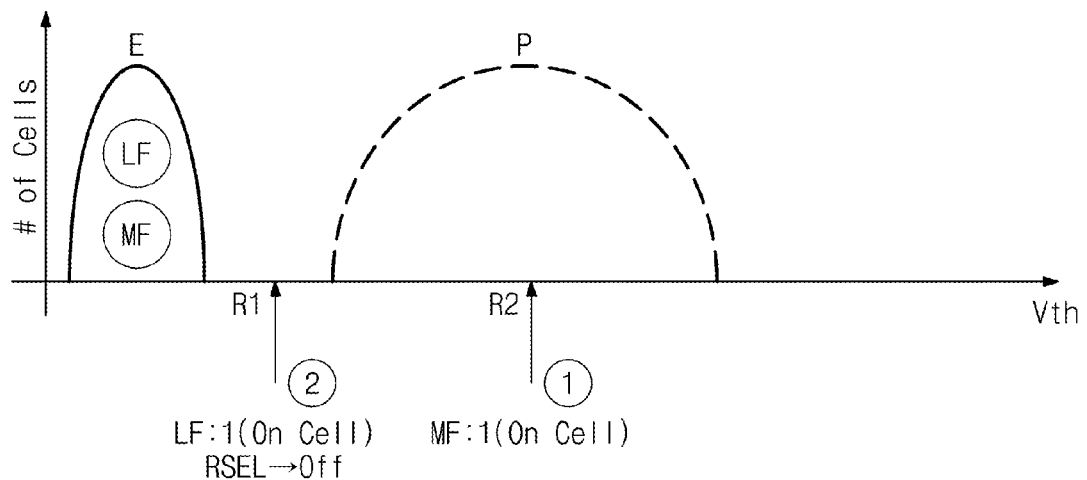
FIGS. 14, 15, 16, 17A and 17B are respective conceptual diagrams illustrating threshold voltage distributions and page flag states that may be obtained by programming methods and/or read in relation to read methods according to embodiments of the inventive concept.

FIG. 14 is a diagram showing an LSB read operation for the nonvolatile memory device of FIG. 1 when the first and second pages have not been programmed. Referring to FIG. 14, since first and second pages are not programmed, LSB and MSB flags (LF and MF) have an erase state E, respectively.

During the LSB read operation, control logic 170 reads a page identified by a corresponding address using the second read voltage R2 (the first read stage (①)). At this time, data of second (or MSB) flag cells in the second flag cell area 116 is read. Since the MSB flag (MF) has an erase state E, data stored in the second flag cells is determined to have a data value of '1' according to a majority decision. It is understood from the above description that the second page is not programmed.

Afterwards, during the LSB read operation, the control logic 170 reads the page identified by a corresponding address using the first read voltage R1 (the second read stage (②)). At this time, data of first (or LSB) flag cells in the first flag cell area 115 is read. Since the LSB flag (LF) has an erase state E, data stored in the first flag cells is determined to have a data value of '1' according to a majority decision. It is understood from the above description that the first page is not programmed.

Since the first and second pages are determined not to be programmed during the LSB read operation, the randomization determining circuit 172 of the control logic 170 turns OFF or inactivates the randomization selection signal RSEL applied to the randomizing circuit 150.

As understood from the above description, when the first and second pages are not programmed, the randomizing circuit 150 is turned OFF during an LSB read operation. This means that the (not-randomized) read data obtained from the identified will essentially bypass the randomizing circuit 150 on its way to the I/O circuit 160 without being de-randomized.

Figure 15:
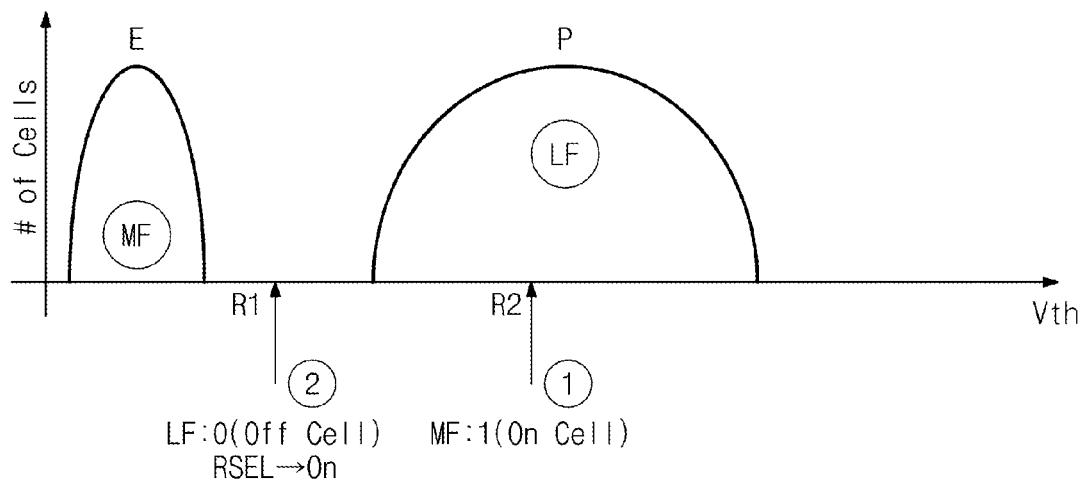

FIG. 15 is a diagram showing an LSB read operation for the nonvolatile memory device of FIG. 1 when a first page has been programmed but a second page has not been programmed. Referring to FIG. 15, since a first page is programmed and a second page is not programmed, an LSB flag LF is programmed to the provisional program state P, and an MSB flag MF has an erase state E.

Under these conditions during the LSB read operation, control logic 170 reads a page identified by a corresponding address using the second read voltage R2 (the first read stage (①)). At this time, data of second (or MSB) flag cells in the second flag cell area 116 is read. Since the MSB flag MF has an erase state E, data stored in the second flag cells is determined to have a data value of '1' according to a majority decision. It is understood from the above description that the second page is not programmed.

Afterwards, during the LSB read operation, the control logic 170 reads the page using the first read voltage R1 (the second read stage ②). At this time, data of first (or LSB) flag cells in the first flag cell area 115 is read. Since the LSB flag LF has the provisional program state P, data stored in the first flag cells is determined to have a data value of '0' according to a majority decision. It is understood from the above description that the first page is programmed.

Since during the LSB read operation, the first page is determined to be programmed and a second page is determined not to be programmed, the randomization determining circuit 172 of the control logic 170 turns ON the randomization selection signal RSEL applied to the randomizing circuit 150.

As understood from the above description, when a first page is programmed and a second page is not programmed, the randomizing circuit 150 is turned ON during the LSB read operation. This means that data read obtained from the page should be de-randomized and that the de-randomized data will then be provided to the I/O circuit 160.

Figure 16:
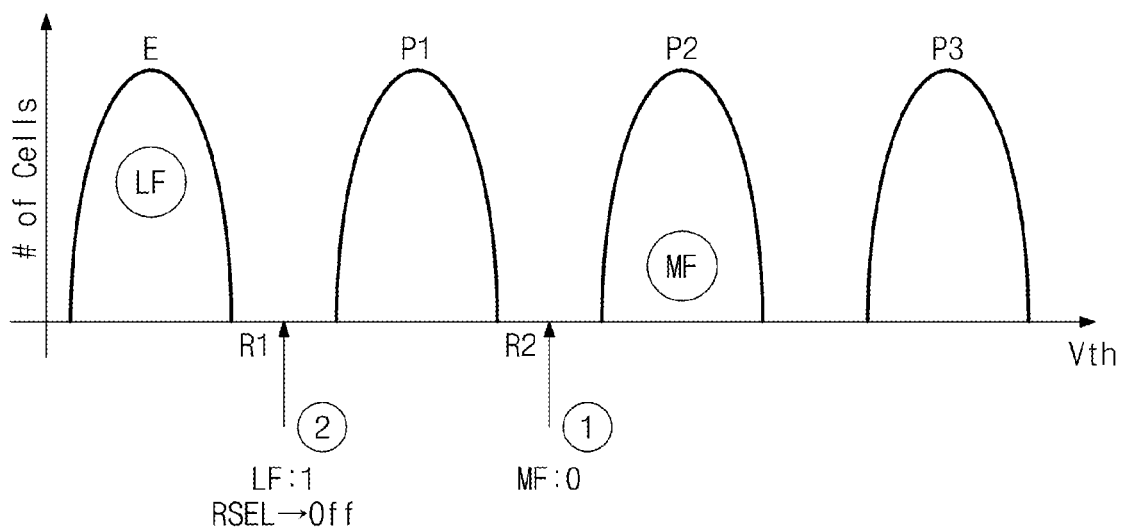

FIG. 16 is a diagram showing an LSB read operation for the nonvolatile memory device of FIG. 1 when a first page is not programmed and a second page is programmed. Referring to FIG. 16, since a first page is not programmed and a second page is programmed, an LSB flag LF has an erase state E, and an MSB flag MF has a second program state P2.

During the LSB read operation, the control logic 170 reads a page identified by a corresponding address using the second read voltage R2 (the first read stage ①). At this time, data of second (or MSB) flag cells in the second flag cell area 116 is read. Since the MSB flag MF has a second program state P2, data stored in the second flag cells is determined to have a data value of '0' according to a majority decision. It is understood from the above description that the second page is programmed.

Afterwards, during the LSB read operation, the control logic 170 reads the page using the first read voltage R1 (the second read stage ②). At this time, data of first (or LSB) flag cells in the first flag cell area 115 is read. Since the LSB flag LF has the erase state E, data stored in the first flag cells is determined to be a data value of '1' according to a majority decision. It is understood from the above description that the first page is not programmed.

Since during the LSB read operation, the first page is determined not to be programmed and a second page is determined to be programmed, the randomization determining circuit 172 of the control logic 170 turns OFF the randomization selection signal RSEL applied to the randomizing circuit 150.

As understood from the above description, when a first page is not programmed and a second page is programmed, the randomizing circuit 150 is turned OFF during the LSB read operation. This means that the LSB data obtained during the read operation will essentially bypass the randomizing circuit 150 on its way to the I/O circuit 160 without de-randomizing.

Figure 17A:
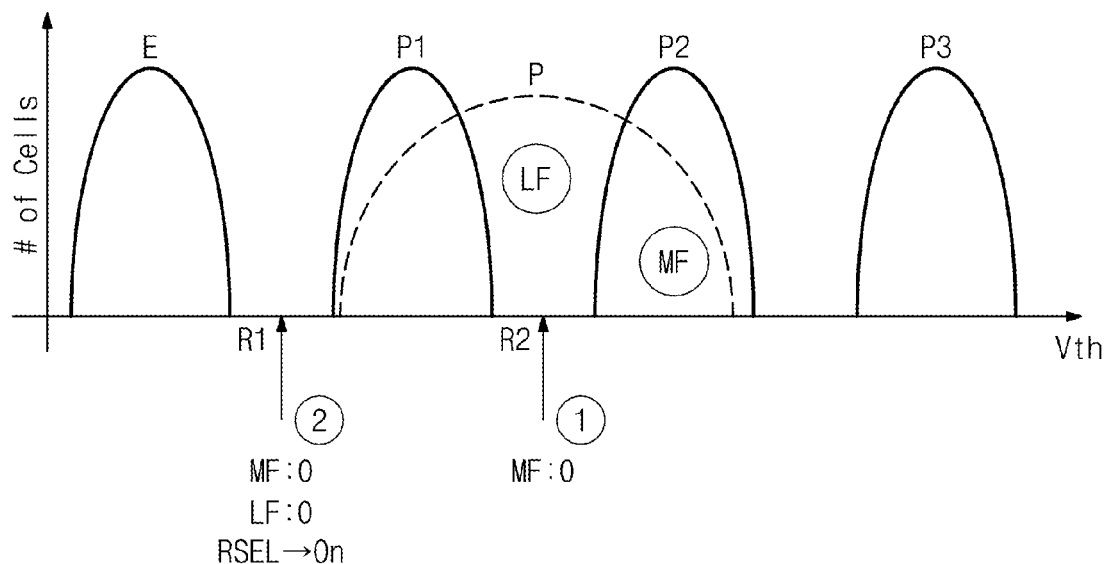

FIG. 17A is a diagram showing an exemplary LSB read operation for the nonvolatile memory device of FIG. 1 when first and second pages are programmed. Referring to FIG. 17A, since first and second pages are programmed, an LSB flag LF has a provisional program state P, and an MSB flag MF has a second program state P2.

During the LSB read operation, control logic 170 reads a page identified by a corresponding address using the second read voltage R2 (the first read stage ①). At this time, there are read data of first (or LSB) flag cells in the first flag cell area 115 and data of second (or MSB) flag cells in the second flag cell area 116. Since the MSB flag MF has a second program state P2, data stored in the second flag cells is determined to have a data value of '0' according to a majority decision. It is understood from the above description that the second page is programmed.

Afterwards, during the LSB read operation, the control logic 170 reads the page using the first read voltage R1 (the second read stage ②). At this time, there are read data of the first (or LSB) flag cells in the first flag cell area 115 and data of the second (or MSB) flag cells in the second flag cell area 116. Since the LSB flag LF has the provisional program state P, data stored in the first flag cells is determined to have a data vale of '0' according to a majority decision. It is understood from the above description that the first page is programmed.

Since the first and second pages are determined to be programmed during the LSB read operation, the randomization determining circuit 172 of the control logic 170 turns ON the randomization selection signal RSEL applied to the randomizing circuit 150.

As understood from the above description, when first and second pages are programmed, the randomizing circuit 150 is turned ON during the LSB read operation. This means that data read from the identified page will be de-randomized and the de-randomized data provided to the I/O circuit 160.

Figure 17B:
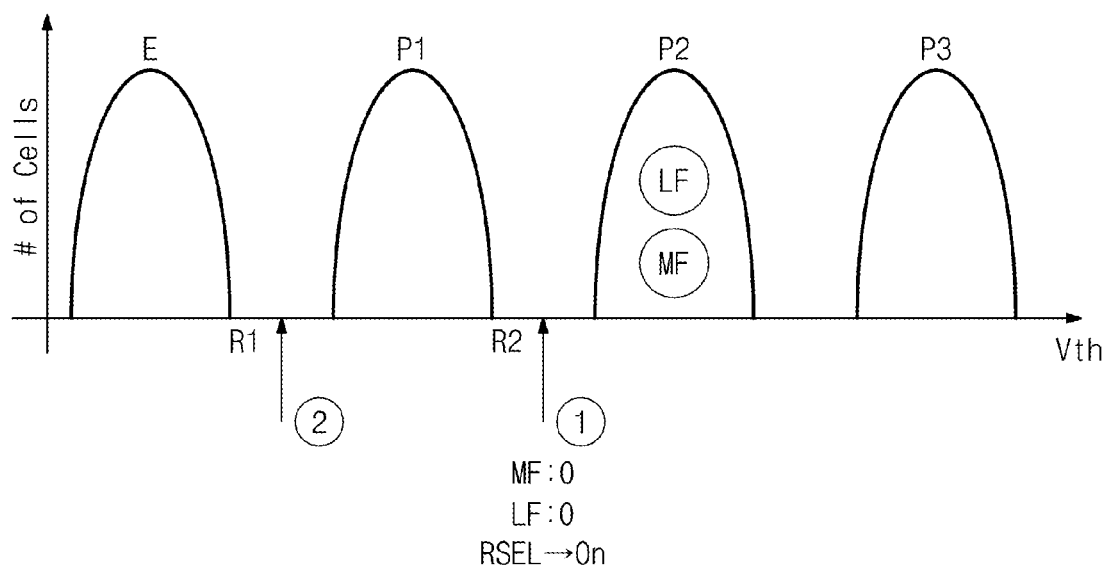

FIG. 17B is a diagram showing another LSB read operation for the nonvolatile memory device of FIG. 1 when first and second pages are programmed. Referring to FIG. 17B, since first and second pages are programmed, LSB and MSB flags LF and MF have the second program state P2, respectively.

During the LSB read operation, the control logic 170 reads a page identified by a corresponding address using the second read voltage R2 (the first read stage ①). At this time, there are read data of first (or LSB) flag cells in the first flag cell area 115 and data of second (or MSB) flag cells in the second flag cell area 116. Since the LSB flag LF and the MSB flag MF have the second program state P2, data stored in the first and second flag cells is determined to have a data value of '0' according to a majority decision. It is understood from the above description that the first and second pages are programmed.

Afterwards, during the LSB read operation, the control logic 170 reads the page using the first read voltage R1 (the second read stage ②). Since it is already determined whether the first and second pages is programmed or not during eh read operation using the second read voltage R2, read operations for the first and second flag cells need not be performed.

Since the first and second pages are determined to be programmed during the LSB read operation, the randomization determining circuit 172 of the control logic 170 turns ON the randomization selection signal RSEL applied to the randomizing circuit 150.

As is understood from the above description, when the first and second pages are programmed, the randomizing circuit 150 is turned ON during the LSB read operation. This means that data read from the identified page is de-randomized and the de-randomized data is provided to the I/O circuit 160.

Below, an MSB read operation according to another embodiment of the inventive concept will be described.

Figure 18:
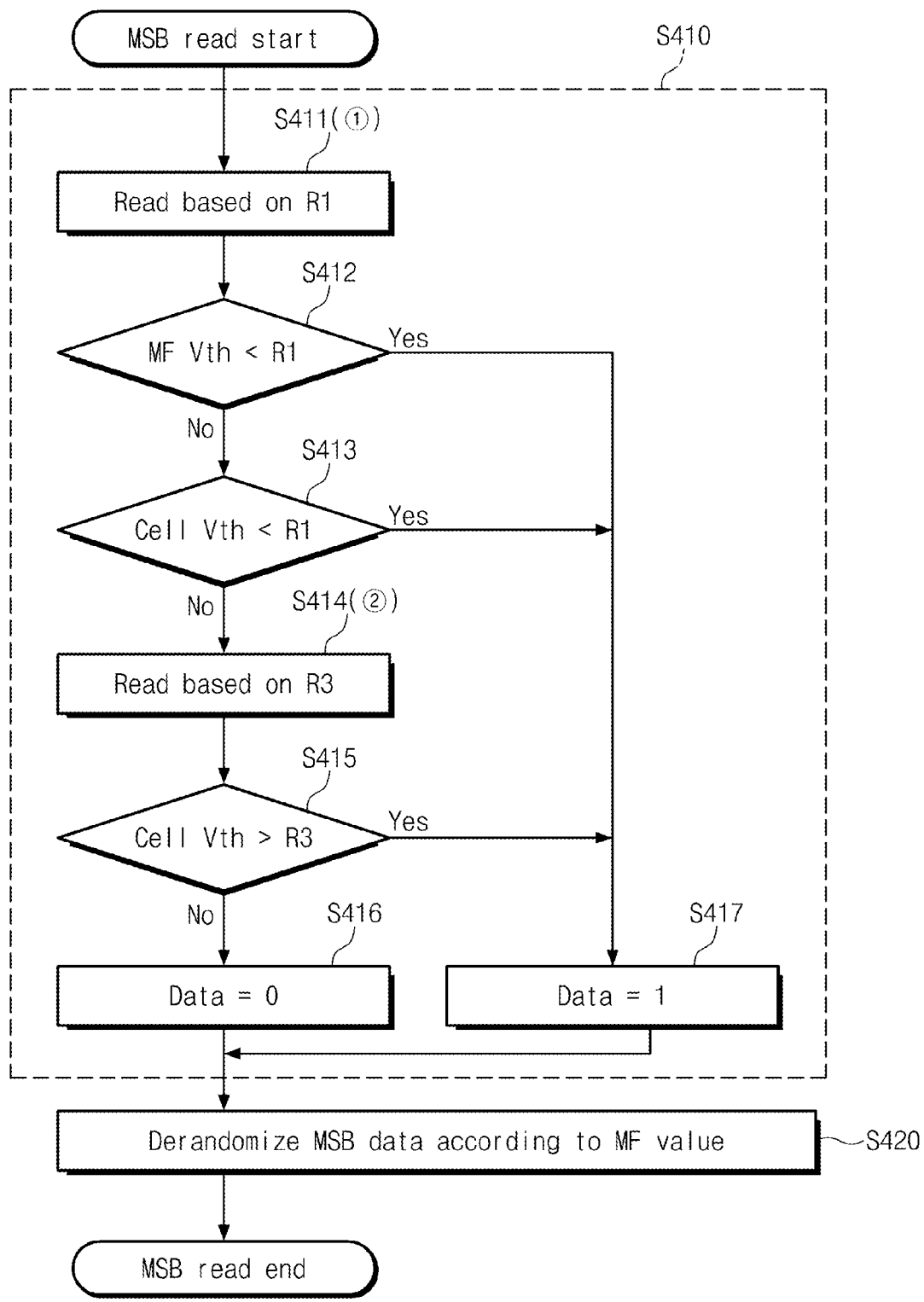
FIG. 18 is a flowchart summarizing a second (or MSB) read operation according to an embodiment of the inventive concept.

FIG. 18 is a flowchart summarizing an MSB read operation according to an embodiment of the inventive concept. Referring to FIGS. 5 and 18, the MSB read operation is described after making the assumption, as before, that the threshold voltage distribution for constituent MLC may be programmed to an erase state E, a first program state P1, a second program state P2, and a third program state P3 that respectively correspond to data values of '11', '01', '00', and '10'.

The MSB read operation generally comprises determining the MSB data (S410) and thereafter de-randomizing, or not, the MSB data in accordance with the stored value of an MSB flag (MF) (S420).

Referring collectively to FIGS. 1 and 18, the step of determining the MSB data (S410) begins with the control logic 170 determining whether a requested operation accessing the memory cell array 110 is an MSB read operation. This determination may be made with reference to a received read command and a corresponding address. Then, a second page of data identified by the corresponding address is read using the first read voltage R1 (S411). This step is referred to as the first read stage ①. That is, a determination is made as to whether the threshold voltage of the MSB flag (MF) is less than the first read voltage R1 (S412). If the threshold voltage of the MSB flag (MF) is less than the first read voltage R1 (S412=YES), the second page is determined not to be programmed. However, if the threshold voltage of the MSB flag (MF) is not less than the first read voltage R1 (S412=NO), a data value of '1' (corresponding to an ON cell) is stored in the page buffer corresponding to memory cells (S417).

If the threshold voltage of the MSB flag MF is greater than the first read voltage R1, that is, if the second page is determined to be programmed (S412=NO), it is then determined whether the threshold voltage of a read memory cell is less than the first read voltage R1 (S413). If the threshold voltage of the read memory cell is less than the first read voltage R1 (S413=YES), a data value of '1' is stored in the page buffer corresponding to a memory cell. However, if the threshold voltage of the read memory cell is greater than the first read voltage R1 (S413=NO), the second page identified by the corresponding address is read using a third read voltage R3 (S414). This is referred to as a second read stage ②.

Thus, a determination if made as to whether the threshold voltage of the memory cell being read is greater than the third read voltage R3 (S415). If the threshold voltage of the memory cell is greater than the third read voltage R3, a data value of '1' is stored in the page buffer corresponding to the memory cell (S417). However, if the threshold voltage of the read memory cell is less than the third read voltage R3 (S415=NO), a data value of '0' is stored in the page buffer corresponding to the memory cell (S416).

Using the foregoing approach, MSB data may be determined according to an established data value ordering (e.g., '11', '01', '00', and '10' in FIG. 5B). If data read according to the read voltage R1 is '0' (corresponding to an OFF cell) and data read according to the read voltage R3 is '1' (corresponding to an ON cell), the MSB data may be determined to have a data value of '0' (S416). If data read according to the read voltage R1 is '0' (corresponding to an OFF cell) and data read according to the read voltage R3 is '0' (corresponding to an OFF cell), the MSB data may be determined to have a data value of '1' (S417).

As described above, according to the MSB data determination step, MSB data stored in a memory cell may be determined by executing a first read stage ① using a first read voltage R1, followed by a second read stage ② sing a second read voltage R3. The foregoing is just one possible example of an MSB data determination approach that may be used with embodiments of the inventive concept. A more complete understanding of this exemplary approach may be obtained by the description contained in U.S. Pat. No. 7,672,162, the subject matter of which is hereby incorporated by reference.

After the MSB data determination step (S410) is complete, the MSB data may be de-randomized, or not, according to the value of the MSB flag (MF) (S420). The de-randomization step (S420) of the MSB read operation will be more described in some additional details with reference to FIGS. 19 through 22.

Figure 19:
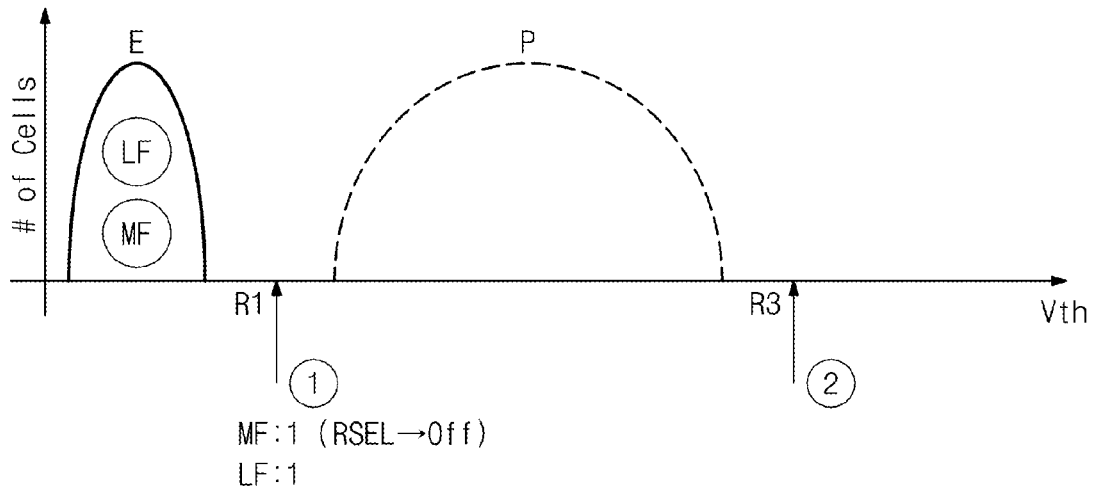
FIGS. 19, 20, 21, 22A and 22B are respective conceptual diagrams illustrating threshold voltage distributions and page flag states that may be obtained by programming methods and/or read in relation to read methods according to embodiments of the inventive concept.

FIG. 19 is a diagram showing an MSB read operation for the nonvolatile memory device of FIG. 1 when first and second pages are not programmed. Referring to FIG. 19, since the first and second pages are not programmed, both LSB and MSB flags (LF and MF) will have an erase state E.

During the MSB read operation, the control logic 170 reads a page identified by a corresponding address using the first read voltage R1 (the first read stage ①). At this time, data of second (or MSB) flag cells in the second flag cell area 116 is read. Since the MSB flag (MF) has an erase state E, data stored in the second flag cells is determined to have a data value of '1' according to a majority decision. Further, data stored in the first (or LSB) flag cells in the first flag cell area 115 is read. Since the LSB flag (LF) has an erase state E, data stored in the first flag cells is determined to have a data value of '1' according to a majority decision.

Afterwards, during the MSB read operation, the control logic 170 reads a page identified by the corresponding address using the third read voltage R3 (the second read stage ①). At this time, the first and second flag cells are not read.

Since the first and second pages are determined not to be programmed during the MSB read operation, the randomization determining circuit 172 of the control logic 170 turns OFF the randomization selection signal RSEL applied to the randomizing circuit 150.

As may be understood from the above description, when the first and second pages are not programmed, the randomizing circuit 150 is turned OFF during the MSB read operation. Thus, the data read essentially bypasses the randomizing circuit 150 on its way to the I/O circuit 160 without de-randomizing.

Figure 20:
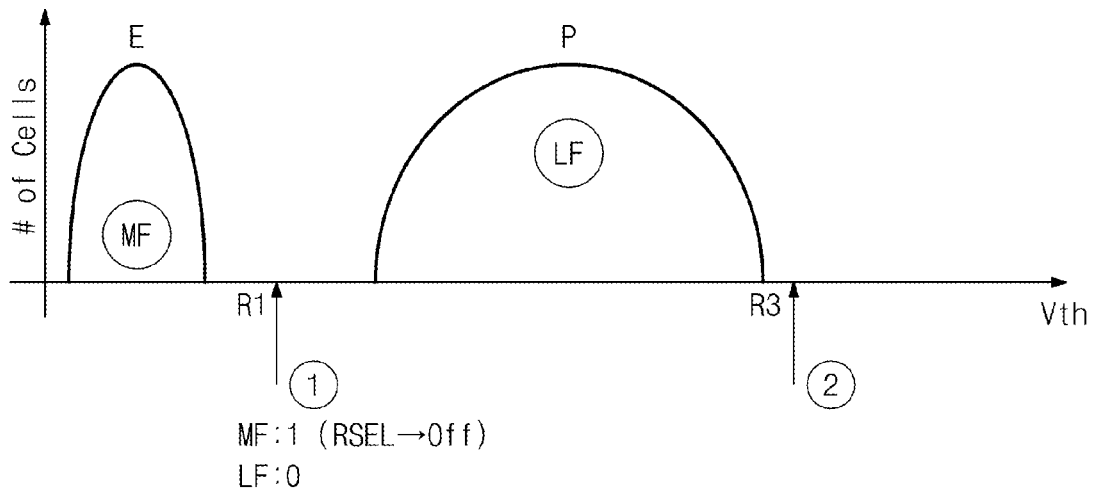

FIG. 20 is a diagram showing an MSB read operation for the nonvolatile memory device of FIG. 1 when the first page is programmed but the second page is not programmed. Referring to FIG. 20, since the first page is programmed and the second page is not programmed, the LSB flag (LF) has the provisional program state P, and the MSB flag (MF) has an erase state E.

During the MSB read operation, the control logic 170 reads a page identified by a corresponding address using the first read voltage R1 (the first read operation ①). At this time, the data stored in the second (or MSB) flag cells in the second flag cell area 116 is read. Since the MSB flag (MF) has an erase state E, data stored in the second flag cells is determined to have a data value of '1' according to a majority decision. Further, data stored in the first (or LSB) flag cells in the first flag cell area 115 is read. Since the LSB flag (LF) has the provisional program state P, data stored in the first flag cells is determined to have a data value of '0' according to a majority decision.

Afterwards, during the MSB read operation, the control logic 170 reads the page identified by the corresponding address using the third read voltage R3 (the second read stage ②). At this time, the first and second flag cells are not read.

Since during the MSB read operation, the first page is determined to be programmed and a second page is determined not to be programmed, the randomization determining circuit 172 of the control logic 170 turns OFF the randomization selection signal RSEL applied to the randomizing circuit 150.

As may be understood from the above description, when the first page is programmed and the second page is not programmed, the randomizing circuit 150 is turned OFF during the MSB read operation. This means that the data read from the identified page essentially bypasses the randomizing circuit 150 on its way to the I/O circuit 160 without de-randomizing.

Figure 21:
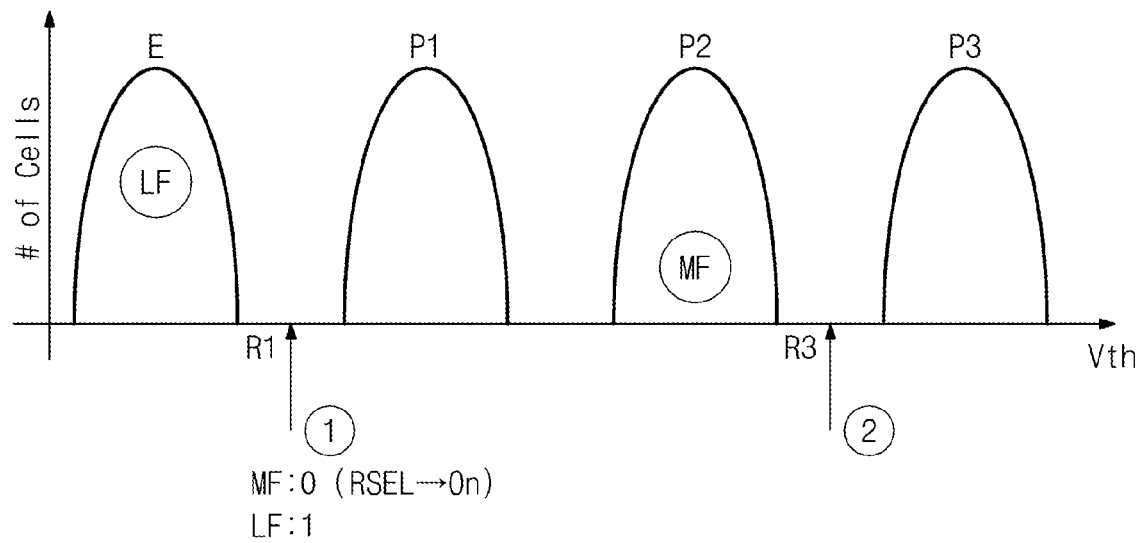

FIG. 21 is a diagram showing an MSB read operation for the nonvolatile memory device of FIG. 1 when the first page is not programmed and the second page is programmed. Referring to FIG. 21, since the first page is not programmed and the second page is programmed, the LSB flag (LF) has an erase state E, and the MSB flag (MF) has the second program state P2.

During the LSB read operation, the control logic 170 reads a page identified by a corresponding address using the first read voltage R1 (the first read stage ①). At this time, data stored in the second (or MSB) flag cells in the second flag cell area 116 is read. Since the MSB flag (MF) has the second program state P2, the data stored in the second flag cells is determined to have a data value of '0' according to a majority decision. Further, data stored in the first (or LSB) flag cells in the first flag cell area 115 is read. Since the LSB flag (LF) has the erase state E, the data stored in the first flag cells is determined to have a data value of '1' according to a majority decision.

Afterwards, during the MSB read operation, the control logic 170 reads a page identified by a corresponding address using the third read voltage R3 (the second read stage ②). At this time, the first and second flag cells need not be read.

Since, during the MSB read operation, the first page is determined not to be programmed and a second page is determined to be programmed, the randomization determining circuit 172 of the control logic 170 turns ON the randomization selection signal RSEL applied to the randomizing circuit 150.

As may be understood from the above description, when the first page is not programmed and a second page is programmed, the randomizing circuit 150 is turned ON during the MSB read operation. This means that the data read from the identified page is de-randomized by the randomizing circuit 150 and the de-randomized data is then provided to an I/O circuit 160.

Figure 22A:
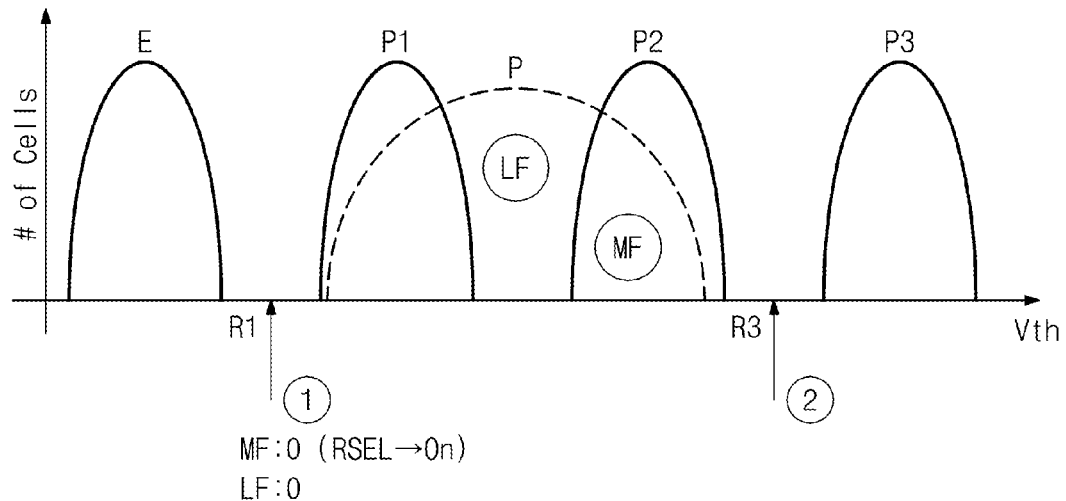

FIG. 22A is a diagram showing an MSB read operation for the nonvolatile memory device of FIG. 1 when both the first and second pages are programmed. Referring to FIG. 22A, since the first and second pages are programmed, the LSB flag (LF) has the provisional program state P and the MSB flag (MF) has the second program state P2.

During the MSB read operation, the control logic 170 reads a page identified by a corresponding address using the first read voltage R1 (the first read stage ①). At this time, the data stored in the second (or MSB) flag cells in the second flag cell area 116 is read. Since the MSB flag (MF) has the second program state P2, the data stored in the second flag cells is determined to have a data value of '0' according to a majority decision. Further, the data stored in the first (or LSB) flag cells in the first flag cell area 115 is read. Since the LSB flag (LF) has the provisional program state P, data stored in the first flag cells is determined to have a data value of '0' according to a majority decision.

Afterwards, during the MSB read operation, the control logic 170 reads the page identified by the corresponding address using the third read voltage R3 (the second read stage ②). At this time, the first and second flag cells need not be read.

Since the first and second pages have been determined to be programmed during the LSB read operation, the randomization determining circuit 172 of the control logic 170 turns ON the randomization selection signal RSEL applied to the randomizing circuit 150.

As may be understood from the above description, when the first and second pages are programmed, the randomizing circuit 150 is turned ON during the MSB read operation. This means that read data obtained from the identified page is de-randomized and the de-randomized data is then provided to the I/O circuit 160.

Figure 22B:
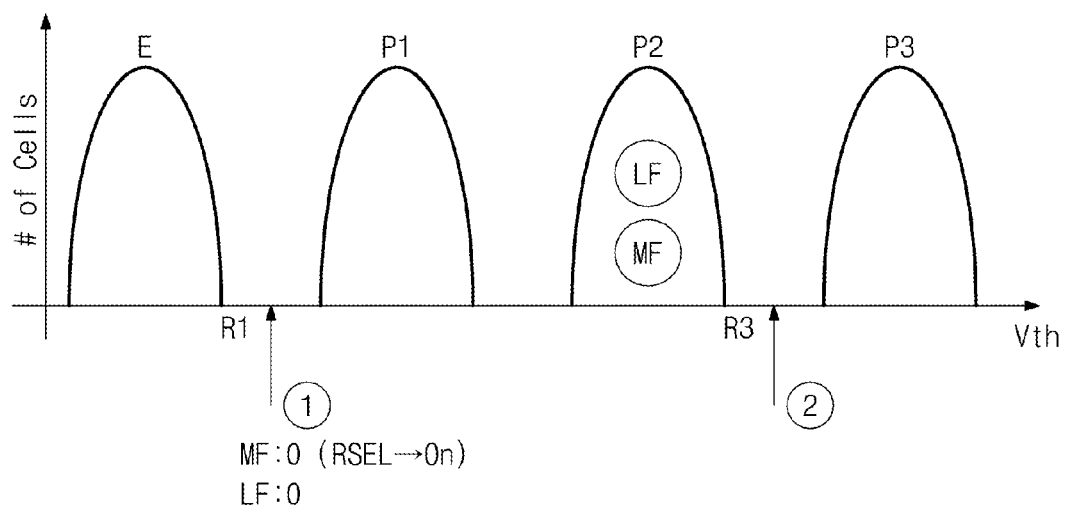

FIG. 22B is a diagram showing another MSB read operation for the nonvolatile memory device of FIG. 1 when the first and second pages are programmed. Referring to FIG. 22B, since first and second pages are programmed, the LSB and MSB flags (LF and MF) have the second program state P2.

During the MSB read operation, the control logic 170 reads a page identified by a corresponding address using the first read voltage R1 (the first read stage ①). At this time, the data stored in the second (or MSB) flag cells in the second flag cell area 116 is read. Since the MSB flag (MF) has the second program state P2, the data stored in the second flag cells is determined to have a data value of '0' according to a majority decision. Further, the data stored in the first (or LSB) flag cells in the first flag cell area 115 is read. Since the LSB flag (LF) has the second program state P2, the data stored in the first flag cells is determined to have a data value of '0' according to a majority decision.

Afterwards, during the MSB read operation, the control logic 170 reads the page identified by the corresponding address using the third read voltage R3 (the second read operation ②). At this time, the first and second flag cells need not be read.

Since the first and second pages are determined to be programmed during the MSB read operation, the randomization determining circuit 172 of the control logic 170 turns ON the randomization selection signal RSEL applied to the randomizing circuit 150.

As may be understood from the above description, when first and second pages are programmed, the randomizing circuit 150 is turned ON during the MSB read operation. This means that read data obtained from the identified page is de-randomized by the randomizing circuit 150 and then the de-randomized data is provided to the I/O circuit 160.

FIG. 23A is a table illustrating one possible set of page flag states that may be used to control activation/inactivation of the randomization selection signal according to an embodiment of the inventive concept. In FIG. 23A, when both the LSB and MSB flags (LF and MF) have an erase state E, the randomization selection signal RSEL is turned OFF during both the LSB read operation and the MSB read operation. When the LSB flag (LF) has the provisional program state P and the MSB flag (MF) has an erase state E, the randomization selection signal RSEL is turned ON during the LSB read operation and turned OFF during the MSB read operation. When the LSB flag (LF) has an erase state E and the MSB flag (MF) has the second or third program state P2 or P3, the randomization selection signal RSEL is turned OFF during the LSB read operation and turned ON during the MSB read operation. Finally, when the LSB flag (LF) has the provisional program state P and the MSB flag (MF) has the second or third program state P2 or P3, the randomization selection signal RSEL is turned ON during both the LSB read operation and the MSB read operation.

FIG. 23B is a table illustrating another possible set of page flag states that may be used to control activation/inactivation of the randomization selection signal according to an embodiment of the inventive concept. In FIG. 23B, when both the LSB and MSB flags (LF and MF) have an erase state E, the randomization selection signal RSEL is turned OFF during both the LSB read operation and the MSB read operation.

When the LSB flag (LF) has the provisional program state P and the MSB flag (MF) has an erase state E, the randomization selection signal RSEL is turned ON during the LSB read operation and turned OFF during the MSB read operation. When the LSB flag (LF) has an erase state E and the MSB flag (MF) has the second or third program state P2 or P3, the randomization selection signal RSEL is turned OFF during the LSB read operation and turned ON during the MSB read operation. Finally, when the LSB flag (LF) and the MSB flag (MF) both have the second or third program state P2 or P3, the randomization selection signal RSEL is turned ON during both the LSB read operation and the MSB read operation.

Figure 24:
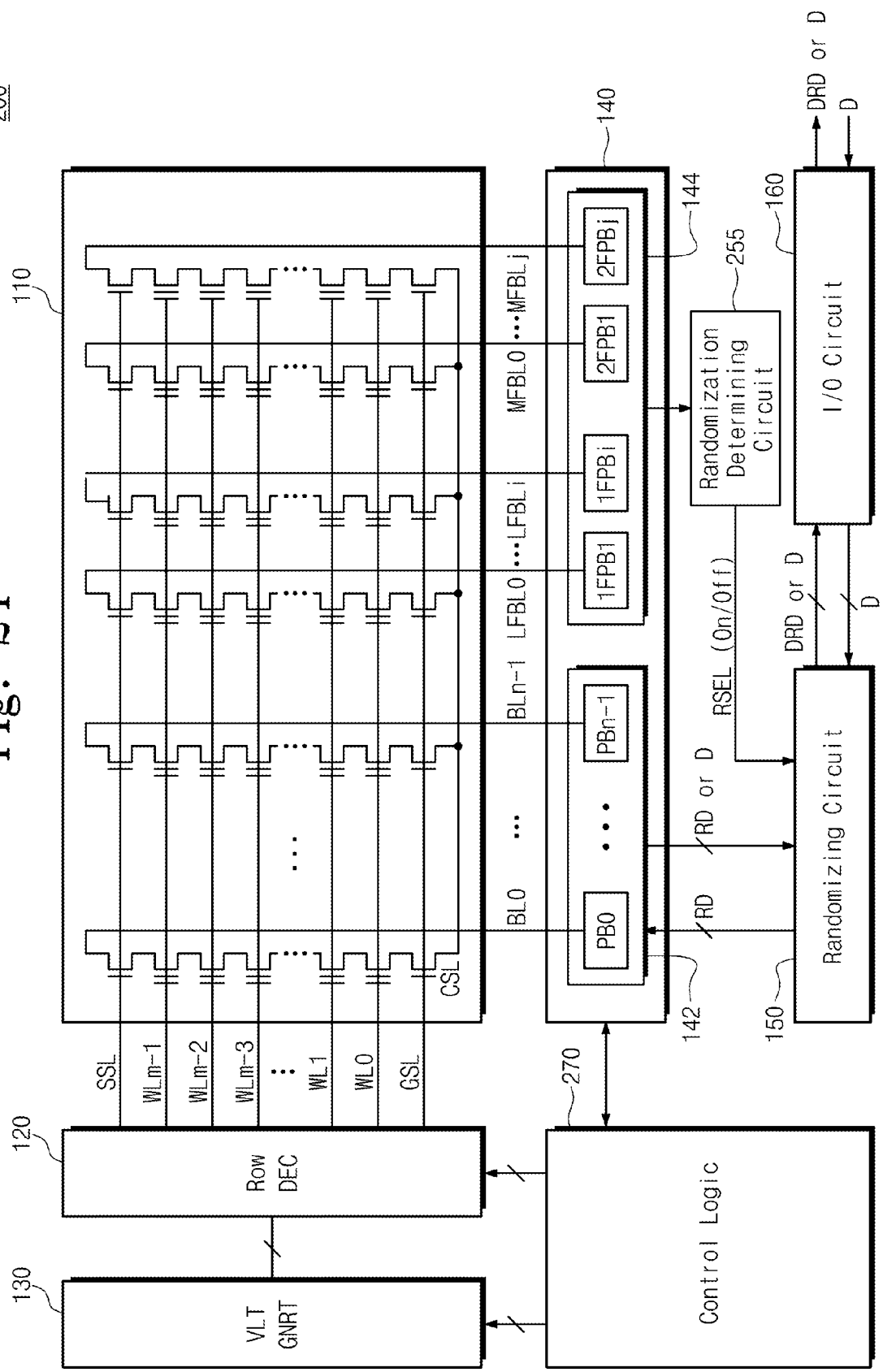
FIGS. 24 and 25 are respective block diagrams illustrating nonvolatile memory devices according to embodiments of the inventive concept.

FIG. 24 is a block diagram illustrating a nonvolatile memory device according to another embodiment of the inventive concept. Referring to FIG. 24, a nonvolatile memory device 200 substantially similar to the nonvolatile memory device 100 described in relation to FIG. 1, except a randomization determining circuit 255 is provided outside control logic 270. The randomization determining circuit 255 may be used to generate the randomization selection signal RSEL in accordance with the stored value of the first (or LSB) page flag and the second (or MSB) page flag in the first and second flag cell areas 115 and 116. And as described above, the randomization selection signal RSEL may be used to control the operation of the randomizing circuit 150 during read operations.

Up to now certain embodiments of the inventive concept have been described under an assumption that the constituent MLC are 2-bit MLC. Those skilled in the art will understand that MLC storing 3 or more data bits per memory cell might alternately be used.

Figure 25:
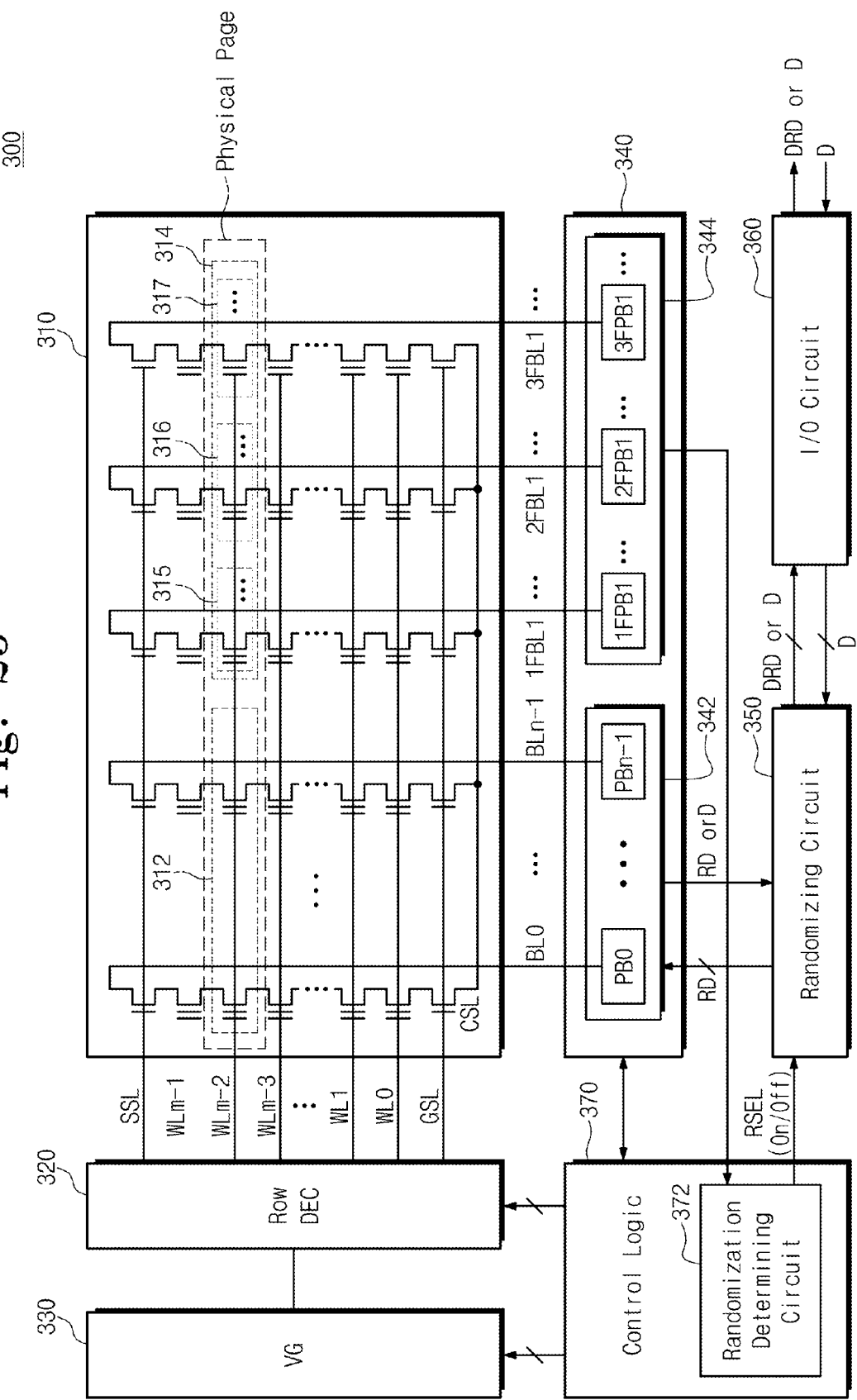

FIG. 25 is a block diagram illustrating a nonvolatile memory device according to another embodiment of the inventive concept. Referring to FIG. 25, a nonvolatile memory device 300 comprises; a memory cell array 310, a row decoder 320, a voltage generator circuit 330, a page buffer circuit 340, a randomizing circuit 350, an input/output circuit 360, and control logic 370.

As described above it is assumed that the embodiment illustrated in FIG. 25 includes a memory cell array 310 having multiple memory blocks respectively including a plurality of physical pages arranged in a main area 312 and a spare area 314. Each physical page is associated with a respective word line and includes a plurality of logical pages. However, the embodiment of FIG. 25 assumes that each physical page includes three (3) logical pages and that the constituent MLC are respectively capable of storing up to 3 data bits. Accordingly, the spare area 314 includes a first flag cell area 315 formed of at least one first flag cell storing information associated with programming of a first page; a second flag cell area 316 formed of at least one second flag cell storing information associated with programming of a second page; and a third flag cell area 317 formed of at least one third flag cell storing information associated with programming of a third page.

As illustrated in FIG. 25, the page buffer circuit 340 includes a main page buffer 342 and a spare page buffer 344. The spare page buffer 344 includes at least one page buffer 1FPB1 (hereinafter, referred to as a first flag cell page buffer) connected with at least one first flag bit line 1FBL1; at least one page buffer 2FPB1 (hereinafter, referred to as a second flag cell page buffer) connected with at least one second flag bit line 2FBL1; and at least one page buffer 3FPB1 (hereinafter, referred to as a third flag cell page buffer) connected with at least one third flag bit line 3FBL1.

A randomization determining circuit 372 according to the embodiment of the inventive concept determines a level of a randomization selection signal RSEL based on data stored in the at least one first flag cell page buffer 1FPB1, the at least one second flag cell page buffer 2FPB1, or the at least one third flag cell page buffer 3FPB1 at an output operation (a first, a second, or a third page read operation). In one embodiment, a high randomization selection signal RSEL will activate operation of the randomizing circuit 350, and a low randomization selection signal RSEL will inactivate operation of the randomizing circuit 350.

Figure 26A:
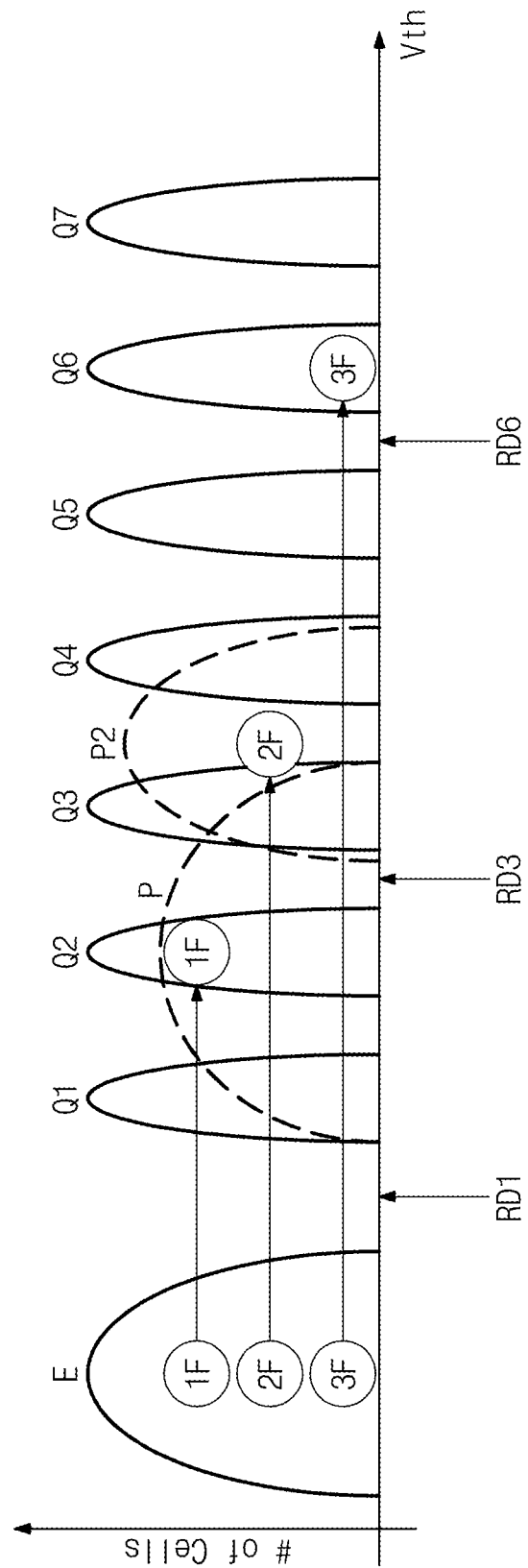
FIGS. 26A and 26B are conceptual diagrams respectively illustrating threshold voltage distributions and page flag states obtained by a program method for the nonvolatile memory device of FIG. 25 according to embodiments of the inventive concept.

FIG. 26A is a diagram illustrating a page program method for the nonvolatile memory device of FIG. 25 according to an embodiment of the inventive concept. Referring to FIG. 26A, upon programming of a third page, threshold voltage states include an erase state E and first to seventh program states Q1 to Q7. In FIG. 26A, dotted lines indicate a first provisional program state P according to first page programming and a second provisional program state P2 according to second page programming, respectively.

A first page flag 1F stores information associated with programming of the first page. The first page flag 1F is programmed to the first provisional program state P at the first page program operation and is program inhibited during the second and third page program operations.

A second page flag 2F stores information associated with programming of the second page. The second page flag 2F is programmed to a second program state P2 during the second page program operation and is program inhibited during the third page program operation.

A third page flag 3F stores information associated with programming of the third page. The third page flag 3F is programmed to a sixth program state P6 during the third page program operation.

Operations for determining the programming of the first, second and third pages will now be described.

Data is read from a first flag cell area 355, a second flag cell area 356, and a third flag cell area 357 using a first flag read voltage RD1 to determine whether the first page is programmed. Whether the first page is programmed may be determined according to this page flag read data.

Data is read from the first flag cell area 355, the second flag cell area 356, and the third flag cell area 357 using a second flag read voltage RD3 to determine whether the second page is programmed. Whether the second page is programmed may be determined according to this page flag read data.

Data is read from the first flag cell area 355, the second flag cell area 356, and the third flag cell area 357 using a third flag read voltage RD6 to determine whether the third page is programmed. Whether the third page is programmed may be determined according to their page flag read data.

Figure 26B:
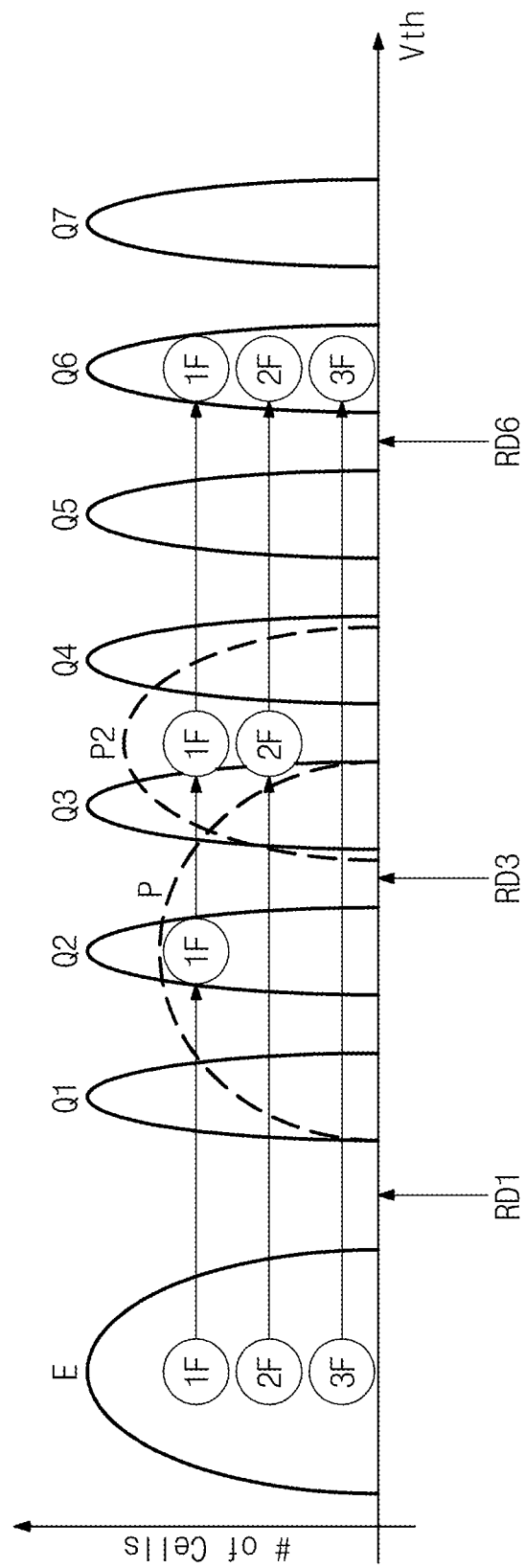

FIG. 26B is a diagram illustrating a page program method for the nonvolatile memory device of FIG. 25 according to an embodiment of the inventive concept. Referring to FIG. 26B, upon programming the third page, the threshold voltage states include an erase state E and first to seventh program states Q1 to Q7. In FIG. 26B, dotted lines indicate a first provisional program state P according to first page programming and a second provisional program state P2 according to second page programming.

A first page flag 1F stores information associated with whether the first page is programmed. The first page flag 1F is programmed to have the first provisional program state P during a first page program operation, to have the second provisional program state P2 during the second page program operation, and to have a sixth program state Q6 during a third page program operation. The threshold voltage of the first provisional program state P is less than that of the second provisional program state P2, and the threshold voltage of the second provisional program state P2 is less than that of the sixth program state Q6.

The second page flag 2F stores information associated with whether the second page is programmed. The second page flag 2F is programmed to have the second provisional program state P2 during the second page program operation and to the sixth program state Q6 during the third page program operation.

The third page flag 3F stores information associated with whether the third page is programmed. The third page flag 3F is programmed to have a sixth program state Q6 during the third page program operation.

As may be understood from the above description, at an upper page program operation performed under the condition that a low bit page is programmed, a lower bit page flag indicating programming of a lower bit is programmed so as to have the same program state as an upper bit page flag indicating programming of an upper bit.

For example, during a second page program operation performed under the condition that the first page is programmed, a first flag 1F indicating programming of a first page is programmed so as to have the same program state as a second flag 2F indicating programming of a second page. During a third page program operation performed under the condition that the first page is programmed, the first flag 1F indicating programming of the first page is programmed so as to have the same program state as a third flag 3F indicating programming of a third page. During a third page program operation performed under the condition that the second page is programmed, the second flag 2F indicating programming of the second page is programmed so as to have the same program state as the third flag 3F indicating programming of the third page.

Operations that determine the programming of the first to third pages may be as follows.

Data is read from a first flag cell area 355, a second flag cell area 356, and a third flag cell area 357 using a first flag read voltage RD1 to determine whether the first page is programmed. Data is read from the first flag cell area 355, the second flag cell area 356, and the third flag cell area 357 using a second flag read voltage RD3 to determine whether the second page is programmed. Data is read from the first flag cell area 355, the second flag cell area 356, and the third flag cell area 357 using a third flag read voltage RD6 to determine whether a third page is programmed. Thus, whether the first, second or third page is programmed may be determined in accordance with page flag read data.

FIG. 27A is a table illustrating one possible set of page flag states that may be used to control activation/inactivation of the randomization selection signal according to an embodiment of the inventive concept.

When the first, second, and third page flags 1F, 2F, and 3F have an erase state E, the randomization selection signal RSEL will be turned OFF during the first, second and third page read operations. When the first page flag 1F has the first provisional program state P and the second and third page flags 2F and 3F have an erase state E, the randomization selection signal RSEL will be turned ON during the first page read operation and turned OFF during the second and third page read operations. When the first page flag 1F has the first provisional program state P, the second page flag 2F has the second provisional program state P2, and the third page flag 3F has the erase state E, the randomization selection signal RSEL will be turned ON during the first and second page read operations and turned OFF during the third page read operation. When the first page flag 1F and the third page flag 1F have an erase state E and the second page flag 2F has the second provisional program state P2, the randomization selection signal RSEL will be turned OFF during the first and third page read operations and turned ON during the second page read operation. When the first page flag 1F has the erase state E, the second page flag 2F has the second provisional program state P2, and the third page flag 3F has the sixth program state Q6, the randomization selection signal RSEL is turned OFF during the first page read operation and is turned ON during the second and third page read operations. When the first page flag 1F and the second page flag 2F have the erase state E and the third page flag 3F has the sixth program state Q6, the randomization selection signal RSEL is turned OFF during the first and second page read operations and turned ON during the third page read operation. When the first page flag 1F has the first provisional page state P, the second page flag 2F has an erase state E, and the third page flag 3F has the sixth program state Q6, the randomization selection signal RSEL is turned ON during the first and third page read operations and turned OFF during the second page read operation. Finally, when the first page flag 1F has the first provisional page state P, the second page flag 2F has the second provisional page stat P2, and the third page flag 3F has the sixth program state Q6, the randomization selection signal RSEL is turned ON during the first, second and third page read operations.

FIG. 27B is a table illustrating another possible set of page flag states that may be used to control activation/inactivation of the randomization selection signal according to an embodiment of the inventive concept.

When the first, second, and third page flags 1F, 2F, and 3F have an erase state E, the randomization selection signal RSEL will be turned OFF during the first, second and third page read operations. When the first page flag 1F has the first provisional program state P and the second and third page flags 2F and 3F have an erase state E, the randomization selection signal RSEL will be turned ON during the first page read operation and turned OFF during the second and third page read operations. When the first page flag 1F and the second page flag F2 have the second provisional program state P2 and the third page flag 3F has the erase state E, the randomization selection signal RSEL will be turned ON during the first and second page read operations and turned OFF during the third page read operation. When the first page flag 1F and the third page flag 1F have an erase state E and the second page flag 2F has the second provisional program state P2, the randomization selection signal RSEL will be turned OFF during the first and third page read operations and turned ON during the second page read operation. When the first page flag 1F has the erase state E, the second page flag 2F and the third page flag 3F have the sixth program state Q6, the randomization selection signal RSEL is turned OFF during the first page read operation and is turned ON during the second and third page read operations. When the first page flag 1F and the second page flag 2F have the erase state E and the third page flag 3F has the sixth program state Q6, the randomization selection signal RSEL is turned OFF during the first and second page read operations and turned ON during the third page read operation. When the first page flag 1F has the sixth program state Q6, the second page flag 2F has an erase state E, and the third page flag 3F has the sixth program state Q6, the randomization selection signal RSEL is turned ON during the first and third page read operations and turned OFF during the second page read operation. Finally, when the first page flag 1F, the second page flag 2F, and the third page flag 3F have the sixth program state Q6, the randomization selection signal RSEL is turned ON during the first, second and third page read operations.

So far, certain embodiments of the inventive concept have been described under an assumption that the constituent memory cell array is a 2D or horizontal memory cell array. However, other embodiments of the inventive concept incorporate a 3D or vertical memory cell array.

Figure 28:
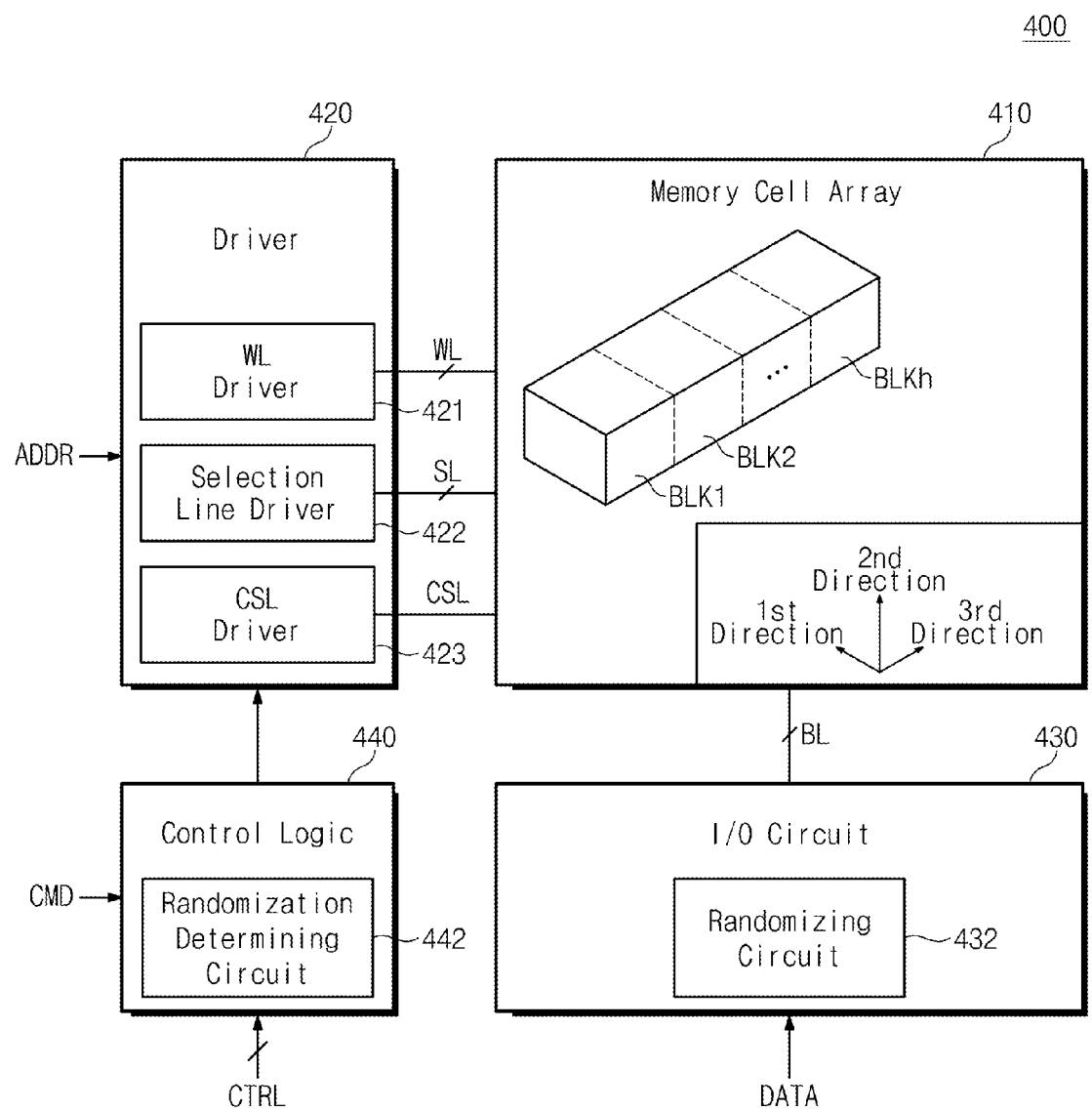
FIG. 28 is a block diagram illustrating the possible incorporation of a three-dimensional (3D) or vertical memory cell array within certain embodiments of the inventive concept.

FIG. 28 is a conceptual block diagram illustrating a nonvolatile memory device according to another embodiment of the inventive concept. Referring to FIG. 28, a nonvolatile memory device 400 comprises; a memory cell array 410, a driver 420, an input/output (I/O) circuit 430, and control logic 440.

The memory cell array 410 includes a plurality of memory blocks BLK1 to BLKh, each of which includes a plurality of memory cells. Each of the memory blocks BLK1 to BLKh has a vertical structure.

In the illustrated embodiment of FIG. 28, each of the memory blocks BLK1 to BLKh includes structures extending along first to third directions. Each of the memory blocks BLK1 to BLKh includes a plurality of vertical strings NS extending along the second direction. Each of the memory blocks BLK1 to BLKh includes a plurality of vertical strings NS extending along the first and third directions.

Each of the vertical strings NS is connected to one bit line BL, at least one string selection line SSL, at least one ground selection line GSL, word lines WL, and a common source line CSL. That is, each of the memory blocks BLK1 to BLKh is connected to a plurality of bit lines BL, a plurality of string selection lines SSL, a plurality of ground selection lines GSL, a plurality of word lines WL, and a plurality of common source lines CSL.

The driver 420 is connected to the memory cell array 410 via a plurality of word lines WL. The driver 420 is configured to operate responsive to the control of the control logic 440. The driver 420 receives an address ADDR from an external device.

The driver 420 is configured to decode the input address ADDR. Using the decoded address, the driver 420 selects one of the plurality of word lines WL. The driver 420 is configured to apply voltages to selected and unselected word lines. In this embodiment, at a program operation, a read operation, or an erase operation, the driver 420 supplies word lines WL with a program voltage related to the program operation, a read voltage related to the read operation, or an erase voltage related to the erase operation. In the illustrated embodiment of FIG. 28, the driver 420 includes a word line driver 421 of selecting and driving word lines.

Further, the driver 420 is configured to select and drive a plurality of selection lines SL. In the illustrated embodiment, the driver 420 is configured to further select and drive a string selection line SSL and a ground selection line GSL, and includes a selection line driver 422 configured to select and drive selection lines.

Further, the driver 420 is configured to drive a common source line CSL, and includes a common source line driver 423 configured to drive the common source line CSL.

The I/O circuit 430 is connected to the memory cell array 410 via a plurality of bit lines BL and operates in response to the control of the control logic 440. The I/O circuit 430 is configured to select a plurality of bit lines BL.

In the illustrated embodiment, the I/O circuit 430 randomizes write data (DATA) received from an external device as it is stored in the memory cell array 410. The I/O circuit 430 also selectively de-randomizes or bypasses read data retrieved from the memory cell array 410 before it is transferred to the external device. The I/O circuit 430 may also be used to read data from the first storage region of the memory cell array 410 to store it in a second storage region thereof. In the illustrated embodiment, the I/O circuit 430 is configured to perform a copy-back operation.

In the embodiment of FIG. 28, the I/O circuit 430 may include such conventionally understood components such as a page buffer or page register, a column selector circuit, a data buffer, and the like, as well as a randomizing circuit 432. The randomizing circuit 432 may be substantially similar with the randomizing circuit 150 of FIG. 1. Alternately, the I/O circuit 430 may include a sense amplifier, a write driver, a column selector circuit, a data buffer, and the like.

The control logic 440 is configured to control the overall operation of the nonvolatile memory device 400. The control logic 440 operates responsive to control signals CTRL transferred from the external device. The control logic 440 of FIG. 28 includes a randomization determining circuit 442 which determines the activation/inactivation of the randomizing circuit 432 in accordance with the data stored in flag cells (not shown) of the memory cell array 410.

The vertical memory cell array 410 of FIG. 1 may be variously implemented. One example of a semiconductor memory device including a vertical memory cell array is described in published U.S. Patent Application No. 2010/0315875, the subject matter of which is hereby incorporated by reference.

Figure 29:
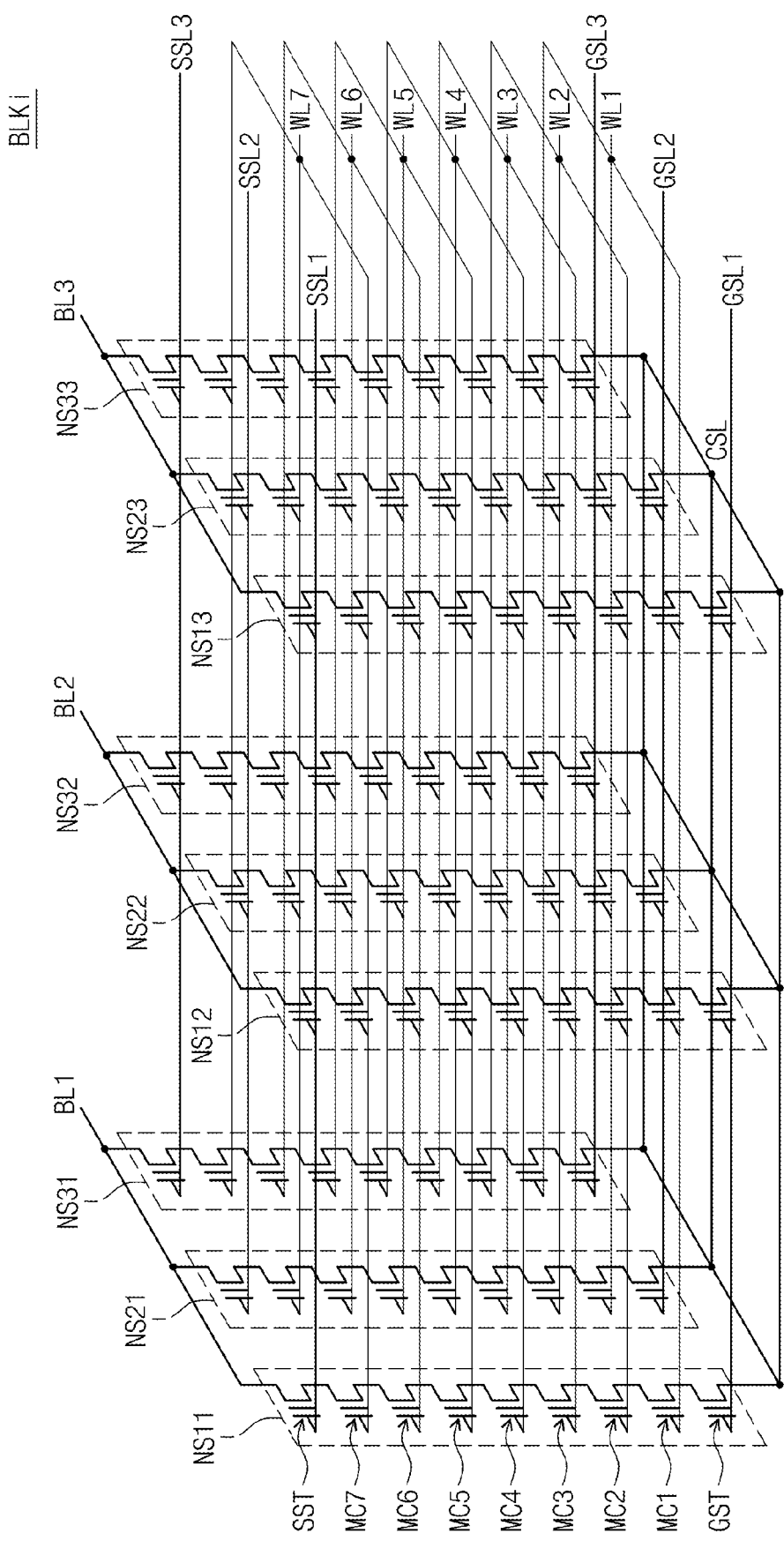
FIG. 29 is a partial circuit diagram further illustrating the vertical memory cell array of FIG. 28.

FIG. 29 is a circuit diagram showing an equivalent circuit for one memory block among the plurality of memory blocks in the memory cell array 410 of the semiconductor device 400 of FIG. 28. Referring to FIGS. 28 and 29, vertical strings NS11 to NS31 exist between a first bit line BL1 and a common source line CSL. The first bit line BL1 corresponds to a conductive material extending in a third direction. Vertical strings NS12 to NS32 exist between a second bit line BL2 and the common source line CSL. The second bit line BL2 corresponds to a conductive material extending in the third direction. Vertical strings NS13 to NS33 exist between a third bit line BL3 and the common source line CSL. The third bit line BL3 corresponds to a conductive material extending in the third direction.

A string selection transistor SST in each vertical string NS is connected to a corresponding bit line BL. A ground selection transistor GST in each vertical string NS is connected to a common source line CSL. Memory cells MC exist between the string selection transistor SST and the ground selection transistor GST in each vertical string NS.

Below, vertical strings NS are defined by a row unit and a column unit. Vertical strings NS connected in common to one bit line form a column. In this embodiment, vertical strings NS11 to NS31 connected in common to a first bit line BL1 corresponds to a first column. Vertical strings NS12 to NS32 connected in common to a second bit line BL2 corresponds to a second column. Vertical strings NS13 to NS33 connected in common to a third bit line BL3 corresponds to a third column.

Vertical strings NS connected with one string selection line SSL form one row. In the illustrated embodiment of FIG. 29, vertical strings NS11 to NS13 connected with a first string selection line SSL1 form a first row. Vertical strings NS21 to NS23 connected with a second string selection line SSL2 form a second row. Vertical strings NS31 to NS33 connected with a third string selection line SSL3 form a third row.

In each vertical string NS, particular heights may be arbitrarily defined. In the illustrated embodiment, for example, each vertical string has a height of a memory cell adjacent to a ground selection transistor GST of 1. In each vertical string NS, a height of a memory cell increases in inverse proportion to a distance from a string selection transistor SST. In each vertical string, the height of a memory cell adjacent to the string selection transistor SST is 7, for example.

Vertical strings NS in the same row share a string selection line SSL. Vertical strings NS in different rows are connected with different string selection lines SSL. In vertical strings of the same row, memory cells of the same height share a word line. At the same height, word lines WL of vertical strings NS of different rows are connected in common. In the illustrated embodiment, word lines WL may be connected in common at a layer where conductive materials extending in a first direction are provided. In this embodiment, the conductive materials extending in the first direction may be connected with an upper layer via a contact. Conductive materials extending in the first direction at the upper layer may be connected in common.

Vertical strings NS in the same row share a ground selection line GSL. Vertical strings NS of different rows are connected with different ground selection lines GSL.

A common source line CSL is connected in common with vertical strings NS. In the illustrated embodiment, at an active region of a substrate, first through fourth doping regions are connected, and the first through fourth doping regions are connected with an upper layer via a contact. The first to fourth doping regions are connected in common at the upper layer.

As illustrated in FIG. 29, word lines WL of the same depth are connected in common. When a specific word line WL is selected, all vertical strings NS connected with the specific word line WL are selected. Vertical strings NS of different rows are connected with different string selection lines SSL. Accordingly, by selecting string selection lines SSL1 to SSL3, vertical strings of an unselected row among vertical strings NS connected with the same word line WL are separated from bit lines BL1 to BL3. This means that a row of vertical strings NS is selected by selecting string selection lines SSL1 to SSL3. Vertical strings NS of a selected row are selected by a column unit by selecting the bit lines BL1 to BL3.

The example memory block BLKi shown in FIG. 29 may be further understood by considering the disclosure of published U.S. Patent Application No. 2010/0315875, the subject matter of which is hereby incorporated by reference.

Figure 30:
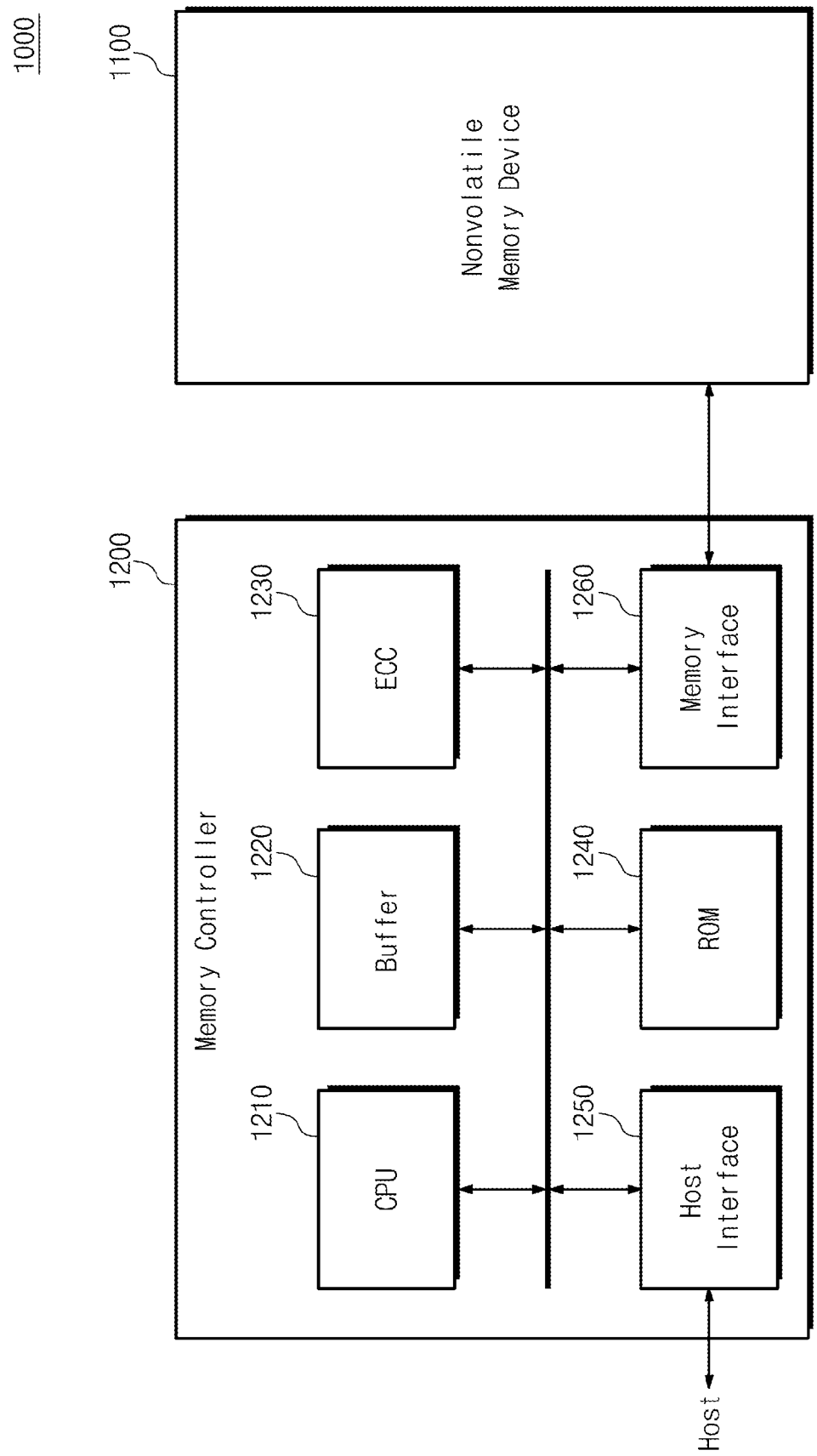
FIGS. 30 through 37 are bock diagrams respectively illustrating certain memory systems that incorporate one or more nonvolatile memory devices according to an embodiment of the inventive concept.

FIG. 30 is a block diagram illustrating a memory system according to an embodiment of the inventive concept. Referring to FIG. 30, a memory system 1000 comprises a nonvolatile memory device 1100 and a memory controller 1200.

The nonvolatile memory device 1100 may be implemented in accordance with an embodiment of the inventive concept, such as nonvolatile memory device 100 of FIG. 1. During a program operation, the nonvolatile memory device 1100 randomizes received write data before storing it. During a read operation, the nonvolatile memory device 1100 selectively de-randomizes randomized data or bypasses un-randomized data.

The memory controller 1200 comprises a Central Processing Unit (CPU) 1210, a buffer 1220, an Error Correction Circuit (ECC) 1230, a Read-Only Memory (ROM) 1240, a host interface 1250, and a memory interface 1260. The constituent elements of the memory controller 1200 are conventionally understood and description thereof will be omitted.

The memory system 1000 according to an exemplary embodiment of the inventive concept is configured to perform a program operation via data randomization. This means that the reliability of subsequently performed read operations may be improved. Further, the memory system 1000 according to an embodiments of the inventive concept is configured to perform a read operation based on page flag data indicating whether a particular program operation has been performed.

As a result, erroneously performed read operation may be avoided. One example of a memory system consistent with the foregoing is described in published U.S. Patent Application No. 2010/0082890, the subject matter of which is hereby incorporated by reference.

Figure 31:
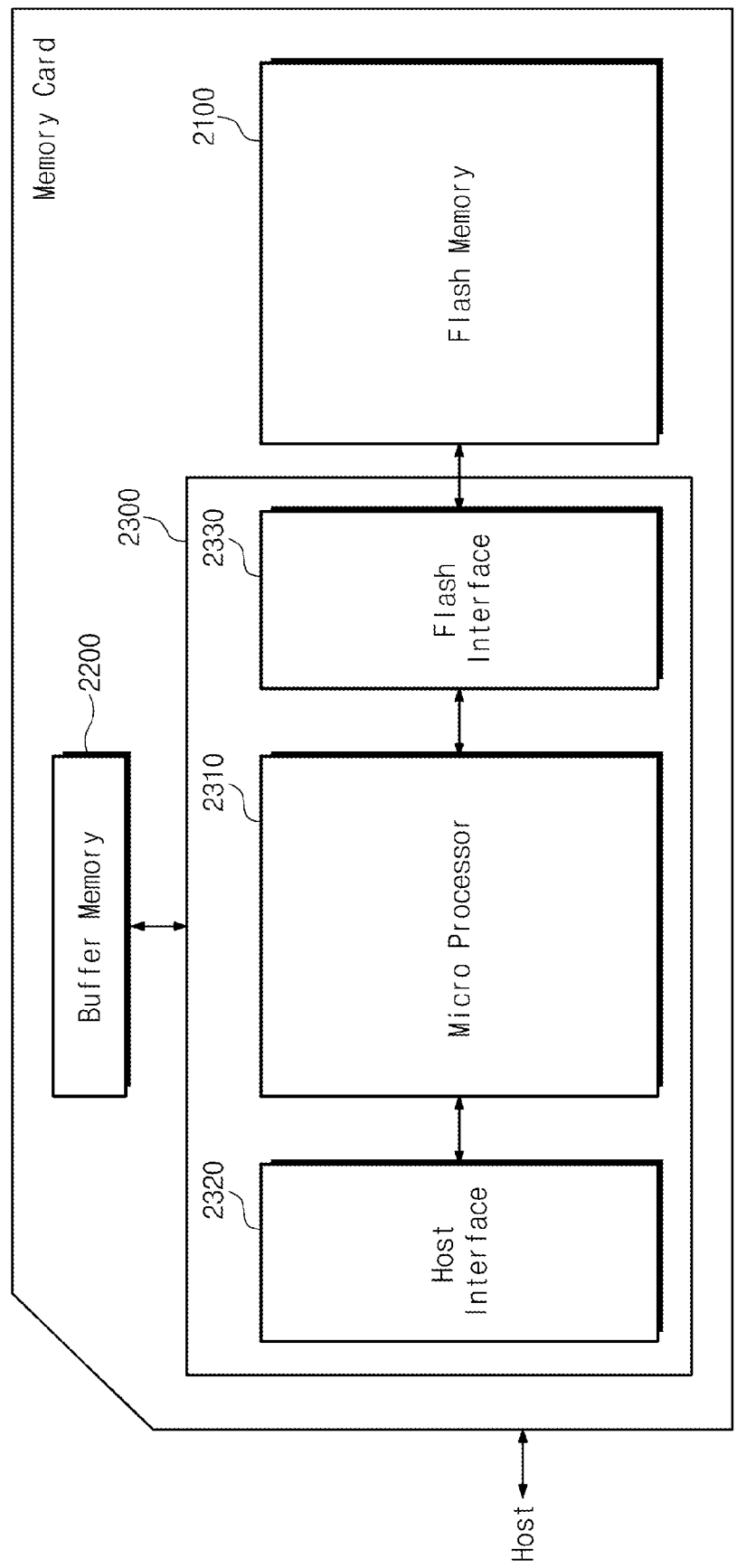

FIG. 31 is a block diagram of a memory card according to an embodiment of the inventive concept. Referring to FIG. 31, a memory card 2000 comprises; a flash memory 2100, a buffer memory 2200, and a memory controller 2300 for controlling the flash memory 2100 and the buffer memory 2200.

The flash memory 2100 may be implemented in accordance with an embodiment of the inventive concept, such as nonvolatile memory device 100 of FIG. 1.

The buffer memory device 2200 may be used to temporarily store data generated during operation of the memory card 2000. The buffer memory device 2200 may be implemented using a DRAM or an SRAM.

The memory controller 2300 is connected between a host and the flash memory 2100. The memory controller 2300 is configured to access the flash memory 2100 in response to a request from the host. The memory controller 2300 includes a microprocessor 2310, a host interface 2320, and a flash interface 2330. The microprocessor 2310 is configured to drive firmware. The host interface 2320 interfaces with the host via a card (e.g., MMC) protocol for data exchanges between the host and the memory interface 2330.

The memory card 2000 may be implemented to form one of a Multimedia Card (MMC), a Security Digital (SD), mini-SD, memory stick, smart media, trans-flash cards, etc.

The memory card 2000 according to an embodiment of the inventive concept reduces the likelihood of program disturbances caused by the programming of memory cells connected to an adjacent word line by storing randomized data during each program operation. Accordingly, the memory card 2000 provides highly reliability data access. The memory card 2000 may be configured similarly to the memory cards disclosed in published U.S. Patent Application No. 2010/0306583, the subject matter of which is hereby incorporated by reference.

Figure 32:
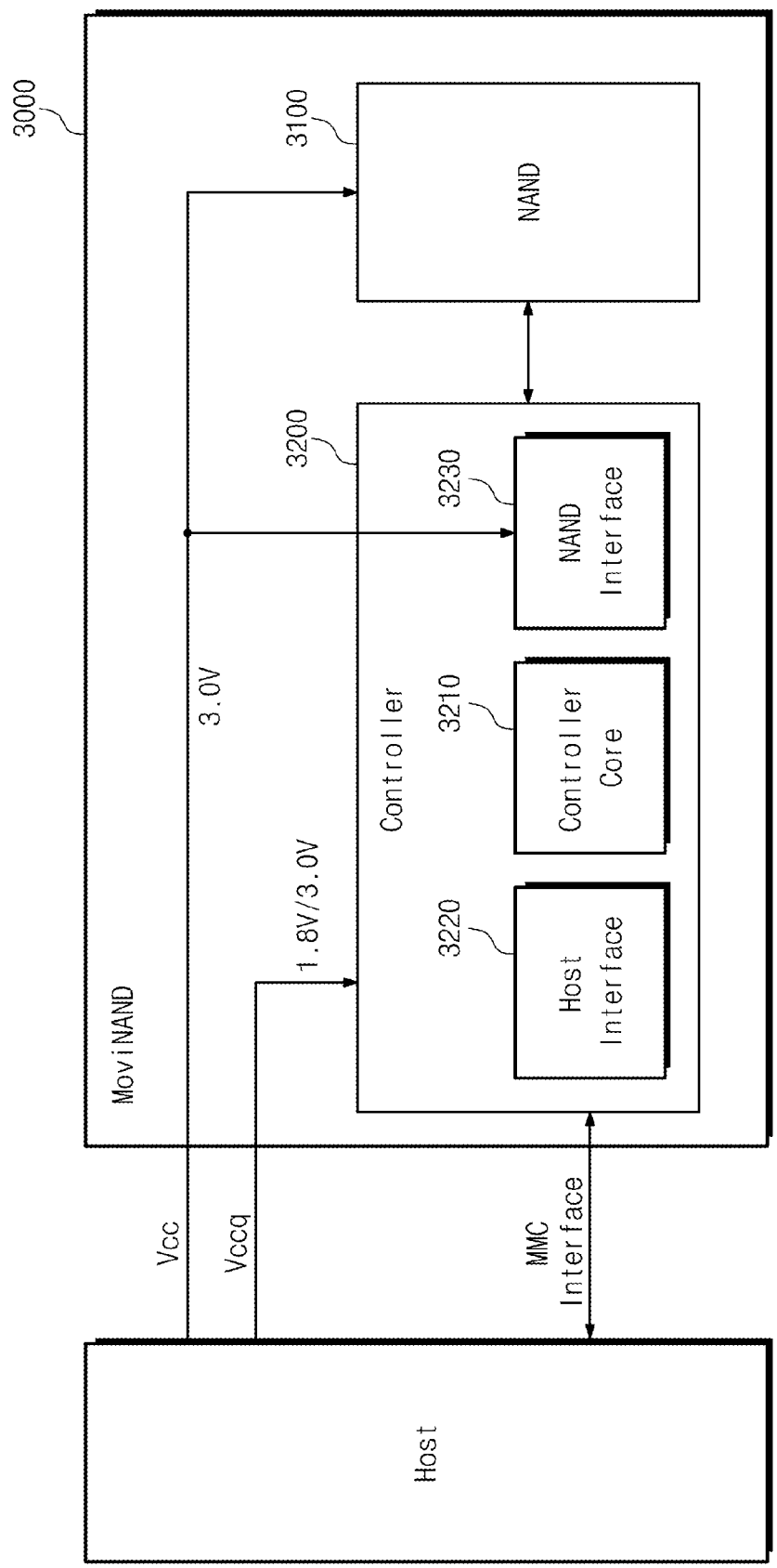

FIG. 32 is a block diagram of a moviNAND according to an embodiment of the inventive concept. Referring to FIG. 32, a moviNAND device 3000 comprises a NAND flash memory device 3100 and a controller 3200. The moviNAND device 300 may support, for example, the MMC 4.4 (or eMMC) standard.

The NAND flash memory device 3100 may be formed by a stack of unitary NAND flash memories in a package (e.g., Fine-pitch Ball Grid Array (FBGA)). The unitary NAND flash memory device is configured the same as a nonvolatile memory device 100 in FIG. 1.

The controller 3200 comprises a controller core 3210, a host interface 3220, and a NAND interface 3230. The controller core 3210 may control an overall operation of the moviNAND device 3000. The host interface 3220 is configured to perform an MMC interface between the controller 3210 and a host. The NAND interface 3230 is configured to interface between the NAND flash memory device 3100 and the controller 3200.

The moviNAND device 3000 receives at least one power supply voltage (e.g., Vcc and Vccq) from the host. The power supply voltage Vcc may be about 3.3V and is supplied to the NAND flash memory device 3100 and the NAND interface 3230, while the power supply voltage Vccq may be about 1.8V or 3.3V and is supplied to the controller 3200.

The moviNAND device 3000 according to the illustrated embodiment of the inventive concept reduces the frequency of read errors by performing a read operation in accordance with page flag information indicating whether a particular page of data has been programmed during a read operation. The moviNAND 3000 may be advantageously used to store bulk (or payload) data, as it exhibits improved read operation characteristic. For example, the moviNAND 3000 may be incorporated into small, low-power mobile products, such as the Galaxy S® or iPhone®.

Figure 33:
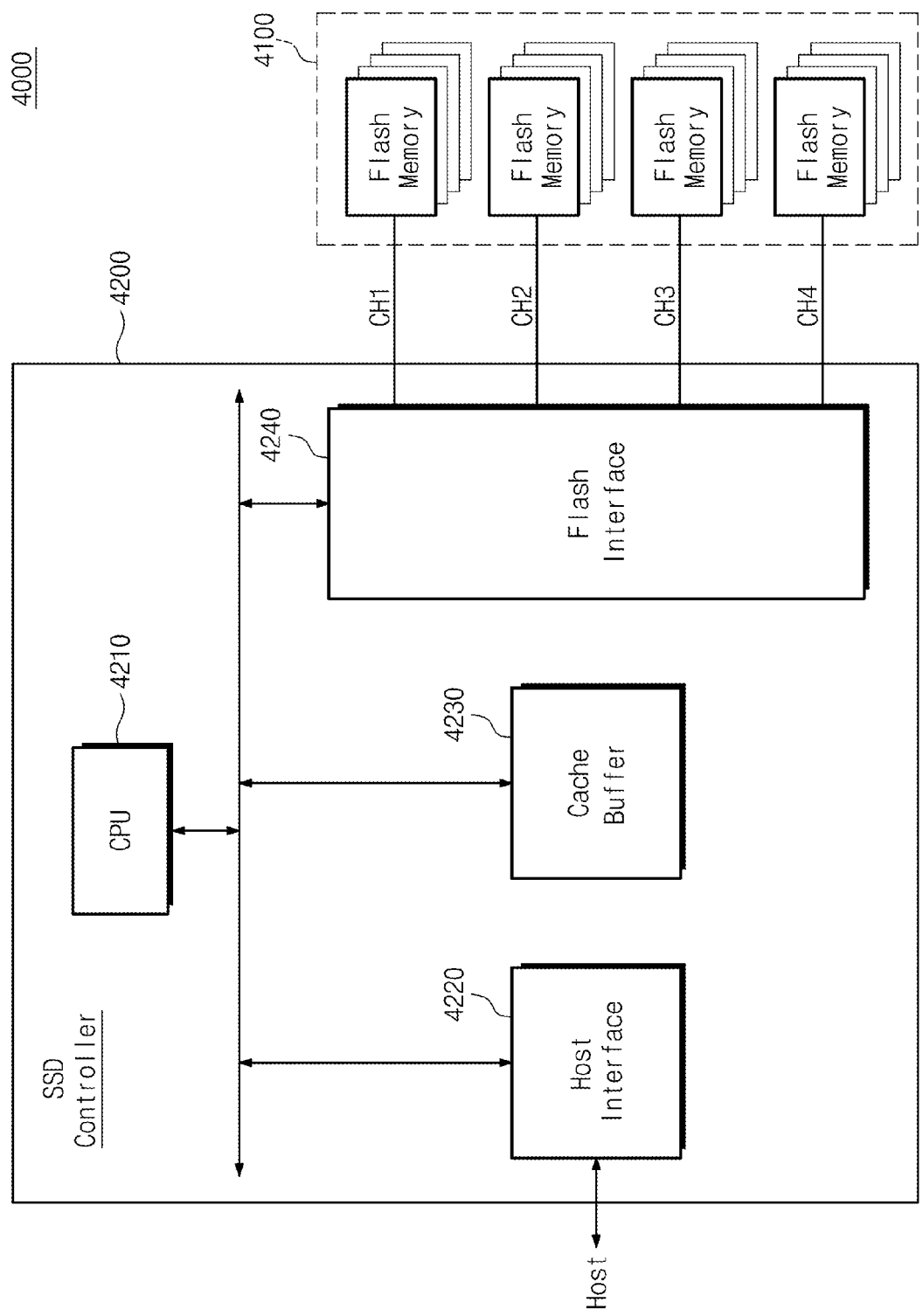

Semiconductor memory devices designed and operated in accordance with the inventive concept may be incorporated into a solid state drive (SSD). FIG. 33 is a block diagram of an SSD according to an embodiment of the inventive concept. Referring to FIG. 33, an SSD 4000 comprises a plurality of flash memory devices 4100 and an SSD controller 4200.

Each of the flash memory devices 4100 may be implemented like the nonvolatile memory device 100 of FIG. 1.

The SSD controller 4200 controls the plurality of flash memory devices 4100, and comprises; a CPU 4210, a host interface 4220, a cache buffer 4230, and a flash interface 4240.

Under the control of the CPU 4210, the host interface 4220 exchanges data with a host through ATA protocol. The host interface 4220 may be one of a Serial Advanced Technology Attachment (SATA) interface, a Parallel Advanced Technology Attachment (PATA) interface, and an External SATA (ESATA) interface. Data received from or transmitted or to the host through the host interface 4220 is delivered through the cache buffer 4230 without passing through a CPU bus, under the control of the CPU 4210.

The cache buffer 4230 temporarily stores data transferred between an external device and the flash memory devices 4100. The cache buffer 4230 is also used to store programs to be executed by the CPU 4210. The cache buffer 4230 may be regarded as a kind of buffer memory, and is implemented using an SRAM. In certain embodiments, the cache buffer 4230 in FIG. 33 may be included within the SSD controller 4200.

The flash interface 4240 may be configured as an interface between the SSD controller 4200 and the flash memory devices 4100 that are used as storage devices. The flash interface 4240 may be configured with NAND flash memories, One-NAND® flash memories, multi-level flash memories, or single-level flash memories.

The SSD 4000 according to the illustrated embodiment of the inventive concept improves the reliability of data by storing randomized data during program operations. Accordingly, the reliability of read data obtained during subsequent read operations may be improved. One possible example of the SSD 4000 may be found in published U.S. Patent Publication No. 2010/0082890, the subject matter of which is hereby incorporated by reference.

Figure 34:
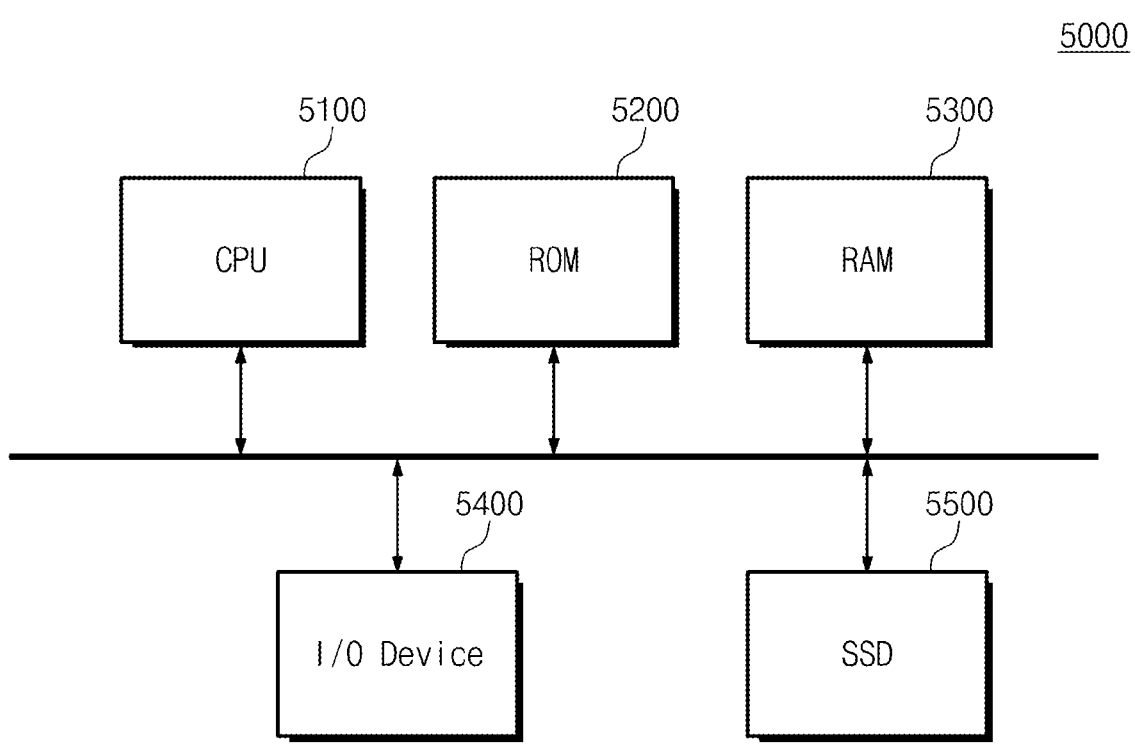

FIG. 34 is a block diagram of a computational system 5000 incorporating a SSD 5500 according to an embodiment of the inventive concept. Referring to FIG. 34, the computational system 5000 comprises; a CPU 5100, a ROM 5200, a RAM 5300, an input/output (I/O) device 5400, and an SSD 5500.

The CPU 5100 is connected to a system bus. The ROM 5200 stores data used to drive the computing system 5000. Herein, the data may include a start command sequence or a basic I/O system (BIOS) sequence. The RAM 5300 temporarily stores data generated during the execution of the CPU 5100.

The I/O device 5400 is connected to the system bus through an I/O device interface such as keyboards, pointing devices (e.g., mouse), monitors, modems, and the like.

The SSD 5500 may be a readable storage device and may be implemented like the SSD 4000 of FIG. 33.

Figure 35:
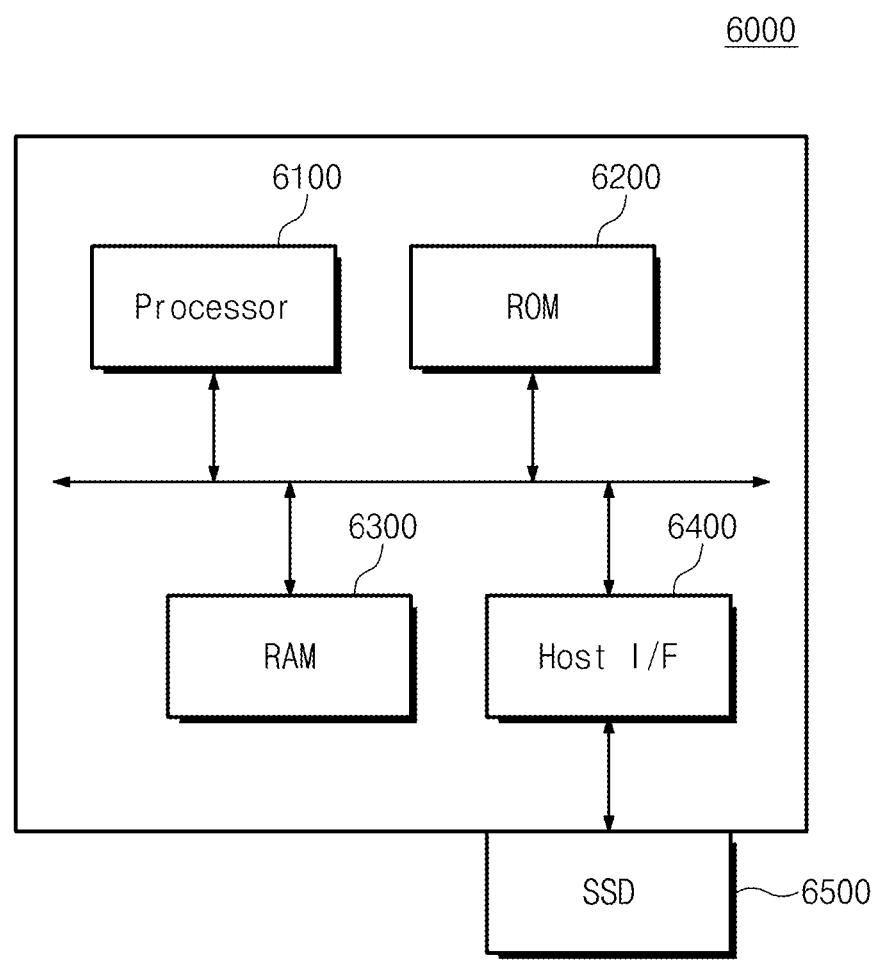

FIG. 35 is a block diagram of an electronic device incorporating an SSD according to an embodiment of the inventive concept. Referring to FIG. 35, an electronic device 6000 comprises; a processor 6100, a ROM 6200, a RAM 6300, a flash interface 6400, and an SSD 6500.

The processor 6100 accesses the RAM 6300 to execute firmware and programming code. Also, the processor 6100 accesses the ROM 6200 to execute fixed command sequences such as a start command sequence and a basic I/O system (BIOS) sequence. The flash interface 6400 may be configured as an interface between the electronic device 6000 and the SSD 6500.

The SSD 6500 is attachable/detachable to/from the electronic device 6000. The SSD 6500 may be implemented like the SSD 4000 of FIG. 33.

The electronic device 6000 may include cellular phones, personal digital assistants (PDAs), digital cameras, camcorders, portable audio players (e.g., MP3), and portable media players (PMPs).

Figure 36:
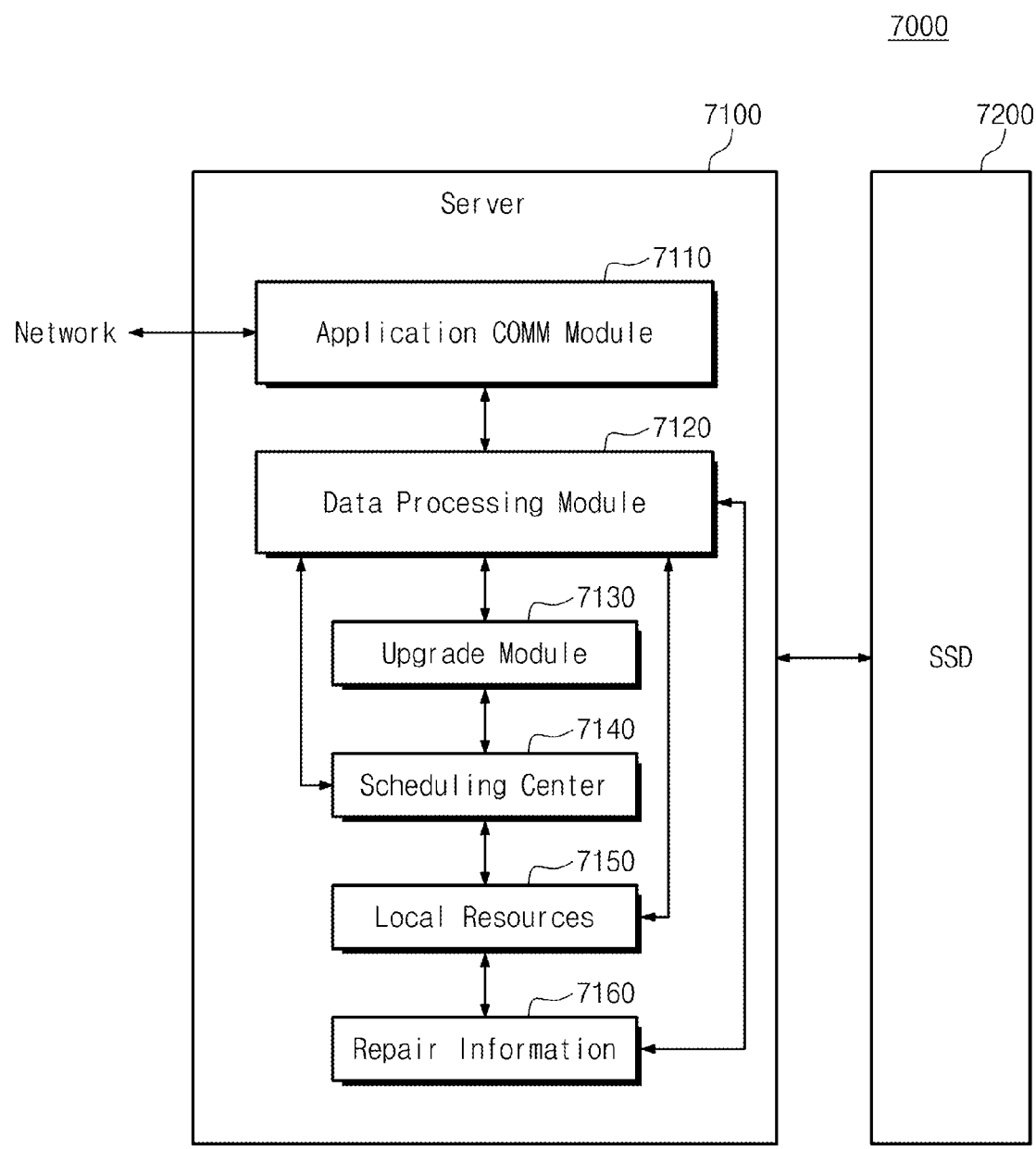

FIG. 36 is a block diagram of a server system including an SSD according to an embodiment of the inventive concept. Referring to FIG. 36, a server system 7000 comprises; a server 7100 and an SSD 7200 that stores data used by the server 7100. The SSD 7200 may be configured like the SSD 4000 of FIG. 33.

The server 7100 includes an application communication module 7110, a data processing module 7120, an upgrade module 7130, a scheduling center 7140, a local resource module 7150, and a repair information module 7160.

The application communication module 7110 is configured to communicate with a computing system connected to a network and the server 7100, or to allow the server 7100 to communicate with the SSD 7200. The application communication module 7110 may transmit data or information, provided through a user interface, to the data processing module 7120.

The data processing module 7120 may be linked to the local resource module 7150. The local resource module 7150 may, for example, provide a list of repair shops, dealers and technical information to a user on the basis of information or data inputted to the server 7100.

The upgrade module 7130 interfaces with the data processing module 7120. Based on information or data received from the SSD 7200, the upgrade module 7130 may perform upgrades of a firmware, a reset code, a diagnosis system, or other information on electronic appliances.

The scheduling center 7140 provides real-time options to the user based on the information or data inputted to the server 7100.

The repair information module 7160 interfaces with the data processing module 7120. The repair information module 7160 is used to provide repair-related information (e.g., audio, video or document files) to the user. The data processing module 7120 may package information related to the information received from the SSD 7200. The packaged information may be transmitted to the SSD 7200 or may be displayed to the user.

Nonvolatile memory according to an embodiment of the inventive concept may be incorporated into tablet products such as the Galaxy Tab® and the iPad®.

Figure 37:
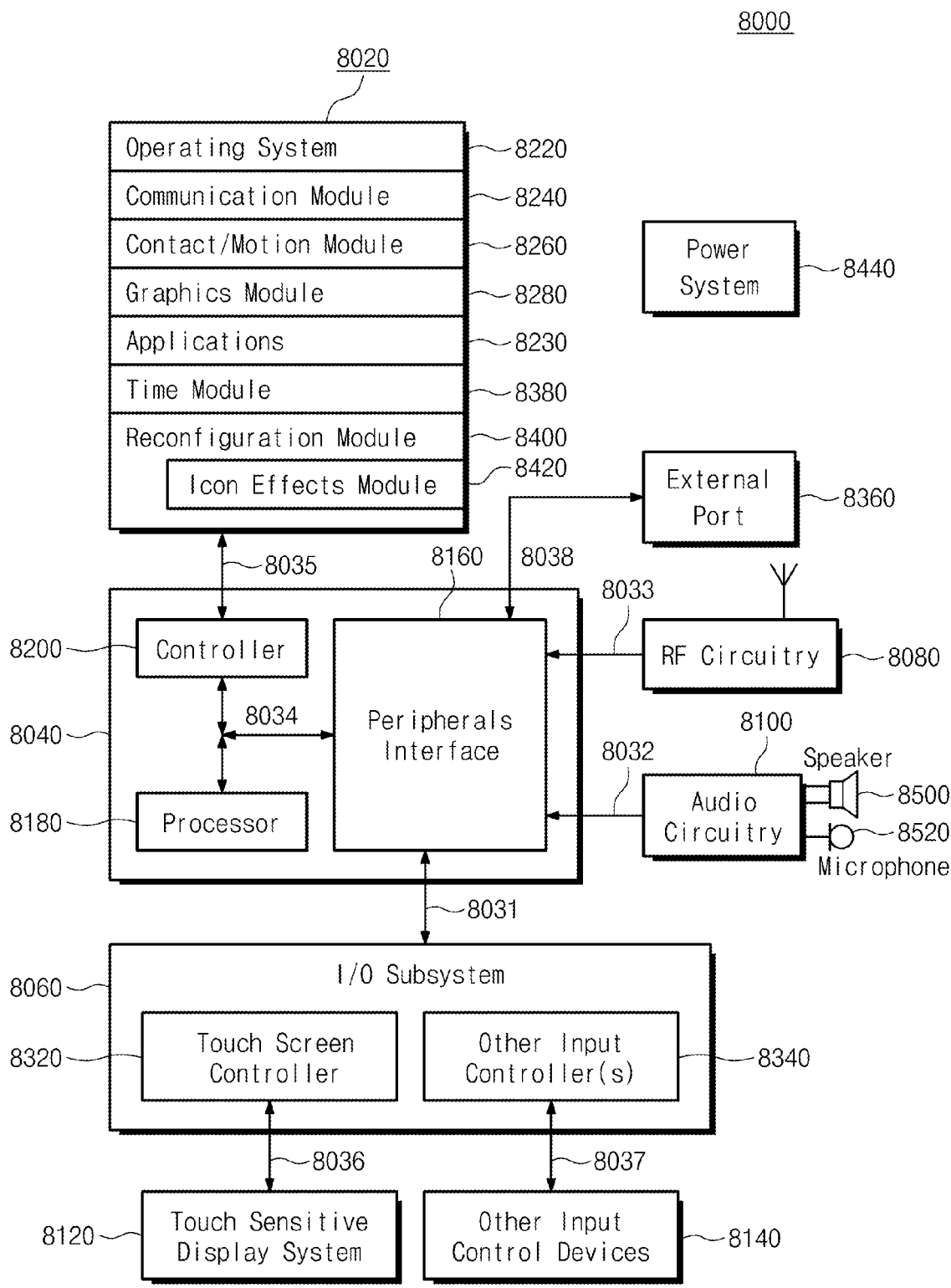

FIG. 37 is a diagram illustrating a handheld electronic device according to an embodiment of the inventive concept. Referring to FIG. 37, a handheld electronic device 8000 comprises at least one computer-readable media 8020, a processing system 8040, an input/output subsystem 8060, a radio frequency circuit 8080, and an audio circuit 8100. Respective constituent elements can be interconnected by at least one communication bus or a signal line 8030.

The handheld electronic device 8000 may be any handheld electronic devices including an unlimited handheld computer, a tablet computer, a mobile phone, a media player, a PDA, and a combination of at least two items thereof. The at least one computer-readable media 8020 may include a non-volatile memory device like according to an embodiment of the inventive concept. One example of handheld electronic device 8000 may be understood from U.S. Pat. No. 7,509,588, the subject matter of which is hereby incorporated by reference.

A memory system or a storage device according to various embodiments of the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method programming multi-bit data to multi-level non-volatile memory cells (MLC) in a memory cell array, the method comprising:
    programming a first page of data to the MLC;
    programming a first page flag to an initial first flag state in response to the programming of the first page;
    programming a second page of data to the MLC;
    in response to programming the second page, determining whether the first page has been programmed; and
    if the first page has been programmed, programming the first page flag to a final first flag state different from the initial first flag state in response to programming of the second page, and
    if the first page has not been programmed, inhibiting programming of the first page flag during programming of the second page.

2. The method of claim 1, wherein MLC are connected to a common word line of the memory cell array, and the initial first flag state is a provisional state for the MLC.

3. The method of claim 2, further comprising:
    in response to programing the second page, programming a second page flag, wherein the MLC are arranged in a main area of the memory cell array, the first page flag and the second page flag are disposed in a spare area of the memory cell array, and the first page flag and the second page flag are connected to the common word line.

4. The method of claim 3, wherein the first page is least significant bit (LSB) data and the second page is most significant bit (MSB) data of the multi-bit data.

5. The method of claim 1, further comprising:
    in response to programing the second page, programming a second page flag,
    wherein the MLC are configured to be selectively programmed to a provisional state during programming of the first page, and to one of a plurality of programmed states during programming of the second page,
    the initial first flag state is the provisional state,
    the final first flag state is one of the plurality of programmed states, and
    a second flag state is one of the plurality of programmed states.

6. The method of claim 5, wherein the final first flag state and the second flag state are the same one of the plurality of programmed states.

7. The method of claim 5, wherein the final first flag state is one of the plurality of programmed states having a threshold voltage distribution greater than a threshold voltage distribution for the provisional state, and
    the second flag state is one of the plurality of programmed states having a threshold voltage distribution greater than the threshold voltage distribution for the provisional state.

8. The method of claim 1, wherein programming the first page comprises receiving first write data, randomizing the first write data to generate randomized first write data, and programming the MLC with the randomized first write data; and
    programming the second page comprises receiving second write data, randomizing the second write data to generate randomized second write data, and programming the MLC with the randomized second write data.

9. A method programming multi-bit data to multi-level non-volatile memory cells (MLC) in a memory cell array, the method comprising:
    performing a first programming of a first logical page (FLP);
    programming a first page flag to a first flag state in response to the first programming; and thereafter,
    performing a second programming of a second logical page (SLP); and
    inhibiting programming of the first page flag during the second programming.

10. The method of claim 9, wherein MLC are connected to a common word line of the memory cell array, and the first flag state is a provisional state for the MLC.

11. The method of claim 10, wherein the MLC are arranged in a main area of the memory cell array, the first page flag is disposed in a spare area of the memory cell array.

12. The method of claim 10, wherein the FLP is programmed according to least significant bit (LSB) data of the multi-bit data.

13. The method of claim 12, further comprising:
    programming a second page flag to a second flag state in response to the second programming, wherein programming of the second page flag is inhibited during the first programming and the second page flag is disposed in the spare area of the memory cell array.

14. The method of claim 13, wherein the MLC are configured to be selectively programmed to the provisional state during the first programming and to one of a plurality of programmed states during the second programming,
    the first flag state is the provisional state, and
    the second flag state is one of the plurality of programmed states.

15. The method of claim 14, wherein the second flag state is one of the plurality of programmed states having a threshold voltage distribution greater than a threshold voltage distribution of the provisional state.

16. The method of claim 13, wherein the second programming comprises;
receiving MSB write data, randomizing the MSB write data to generate randomized MSB write data, and programming the SLP with the randomized MSB write data.

17. The method of claim 12, wherein the first programming comprises; receiving LSB write data, randomizing the LSB write data to generate randomized LSB write data, and programming the FLP with the randomized LSB write data.

18. A method reading multi-level data from a memory cell array of multi-level non-volatile memory cells (MLC), the method comprising:
determining a first page flag associated with a first page of data stored in the MLC;
if the first page flag is set, reading first read data from the MLC wherein the first read data is least significant bit (LSB) data of the multi-level data, de-randomizing the first read data to generate de-randomized first read data, and providing the de-randomized first read data as output data, and
if the first page flag is not set, reading the first read data from the MLC and providing the first read data as output data.

19. The method of claim 18, wherein the first page flag is set using a one-time programming when the first page data is programmed to the MLC during a previously performed program operation.

20. The method of claim 19, wherein the first page flag is set by programming the first page flag to a provisional state for the MLC in response to the previously performed program operation.

21. The method of claim 18, further comprising:
determining a second page flag associated with a second page of data stored in the MLC;
if the second page flag is set, reading second read data from the MLC, de-randomizing the second read data to generate de-randomized second read page data, and providing the de-randomized second read data as output data, and
if the second page flag is not set, reading the second read data from the MLC and providing the second read data as output data.

22. The method of claim 21, wherein the second read data is most significant bit (MSB) data of the multi-level data.

23. The method of claim 21, wherein the second page flag is set when the second page data is programmed to the MLC during a previously performed program operation.

24. The method of claim 21, wherein the MLC are configured to be selectively programmed to a provisional state when the first page data is programmed to the MLC, and to one of a plurality of programmed states when the second page data is programmed to the MLC, and
the second page flag is set by programming the second page flag to one of the plurality of programmed states for the MLC.

25. The method of claim 24, wherein the one of the plurality of programmed states has a threshold voltage distribution greater than a threshold voltage distribution for the provisional state.

26. A method reading multi-level data from a memory cell array of multi-level non-volatile memory cells (MLC), the method comprising:
determining a first page flag associated with a first page of data stored in the MLC;

if the first page flag is set, reading first read data from the MLC, de-randomizing the first read data to generate de-randomized first read data, and providing the de-randomized first read data as output data, and
if the first page flag is not set, reading the first read data from the MLC and providing the first read data as output data,
wherein the first page flag is set during a previously performed program operation using a two-times programming, comprising:
programming the first page flag to a first flag state when the first page data is programmed to the MLC; and then,
programming the first page flag to a second flag state different from the first flag state when second page data is programmed to the MLC.

27. The method of claim 26, wherein the MLC are configured to be selectively programmed to a provisional state when the first page data is programmed to the MLC, and to one of a plurality of programmed states when the second page data is programmed to the MLC,
the first flag state is the provisional state, and
the second flag state is one of a plurality of programmed states.

28. A method of operating a memory system comprising a non-volatile memory device and a controller, wherein the non-volatile memory device comprises; a memory cell array including multi-level memory cells (MLC) arranged of a main area, and a first page flag and a second page flag disposed in a spare area, a page buffer that stores read data retrieved from the memory cell array, an input/output (I/O) circuit that provides output data from the non-volatile memory device to the controller, and a de-randomizer that receives the read data from the page buffer and either passes the read data to the I/O circuit without de-randomization, or generates de-randomized read data from the read data and then passes the de-randomized read data to the I/O circuit;
the method comprising:
upon receiving a first read command, loading a first page of read data from the memory cell array to the page buffer and determining the first page flag;
if the first page flag is not set, passing the first page of read data to the I/O circuit as first output data without de-randomizing the first page of read data, and if the first page flag is set, generating a de-randomized first page of read data and passing the de-randomized first page of read data to the I/O circuit as the first output data; and
upon receiving a second read command, loading a second page of read data from the memory cell array to the page buffer and determining the second page flag;
if the second page flag is not set, passing the second page of read data to the I/O circuit as second output data without de-randomizing the second page of read data, and
if the second page flag is set, generating a de-randomized second page of read data and passing the de-randomized second page of read data to the I/O circuit as the second output data,
wherein the MLC are configured to be selectively programmed to a provisional state during a first programming operation, and to one of a plurality of programmed states during a second programming operation, the first page flag is set in response to the first programming operation, and the second page flag is set in response to the second programming operation.

29. The method of claim 28, wherein the controller is configured to communicate the first read command and the second read command to the non-volatile memory, and respectively receive the first output data and the second output data in response to the first read command and the second read command.

30. The method of claim 28, wherein the first page of read data is least significant bit (LSB) data and the second page of read data is most significant bit (MSB) data stored in the MLC.

31. A nonvolatile memory device comprising:
a memory cell array including multi-level memory cells (MLC) disposed in a main area, and a first page flag and a second page flag disposed in a spare area, wherein each one of the MLC is configured to store multi-level data;
a page buffer that stores read data retrieved from the memory cell array;
a de-randomizer that receives the read data from the page buffer;
an input/output (I/O) circuit that provides output data from the non-volatile memory device; and
control logic that in response to a first read command, loads a first page of data from the memory cell array to the page buffer and determines the first page flag,
wherein if the first page flag is not set, the control logic causes the first page of data to pass to the I/O circuit without de-randomizing the first page of data, and causes the I/O circuit to provide the first page of data as the output data, wherein the first page of data is least significant bit (LSB) data of multi-level data, and
if the first page flag is set, the control logic causes the de-randomizer to generate a de-randomized first page of data by de-randomizing the first page of data, and causes the I/O circuit to provide the de-randomized first page of data as the output data.

32. The nonvolatile memory device of claim 31, wherein in response to a second read command, the control logic loads a second page of data from the memory cell array to the page buffer and determines the second page flag,
if the second page flag is not set, the control logic causes the second page of data to pass to the I/O circuit without de-randomizing the second page data, and causes the I/O circuit to provide the second page of data as the output data, wherein the second page of data is most significant bit (MSB) data of multi-level data, and
if the first page flag is set, the control logic causes the de-randomizer to generate a de-randomized second page of data by de-randomizing the second page of data, and causes the I/O circuit to provide the de-randomized second page of data as the output data.

33. The nonvolatile memory device of claim 32, wherein the first page of data and the second page of data are provided from a common physical page of the memory cell array.

34. A nonvolatile memory device comprising:
a memory cell array including multi-level memory cells (MLC) disposed in a main area, and a first page flag and a second page flag disposed in a spare area;
a page buffer that stores read data retrieved from the memory cell array;
a de-randomizer that receives the read data from the page buffer;
an input/output (I/O) circuit that provides output data from the non-volatile memory device; and
control logic that in response to a first read command, loads a first page of data from the memory cell array to the page buffer and determines the first page flag,
wherein if the first page flag is not set, the control logic causes the first page of data to pass to the I/O circuit without de-randomizing the first page of data and causes the I/O circuit to provide the first page of data as the output data,
if the first page flag is set, the control logic causes the de-randomizer to generate a de-randomized first page of data by de-randomizing the first page of data and causes the I/O circuit to provide the de-randomized first page of data as the output data,
the MLC are configured to be selectively programmed to a provisional state when the first page is programmed, and to one of a plurality of programmed states when the second page is programmed,
the first page flag is set when programmed to the provisional state, and
the second page flag is set when programmed to one of the plurality of programmed states.

35. A nonvolatile memory device comprising:
a memory cell array having a vertical structure comprising a stacked plurality of memory blocks accessed via an arrangement of word lines and bits lines, and including multi-level memory cells (MLC) disposed in a main area, and a first page flag and a second page flag disposed in a spare area, wherein each one of the MLC is configured to store multi-level data;
a page buffer that stores read data retrieved from the vertical memory cell array;
a de-randomizer that receives the read data from the page buffer;
an input/output (I/O) circuit that provides output data from the non-volatile memory device; and
control logic that in response to a read command, loads a first page of data from the vertical memory cell array to the page buffer and determines the first page flag,
wherein if the first page flag is not set, the control logic causes the first page of data to pass to the I/O circuit without de-randomizing the first page of data and causes the I/O circuit to provide the first page of data as the output data, wherein the first page of data is least significant bit (LSB) data of multi-level data, and
if the first page flag is set, the control logic causes the de-randomizer to generate a de-randomized first page of data by de-randomizing the first page of data and causes the I/O circuit to provide the de-randomized first page of data as the output data.

36. A nonvolatile memory device comprising:
a memory cell array of multi-level memory cells (MLC) arranged in a main area, and a first page flag and a second page flag disposed in a spare area;
a page buffer that temporarily stores multi-level data to be programmed to the memory cell array;
an input/output (I/O) circuit that receives externally provided write data; a randomizer configured to receive the write data from the I/O circuit; and
control logic that in response to a first program command, causes the randomizer to generate a randomized first page of data from at least a portion of the write data, causes the page buffer to program the randomized first page of data to the MLC, and then sets the first page flag to an initial flag state,
in response to a second program command causes the randomizer to generate a randomized second page of data from at least a portion of the write data, causes the page buffer to program the randomized second page of data to the MLC, and then sets the second page flag, and
further in response to the second program command, the control logic determines whether the first page of data has been programmed, and if the first page of data has been programmed, the control logic causes the first page flag to be set to a final first flag state different from the initial first flag state, and if the first page of data has not been programmed, the control logic inhibits programming of the first page flag as the page buffer programs the randomized second page of data.

37. The nonvolatile memory device of claim 36, wherein the control logic sets the first page flag using a one-time programming in response to the first programming command.

38. The nonvolatile memory device of claim 37, wherein the initial flag state is a provisional state for the MLC.

39. A nonvolatile memory device comprising:
a memory cell array of multi-level memory cells (MLC) arranged in a main area, and a first page flag and a second page flag disposed in a spare area;
a page buffer that temporarily stores multi-level data to be programmed to the memory cell array;
an input/output (I/O) circuit that receives externally provided write data;
a randomizer configured to receive the write data from the I/O circuit; and
control logic that in response to a first program command; causes the randomizer to generate a randomized first page of data from at least a portion of the write data, causes the page buffer to program the randomized first page of data to the MLC, and then
sets the first page flag, and the control logic in response to a second program command;
causes the randomizer to generate a randomized second page of data from at least a portion of the write data, causes the page buffer to program the randomized second page of data to the MLC, and then
sets the second page flag,
wherein the control logic sets the first page flag using a two-times programming approach that initially programs the first page flag in response to the first program command, and thereafter finally programs the first page flag in response to the second program command.

40. The nonvolatile memory device of claim 39, wherein the control logic initially programs the first page flag to a provisional state for the MLC, and thereafter finally programs the first page flag to one of a plurality of programmed states for the MLC.

41. A nonvolatile memory device comprising:
a memory cell array having a vertical structure comprising a stacked plurality of memory blocks accessed via an arrangement of word lines and bits lines, and including multi-level memory cells (MLC) disposed in a main area, and a first page flag and a second page flag disposed in a spare area;
a page buffer that temporarily stores multi-level data to be programmed to the vertical memory cell array;
an input/output (I/O) circuit that receives externally provided write data; a randomizer configured to receive the write data from the I/O circuit; and
control logic that in response to a first program command; causes the randomizer to generate a randomized first page of data from at least a portion of the write data, causes the page buffer to program the randomized first page of data to the MLC, and then
sets the first page flag, and the control logic in response to a second program command;
causes the randomizer to generate a randomized second page of data from at least a portion of the write data, causes the page buffer to program the randomized second page of data to the MLC, and then
sets the second page flag,
wherein the control logic sets the first page flag using a two-times programming approach that initially programs the first page flag in response to the first program command, and thereafter finally programs the first page flag in response to the second program command.

42. A memory card, comprising:
a memory controller and at least one nonvolatile memory device mechanically mounted on a board, wherein the at least one nonvolatile memory device comprises:
a memory cell array of multi-level memory cells (MLC) arranged in a main area, and a first page flag and a second page flag disposed in a spare area;
a page buffer that temporarily stores multi-level data to be programmed to the memory cell array;
an input/output (I/O) circuit that receives externally provided write data;
a randomizer configured to receive the write data from the I/O circuit; and
control logic that in response to a first program command; causes the randomizer to generate a randomized first page of data from at least a portion of the write data, causes the page buffer to program the randomized first page of data to the MLC, and then
sets the first page flag, and
the control logic in response to a second program command;
causes the randomizer to generate a randomized second page of data from at least a portion of the write data, causes the page buffer to program the randomized second page of data to the MLC, and then
sets the second page flag,
wherein the control logic sets the first page flag using a two-times programming approach that initially programs the first page flag in response to the first program command, and thereafter finally programs the first page flag in response to the second program command.

43. The memory card of claim 42 further comprising:
a buffer memory that receives and temporarily stores write data received from a host connected to the memory card.

44. The memory card of claim 43, wherein the memory controller, the at least one nonvolatile memory device, and the buffer memory are functionally arranged on the board as one of; a multimedia card, a digital security card, a memory stick, a smart media card, and a trans-flash card.

45. A Solid-State Drive (SSD), comprising:
a memory controller and a plurality of flash memory devices respectively controlled by the memory controller via a selected one of a plurality of channels, wherein each one of the plurality of flash memory devices comprises:
a memory cell array of multi-level memory cells (MLC) arranged in a main area, and a first page flag and a second page flag disposed in a spare area;
a page buffer that temporarily stores multi-level data to be programmed to the memory cell array;
an input/output (I/O) circuit that receives externally provided write data;
a randomizer configured to receive the write data from the I/O circuit; and
control logic that controls execution of a first programming of a first logical page of data and related programming a first page flag to a first flag state in response to the first programming, and thereafter, controls execution of a second programming of a second logical page of data different from the first logical page of data while inhibiting programming of the first page flag during the second programming.

46. A system, comprising:
- a processor connected to a Solid-State Drive (SSD) via a bus, the SSD comprising a memory controller and a plurality of flash memory devices respectively controlled by the memory controller via a selected one of a plurality of channels, wherein each one of the plurality of flash memory devices comprises:
- a memory cell array of multi-level memory cells (MLC) arranged in a main area, and a first page flag and a second page flag disposed in a spare area;
- a page buffer that temporarily stores multi-level data to be programmed to the memory cell array;
- an input/output (I/O) circuit that receives externally provided write data;
- a randomizer configured to receive the write data from the I/O circuit; and
- control logic that controls execution of a first programming of a first logical page of data and related programming a first page flag to a first flag state in response to the first programming, and thereafter, controls execution of a second programming of a second logical page of data different from the first logical page of data while inhibiting programming of the first page flag during the second programming.

47. The system of claim 46, wherein the processor is a server connected to network.

* * * * *